US009425217B2

(12) United States Patent
Ishihara et al.

(10) Patent No.: US 9,425,217 B2
(45) Date of Patent: Aug. 23, 2016

(54) SEMICONDUCTOR DEVICE

(71) Applicant: Semiconductor Energy Laboratory Co., Ltd., Atsugi-shi, Kanagawa-ken (JP)

(72) Inventors: Noritaka Ishihara, Koza (JP); Masashi Oota, Atsugi (JP); Masashi Tsubuku, Atsugi (JP); Masami Jintyou, Shimotsuga (JP); Yukinori Shima, Tatebayashi (JP); Junichi Koezuka, Tochigi (JP); Yasuharu Hosaka, Tochigi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/486,089

(22) Filed: Sep. 15, 2014

(65) Prior Publication Data

US 2015/0084043 A1    Mar. 26, 2015

(30) Foreign Application Priority Data

Sep. 23, 2013   (JP) ................................. 2013-196333

(51) Int. Cl.
*H01L 29/10*    (2006.01)
*H01L 27/12*    (2006.01)
(Continued)

(52) U.S. Cl.
CPC ...... *H01L 27/1225* (2013.01); *H01L 29/41733* (2013.01); *H01L 29/45* (2013.01);
(Continued)

(58) Field of Classification Search
CPC .............. H01L 27/1225; H01L 29/45; H01L 29/41733; H01L 29/7869; H01L 29/78696
USPC ............................................................ 257/43
See application file for complete search history.

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

EP   1737044 A   12/2006
EP   2226847 A   9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Elias M Ullah
(74) *Attorney, Agent, or Firm* — Robinson Intellectual Property Law Office; Eric J. Robinson

(57) ABSTRACT

Defects in an oxide semiconductor film are reduced in a semiconductor device including the oxide semiconductor film. The electrical characteristics of a semiconductor device including an oxide semiconductor film are improved. The reliability of a semiconductor device including an oxide semiconductor film is improved. A semiconductor device including an oxide semiconductor layer; a metal oxide layer in contact with the oxide semiconductor layer, the metal oxide layer including an In-M oxide (M is Ti, Ga, Y, Zr, La, Ce, Nd, or Hf); and a conductive layer in contact with the metal oxide layer, the conductive layer including copper, aluminum, gold, or silver is provided. In the semiconductor device, $y/(x+y)$ is greater than or equal to 0.75 and less than 1 where the atomic ratio of In to M included in the metal oxide layer is In:M=x:y.

20 Claims, 29 Drawing Sheets

(51) Int. Cl.
    *H01L 29/45* (2006.01)
    *H01L 29/417* (2006.01)
    *H01L 29/786* (2006.01)
(52) U.S. Cl.
    CPC ...... *H01L29/7869* (2013.01); *H01L 29/78648* (2013.01); *H01L 29/78693* (2013.01); *H01L 29/78696* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,652,740 B2 | 1/2010 | Hwang et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,148,779 B2 | 4/2012 | Jeong et al. |
| 8,188,480 B2 | 5/2012 | Itai |
| 8,203,143 B2 | 6/2012 | Imai |
| 8,471,256 B2 | 6/2013 | Yamazaki et al. |
| 8,816,349 B2 | 8/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0193083 A1 | 8/2011 | Kim et al. |
| 2013/0207111 A1 | 8/2013 | Yamazaki |
| 2013/0320334 A1* | 12/2013 | Yamazaki ........... H01L 29/7869 257/43 |
| 2014/0021466 A1 | 1/2014 | Yamazaki et al. |
| 2014/0306221 A1 | 10/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-133422 A | 4/2004 |
| JP | 2004-273614 A | 9/2004 |
| JP | 2004-273732 A | 9/2004 |
| JP | 2007-096055 A | 4/2007 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

(56) References Cited

OTHER PUBLICATIONS

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, 184-187.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphouse In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

(56) References Cited

OTHER PUBLICATIONS

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Terai.Y et al., "A Polycrystalline Oxide TFT Driven AM-OLED Display", IDW'11: Proceedings of the 18th International Display Workshops, Dec. 7, 2011, pp. 61-64.

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

\* cited by examiner

CAAC-OS nc-OS as-sputtered after the heat treatment at 450°C

FIG. 23A
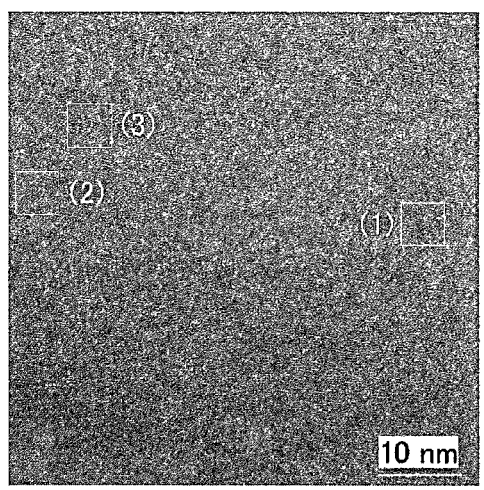
FIG. 23B  FIG. 23C  FIG. 23D
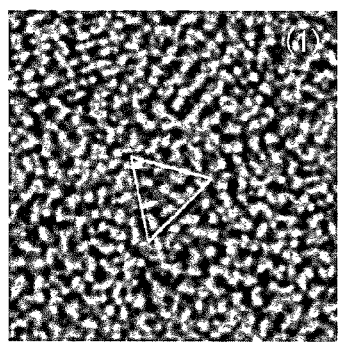 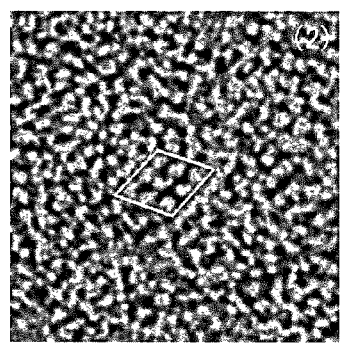 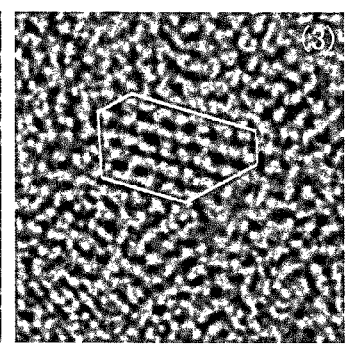

cross section plan view

SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention particularly relates to a semiconductor device and a method for manufacturing the semiconductor device.

In this specification and the like, a semiconductor device generally means a device that can function by utilizing semiconductor characteristics. An electro-optical device, an image display device (also simply referred to as a display device), a semiconductor circuit, a light-emitting device, a power storage device, a memory device, and an electronic appliance may include a semiconductor device.

2. Description of the Related Art

As semiconductor materials of transistors used for most display devices typified by liquid crystal display devices and light-emitting display devices and most integrated circuits (ICs), silicon semiconductors such as amorphous silicon, single crystal silicon, and polycrystalline silicon are known. Furthermore, as other semiconductor materials, oxide semiconductors have been attracting attention. For example, a technique for applying a transistor in which zinc oxide or In—Ga—Zn-based oxide is used as an oxide semiconductor for a channel, to a display device, is disclosed (Patent Document 1). Furthermore, a technique to apply a transistor in which polycrystalline In—Ga oxide is used as an oxide semiconductor for a channel, to a display device, is disclosed (Non-Patent Document 1).

In addition, to reduce wiring delay due to increase in wiring resistance and parasitic capacitance caused by increase in size and definition of a display device, a technique to form a wiring using a low-resistance material such as copper, aluminum, gold, or silver is considered (Patent Document 2).

REFERENCE

Patent Document

[Patent Document 1] Japanese Published Patent Application No. 2007-096055
[Patent Document 2] Japanese Published Patent Application No. 2004-133422

Non-Patent Document

[Non-Patent Document 1] Yasuhiro Terai et al., "A Polycrystalline Oxide TFT Driven AM-OLED Display", IDW'11, pp. 61-64

SUMMARY OF THE INVENTION

In a transistor including an oxide semiconductor, a large amount of impurity (typically, silicon, which is a constituent element of an insulating layer; carbon; and copper, which is a constituent material of a wiring) contained in an oxide semiconductor layer causes a reduction in electrical characteristics (e.g., on-state current characteristics) of the transistor.

Another object of one embodiment of the present invention is to reduce the concentration of impurity contained in an oxide semiconductor layer of a semiconductor device such as a transistor including an oxide semiconductor. Another object of one embodiment of the present invention is to improve electrical characteristics of a semiconductor device or the like including an oxide semiconductor. Another object of one embodiment of the present invention is to improve the reliability of a semiconductor device or the like including an oxide semiconductor. Another object of one embodiment of the present invention is to provide a novel semiconductor device or the like.

Note that the description of these objects does not disturb the description of other objects. One embodiment of the present invention does not necessarily achieve all the objects. Objects other than the above objects will be apparent from and can be derived from the description of the specification and the like.

One embodiment of the present invention is a semiconductor device including an oxide semiconductor layer; a metal oxide layer in contact with the oxide semiconductor layer, the metal oxide layer including an In-M oxide (M is Ti, Ga, Y, Zr, La, Ce, Nd, or Hf); and a conductive layer in contact with the metal oxide layer, the conductive layer including copper, aluminum, gold, or silver. In the semiconductor device, $y/(x+y)$ is greater than or equal to 0.75 and less than 1 where the atomic ratio of In to M included in the metal oxide layer is In:M=x:y.

Another embodiment of the present invention is a semiconductor device including a gate electrode layer, a gate insulating layer in contact with the gate electrode layer, an oxide semiconductor layer facing the gate electrode layer with the gate insulating layer positioned between the gate electrode layer and the oxide semiconductor layer; a metal oxide layer in contact with the oxide semiconductor layer, the metal oxide layer including an In-M oxide (M is Ti, Ga, Y, Zr, La, Ce, Nd, or Hf); and a pair of electrode layers in contact with the metal oxide layer, the pair of electrode layers including copper, aluminum, gold, or silver. In the semiconductor device, $y/(x+y)$ is greater than or equal to 0.75 and less than 1 where the atomic ratio of In to M included in the metal oxide layer is In:M=x:y.

Another embodiment of the present invention is a semiconductor device including a first gate electrode layer, a first gate insulating layer in contact with the first gate electrode layer; an oxide semiconductor layer facing the first gate electrode layer with the first gate insulating layer positioned between the first gate electrode layer and the oxide semiconductor layer; a metal oxide layer in contact with the oxide semiconductor layer, the metal oxide layer including an In-M oxide (M is Ti, Ga, Y, Zr, La, Ce, Nd, or Hf); a pair of electrode layers in contact with the metal oxide layer, the pair of electrode layers including copper, aluminum, gold, or silver; a second gate insulating layer over and in contact with the pair of electrode layers; and a second gate electrode layer facing the oxide semiconductor layer with the second gate insulating layer positioned between the oxide semiconductor layer and the second gate electrode layer. In the semiconductor device, $y/(x+y)$ is greater than or equal to 0.75 and less than 1 where the atomic ratio of In to M included in the metal oxide layer is In:M=x:y, and the first gate electrode layer and the second gate electrode layer are electrically connected to each other through an opening portion formed in the first gate insulating layer and the second gate insulating layer.

In the semiconductor device, the oxide semiconductor layer may include a first side surface and a second side surface in contact with the pair of electrodes, and a third side surface and a fourth side surface facing the first gate electrode layer or the second gate electrode layer.

In the semiconductor device, gallium is preferably contained as the element M.

In the semiconductor device, the oxide semiconductor layer may have a stacked-layer structure including a first oxide semiconductor layer and a second oxide semiconductor layer between the first oxide semiconductor layer and the metal oxide layer. In that case, the electron affinity of the second oxide semiconductor layer is preferably smaller than the electron affinity of the first oxide semiconductor layer and preferably larger than the electron affinity of the metal oxide layer.

In this specification, a term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

According to one embodiment of the disclosed invention, the concentration of impurities contained in the oxide semiconductor layer can be reduced. In accordance with one embodiment of the present invention, electrical characteristics of a semiconductor device or the like including an oxide semiconductor can be improved. In accordance with one embodiment of the present invention, the reliability of a semiconductor device or the like including an oxide semiconductor can be improved. In accordance with one embodiment of the present invention, a novel semiconductor device or the like can be provided. Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

In the accompanying drawings:

FIGS. 23A to 23D are Cs-corrected high-resolution TEM images of a plane of a CAAC-OS;

DETAILED DESCRIPTION OF THE INVENTION

Figure 1A:
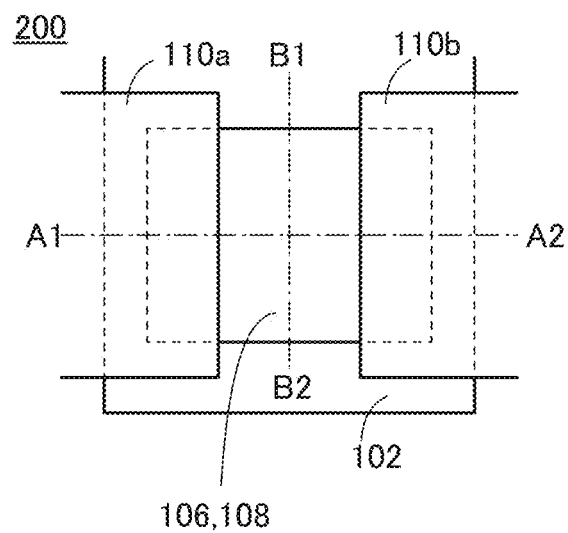
FIGS. 1A and 1B are a plan view and a cross-sectional view of a transistor of one embodiment of the present invention.

Embodiments of the present invention will be described below in detail with reference to the drawings. Note that the present invention is not limited to the following description, and it is easily understood by those skilled in the art that the mode and details can be variously changed without departing from the spirit and scope of the present invention. Therefore, the present invention should not be interpreted as being limited to the description of Embodiments below. In addition, in the following embodiments, the same portions or portions having similar functions are denoted by the same reference numerals or the same hatching patterns in different drawings, and description thereof will not be repeated.

Note that in each drawing described in this specification, the size, the film thickness, or the region of each component may be exaggerated for clarity. Therefore, embodiments of the present invention are not limited to such a scale.

In this specification and the like, ordinal numbers such as "first", "second", and the like are used in order to avoid confusion among components, and the terms do not limit the components numerically. Therefore, for example, description can be made even when "first" is replaced with "second" or "third", as appropriate.

Functions of a "source" and a "drain" are sometimes interchanged with each other as appropriate when the direction of current flow is changed in circuit operation, for example. Thus, in this specification and the like, the terms "source" and "drain" can be replaced with each other.

Note that the term such as "over" or "below" in this specification and the like does not necessarily mean that a component is placed "directly on" or "directly under" another component. For example, the expression "a gate electrode layer over a gate insulating layer" does not exclude the case where a component is placed between the gate insulating layer and the gate electrode layer. The same applies to the term "below".

In this specification, the term "parallel" indicates that the angle formed between two straight lines is greater than or equal to −10° and less than or equal to 100, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification and the like, the trigonal and rhombohedral crystal systems are included in the hexagonal crystal system.

(Embodiment 1)

In this embodiment, a semiconductor device that is one embodiment of the present invention and a method for manufacturing the semiconductor device are described. Description is made with reference to FIGS. 1A and 1B, FIGS. 2A and 2B, FIGS. 3A and 3B, FIGS. 4A and 4B, FIGS. 5A to 5D, and FIGS. 6A to 6C.

<Structure Example 1 of Transistor>

Figure 1B:
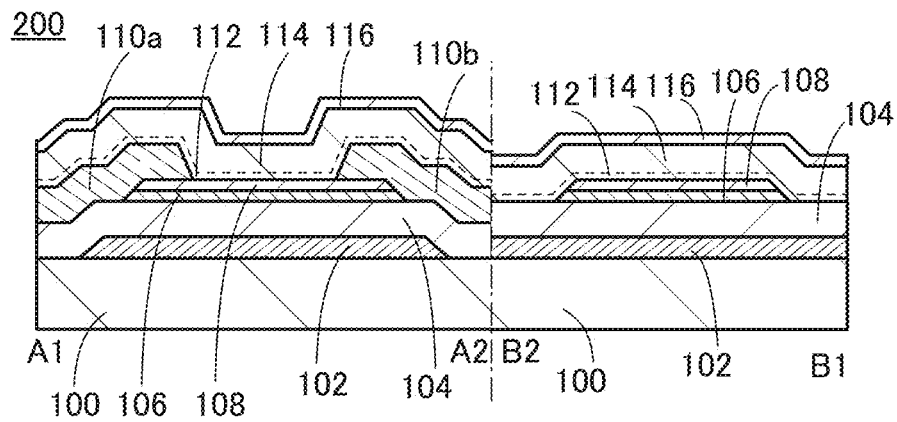

FIGS. 1A to 1B are a plan view and a cross-sectional view of a transistor 200 included in a semiconductor device of this embodiment. The transistor 200 illustrated in FIGS. 1A and 1B is a channel-etched transistor. FIG. 1A is a plan view of the transistor 200, and FIG. 1B is a cross-sectional view taken along dashed dotted lines A1-A2 and B1-B2 in FIG. 1A. Note that a substrate 100 and some components (e.g., a gate insulating layer) of the transistor 200 are not illustrated in FIG. 1A for simplicity.

The transistor 200 illustrated in FIGS. 1A and 1B includes a gate electrode layer 102 formed over the substrate 100, a gate insulating layer 104 in contact with the gate electrode layer 102, an oxide semiconductor layer 106 facing the gate electrode layer 102 with the gate insulating layer 104 positioned therebetween, a metal oxide layer 108 over the oxide semiconductor layer 106, and a pair of electrode layers 110a and 110b in contact with the metal oxide layer 108. Furthermore, the transistor 200 may include an oxide insulating layer 112, an oxide insulating layer 114 and a nitride insulating layer 116 formed over the pair of electrode layers 110a and 110b and the metal oxide layer 108.

In the transistor 200, the metal oxide layer 108, which is provided in contact with the top surface of the oxide semiconductor layer 106 where a channel is formed, functions as a barrier layer for preventing diffusion of constituent elements of the pair of electrode layers 110a and 110b into the oxide semiconductor layer 106. In addition, the metal oxide layer 108 can also prevent constituent elements of the oxide insulating layer 112 or the like provided over the oxide semiconductor layer 106 from mixing into the oxide semiconductor layer 106. The prevention of mixing of impurities into the oxide semiconductor layer 106 where the channel is formed can inhibit a reduction in the electrical characteristics of the transistor 200.

For the metal oxide layer 108, a metal oxide represented as In-M oxide (M is Ti, Ga, Y, Zr, La, Ce, Nd, or Hf) can be used. Note that to prevent the metal oxide layer 108 from functioning as part of a channel formation region, a material having sufficiently low conductivity is used. Alternatively, for the metal oxide layer 108, a material which has smaller electron affinity (energy difference between the vacuum level and the bottom of the conduction band) than the oxide semiconductor layer 106 and has a difference in energy of the bottom of the conduction band from the oxide semiconductor layer 106 (i.e., has a band offset) is used. To prevent generation of a difference in threshold voltage depending on the level of a drain voltage, the material of the metal oxide layer 108 is preferably selected so that the energy of the bottom of the conduction band of the metal oxide layer 108 is closer to the vacuum level than the energy of the bottom of the conduction band of the oxide semiconductor layer 106 by 0.2 eV or more, preferably 0.5 eV or more.

In addition, increasing the atomic ratio of the element M to In can increase the energy gap of the metal oxide layer 108 and reduce the electron affinity. Accordingly, to prevent formation of a channel in the metal oxide layer 108 by forming the band offset of the conduction band between the metal oxide layer 108 and the oxide semiconductor layer 106, y/(x+y) is preferably greater than or equal to 0.75 and less than 1, further preferably greater than or equal to 0.78 and less than 1, still further preferably greater than or equal to 0.80 and less than 1 where the atomic ratio of In to M included in the metal oxide layer is In:M=x:y. Note that, an element that is not indium, M, nor oxygen, which are main components of the metal oxide layer 108, may be mixed to the metal oxide layer 108 as an impurity. The concentration of the impurity in this case is preferably less than or equal to 0.1%. The atomic ratio of In:M=x:y can be measured by inductively coupled plasma mass spectrometry (ICP-MS). In:M=x:y refers to not the composition of the target but the composition of the metal oxide film obtained by a sputtering method, and y/(x+y) is greater than or equal to 0.75 and less than 1 where the atomic ratio is In:M=x:y.

In the case where the metal oxide layer 108 is formed by a sputtering method, when the atomic ratio of the element M to In is increased, the number of particles in deposition can be reduced. To reduce the number of particles, y/(x+y) may be greater than or equal to 0.90, e.g., 0.93 where the atomic ratio is In:M=x:y. Note that in the case where the metal oxide layer 108 is formed by a sputtering method, when the atomic ratio of M to In is too high, the insulating property of a target becomes high, which makes it difficult to perform deposition using DC discharge; as a result, it is necessary to use RF discharge. Accordingly, when deposition is performed using DC discharge, which is applicable to the case of using a large-sized substrate, y/(x+y) is set less than or equal to 0.96, preferably less than or equal to 0.95, e.g., 0.93. The use of the deposition method applicable to the case of using a large-sized substrate can increase the productivity of the semiconductor device.

Note that in the transistor 200, side surfaces of the oxide semiconductor layer 106 where the channel is formed are in contact with the pair of electrode layers 110a and 110b functioning as a source electrode layer and a drain electrode layer, and in the contact regions, a source region and a drain region are formed. Therefore, the metal oxide layer 108 may have an insulating property.

Note that it is preferable that the metal oxide layer 108 not have a spinel crystal structure. This is because if the metal oxide layer 108 has a spinel crystal structure, a constituent element of the pair of electrode layers 110a and 110b might be diffused into the oxide semiconductor layer 106 owing to the spinel crystal structure. For example, it is preferable that an In-M oxide be used as the metal oxide layer 108 and that a divalent metal element (e.g., zinc) not be contained as M, in which case the formed metal oxide layer 108 does not have a spinel crystal structure.

The thickness of the metal oxide layer 108 is greater than or equal to a thickness that is capable of inhibiting diffusion of the constituent element of the pair of electrode layers 110a and 110b into the oxide semiconductor layer 106, and less than a thickness which inhibits supply of oxygen from the oxide insulating layer 112 to the oxide semiconductor layer 106. For example, when the thickness of the metal oxide layer 108 is greater than or equal to 10 nm, the constituent element of the pair of electrode layers 110a and 110b can be prevented from diffusing into the oxide semiconductor layer 106. When the thickness of the metal oxide layer 108 is less than or equal to 100 nm, oxygen can be effectively supplied from the oxide insulating layers 112 and 114 to the oxide semiconductor layer 106.

In the transistor 200 described in this embodiment, the pair of electrode layers 110a and 110b functioning as source and drain electrode layers are preferably formed with a single layer or a stacked layer of a single metal that is a low-resistance material, such as copper, aluminum, gold, or silver; an alloy containing any of these materials, or a compound containing any of these materials as a main component. The pair of electrode layers 110a and 110b also functions as wirings; therefore, even in the case where a large-sized substrate is used as the substrate 100, when the electrode layers are formed to contain a low-resistance material such as copper, aluminum, gold, or silver, a semiconductor device in which wiring delay is suppressed can be manufactured.

In the case where the pair of electrode layers 110a and 110b has a two-layer structure, the pair of electrode layers 110a and 110b is formed so that the second conductive layer is thick and contains a single metal that is a low-resistance material, such as copper, aluminum, gold, or silver, an alloy containing any of these materials, or a compound containing any of these components as a main component; and a conductor functioning as a barrier layer against a conductor of the second conductive layer is used for the first conductive layer that is in contact with the side surface of the oxide semiconductor layer 106 and the side surface and top surface of the metal oxide layer 108. For example, a conductive layer of titanium, tantalum, molybdenum, tungsten; an alloy containing any of these elements; or a conductive layer containing titanium nitride, tantalum nitride, molybdenum nitride, tungsten nitride; or the like can be used as the barrier layer. In the case where the pair of electrode layers 110a and 110b has a three-layer structure, the third conductive layer is preferably formed using a conductor functioning as a barrier layer against a conductor of the second conductive layer so as to be over and in contact with the first and second conductive layers.

In the case where the pair of electrode layers 110a and 110b has a two-layer structure, for example, any of the following structures is preferably used: a structure in which an aluminum film is stacked on a titanium film; a structure in which a copper film is stacked on a tungsten film; a structure in which an aluminum film is stacked on a tungsten film; a structure in which a copper film is stacked on a copper-magnesium-aluminum alloy film; a structure in which a copper film is stacked on a titanium film; and a structure in which a copper film is stacked on a tungsten film. In the case where the pair of electrode layers 110a and 110b has three-layer structure, a film formed of titanium, titanium nitride, molybdenum, or molybdenum nitride is preferably formed as each of the first and third conductive layers, and a film formed of a low-resistance material such as copper, aluminum, gold, or silver is preferably formed as the second conductive layer.

The pair of electrode layers functioning as source and drain electrode layers in the transistor 200 described in this embodiment is formed using electrode layers including a low-resistance material such as copper, aluminum, gold, or silver, whereby the semiconductor device in which wiring delay is suppressed can be manufactured. Furthermore, the metal oxide layer 108 functioning as a barrier layer is provided in contact with the pair of electrode layers, whereby a reduction in electrical characteristics can be prevented, and thus it is possible to provide a semiconductor device having favorable electrical characteristics.

Figure 22A:
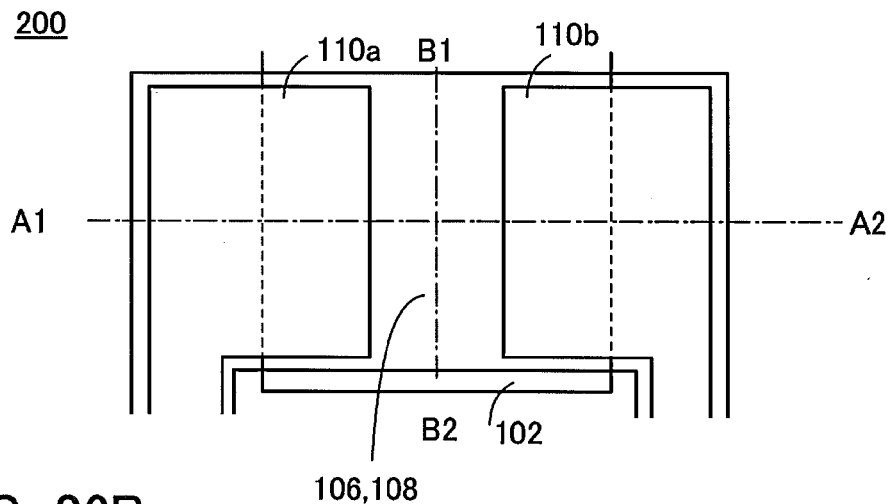
FIGS. 22A to 22C are a plan view and cross-sectional views of a transistor of one embodiment of the present invention.
Figure 22B:
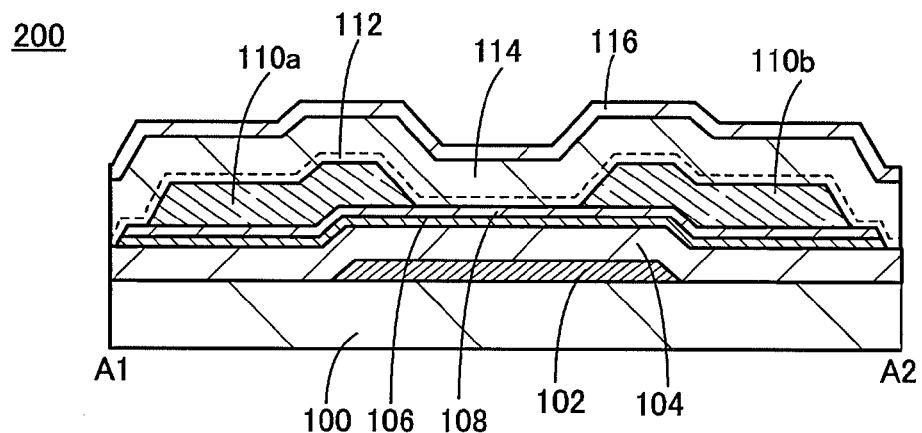
Figure 22C:
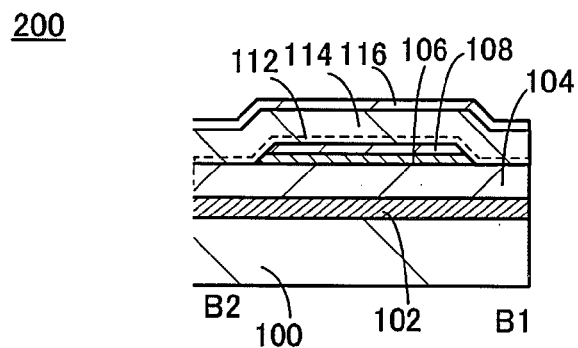

Note that the number of masks may be reduced by forming the electrode layers 110a and 110b, the oxide semiconductor layer 106, and the metal oxide layer 108 with the use of a half-tone mask (or a gray-tone mask, a phase difference mask, or the like), so that the number of processing steps may be reduced. In this case, a pattern is formed by, for example, ashing of a resist. Therefore, the oxide semiconductor layer 106 and the metal oxide layer 108 are necessarily provided below the electrode layers 110a and 110b. FIGS. 22A to 22C are a plan view and cross-sectional views of the structure in FIGS. 1A and 1B in the case where a half-tone mask is used.

Other constituent elements of the semiconductor device of this embodiment are described below in detail.

(Substrate)

There is no particular limitation on a material or the like of the substrate 100 as long as the material has heat resistance enough to withstand at least heat treatment to be performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used as the substrate 400. Furthermore, any of these substrates further provided with a semiconductor element may be used as the substrate 100. In the case where a glass substrate is used as the substrate 100, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Further alternatively, a flexible substrate may be used as the substrate 100, and the transistor 200 may be provided directly on the flexible substrate. Alternatively, a separation layer may be provided between the substrate 100 and the transistor 200. The separation layer can be used when part or the whole of a semiconductor device formed over the separation layer is separated from the substrate 100 and transferred onto another substrate. In that case, the transistor 200 can be transferred to a substrate having low heat resistance or a flexible substrate.

(Gate Electrode Layer)

The gate electrode layer 102 can be formed using a metal element selected from chromium, copper, aluminum, gold, silver, zinc, molybdenum, tantalum, titanium, and tungsten; an alloy containing any of these metal elements as a component; an alloy containing any of these metal elements in combination; or the like. Further, one or more metal elements selected from manganese and zirconium may be used. Furthermore, the gate electrode layer 102 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The gate electrode layer 102 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode layer 102 and the gate insulating layer 104. These films each have a work function of 5 eV or higher, preferably 5.5 eV or higher, which is higher than the electron affinity of an oxide semiconductor, thus, the threshold voltage of a transistor including the oxide semiconductor can be shifted in the positive direction. Accordingly, a switching element having what is called normally-off characteristics is obtained. For example, in the case of using an In—Ga—Zn-based oxynitride semiconductor film, an In—Ga—Zn-based oxynitride semiconductor film having a higher nitrogen concentration than at least the oxide semiconductor layer 106, specifically, an In—Ga—Zn-based oxynitride semiconductor film having a nitrogen concentration of 7 atomic % or higher is used.

(Gate Insulating Layer)

The gate insulating layer 104 can be formed to have a single-layer structure or a stacked-layer structure using, for example, one or more of silicon oxide, silicon oxynitride, silicon nitride oxide, silicon nitride, aluminum oxide, hafnium oxide, gallium oxide, and Ga—Zn-based metal oxide.

Alternatively, the gate insulating layer 104 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, in which case gate leakage current of the transistor can be reduced.

The thickness of the gate insulating layer 104 is greater than or equal to 5 nm and less than or equal to 400 nm, preferably greater than or equal to 10 nm and less than or equal to 300 nm, more preferably greater than or equal to 50 nm and less than or equal to 250 nm.

(Oxide Semiconductor Layer)

The oxide semiconductor layer 106 is typically formed using an In—Ga oxide, an In—Zn oxide, or an In-M-Zn oxide (M is Al, Ti, Ga, Y, Zr, La, Ce, Nd, or Hf).

In the case where the oxide semiconductor layer 106 is an In-M-Zn oxide (M is Al, Ti, Ga, Y, Zr, La, Ce, Nd, or Hf), it is preferable that the atomic ratio of metal elements of a sputtering target used for forming a film of the In-M-Zn oxide satisfy In≥M and Zn≥M. As the atomic ratio of metal elements of such a sputtering target. In:M:Zn=1:1:1, In:M:Zn=1:1:1.2, and In:M:Zn=3:1:2 are preferable. Note that the atomic ratio of metal elements in the formed oxide semiconductor layer 106 varies from the above atomic ratio of metal elements of the sputtering target within a range of ±40% as an error.

In the case of using an In-M-Zn oxide for the oxide semiconductor layer 106, when Zn and O are eliminated from consideration, the atomic percentage of In and the atomic percentage of M are preferably greater than 25 atomic % and less than 75 atomic %, respectively, further preferably greater than 34 atomic % and less than 66 atomic %, respectively.

The energy gap of the oxide semiconductor layer 106 is 2 eV or more, preferably 2.5 eV or more, further preferably 3 eV or more. With the use of an oxide semiconductor having such a wide energy gap, the off-state current of the transistor 200 can be reduced.

The thickness of the oxide semiconductor layer 106 is greater than or equal to 3 nm and less than or equal to 200 nm, preferably greater than or equal to 3 nm and less than or equal to 100 nm, further preferably greater than or equal to 3 nm and less than or equal to 50 nm.

An oxide semiconductor layer with low carrier density is used as the oxide semiconductor layer 106. For example, an oxide semiconductor layer whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$ is used as the oxide semiconductor layer 106.

Note that, without limitation to the compositions and materials described above, a material with an appropriate composition may be used depending on required semiconductor characteristics and electrical characteristics (e.g., field-effect mobility and threshold voltage) of a transistor. Furthermore, in order to obtain the required semiconductor characteristics of the transistor, it is preferable that the carrier density, the impurity concentration, the defect density, the atomic ratio of a metal element to oxygen, the interatomic distance, the density, and the like of the oxide semiconductor layer 106 be set to appropriate values.

Note that it is preferable to use, as the oxide semiconductor layer 106, an oxide semiconductor layer in which the impurity concentration is low and the density of defect states is low, in which case the transistor can have more excellent electrical characteristics. Here, the state in which impurity concentration is low and density of defect states is low (the number of oxygen vacancies is small) is referred to as "highly purified intrinsic" or "highly purified substantially intrinsic". A highly purified intrinsic or highly purified substantially intrinsic oxide semiconductor has few carrier generation sources, and thus can have a low carrier density. Thus, a transistor including the oxide semiconductor layer in which a channel region is formed rarely has a negative threshold voltage (is rarely normally-on). Thus, the transistor including the oxide semiconductor layer in the channel formation region has a small variation in electrical characteristics and high reliability in some cases. Furthermore, the highly purified intrinsic or highly purified substantially intrinsic oxide semiconductor layer has an extremely low off-state current; even when an element has a channel width of $1\times10^6$ μm and a channel length L of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode in the range from 1 V to 10 V.

Thus, the transistor in which the channel region is formed in the highly purified intrinsic or highly purified substantially intrinsic oxide semiconductor layer can have a small variation in electrical characteristics and high reliability. Charges trapped by the trap states in the oxide semiconductor film take a long time to be released and may behave like fixed charges. Thus, the transistor in which the channel region is formed in the oxide semiconductor layer having a high density of defect states may have unstable electrical characteristics. As examples of the impurities, hydrogen, nitrogen, alkali metal, alkaline earth metal, and the like are given.

Hydrogen contained in the oxide semiconductor layer reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated. Furthermore, in some cases, bonding of part of hydrogen to oxygen bonded to a metal element causes generation of an electron serving as a carrier. Thus, a transistor including an oxide semiconductor which contains hydrogen is likely to be normally on. Accordingly, it is preferable that hydrogen be reduced as much as possible in the oxide semiconductor layer 106. Specifically, in the oxide semiconductor layer 106, the concentration of hydrogen which is measured by secondary ion mass spectrometry (SIMS) is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, or lower than $5\times10^{18}$ atoms/cm$^3$, preferably lower than or equal to $1\times10^{18}$ atoms/cm$^3$, further preferably lower than or equal to $5\times10^{17}$ atoms/cm$^3$, still further preferably lower than or equal to $1\times10^{16}$ atoms/cm$^3$.

When silicon or carbon which is one of elements belonging to Group 14 is contained in the oxide semiconductor layer 106, the amount of oxygen vacancy is increased, and the oxide semiconductor layer 106 is changed to an n-type. Thus, the concentration of silicon or carbon (the concentration is measured by SIMS) in the oxide semiconductor layer 106 or the concentration of silicon or carbon (the concentration is measured by SIMS) in the vicinity of the interface between the metal oxide layer 108 and the oxide semiconductor layer 106 is set to be lower than or equal to $2\times10^{18}$ atoms/cm$^3$, preferably lower than or equal to $2\times10^{17}$ atoms/cm$^3$.

Furthermore, the concentration of alkali metal or alkaline earth metal of the oxide semiconductor layer 106, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor layer 106.

In addition, when nitrogen is contained in the oxide semiconductor layer 106, electrons serving as carriers are generated to increase the carrier density, so that the oxide semiconductor layer 106 easily becomes n-type. Thus, a transistor including an oxide semiconductor which contains nitrogen is likely to be normally on. For this reason, nitrogen in the oxide semiconductor film is preferably reduced as much as possible; the concentration of nitrogen which is measured by SIMS is preferably set to, for example, lower than or equal to $5\times10^{18}$ atoms/cm$^3$.

The oxide semiconductor layer 106 may have a non-single crystal structure, for example. The non-single crystal structure includes a c-axis aligned crystalline oxide semiconductor (CAAC-OS) which is described later, a polycrystalline structure, a microcrystalline structure described later, or an amorphous structure, for example. Among the non-single crystal structure, the amorphous structure has the highest density of defect levels, whereas CAAC-OS has the lowest density of defect levels.

The oxide semiconductor layer 106 may have an amorphous structure, for example. The oxide semiconductor film having the amorphous structure has disordered atomic arrangement and no crystalline component, for example. Alternatively, the oxide film having an amorphous structure has, for example, an absolutely amorphous structure and no crystal part.

Note that the oxide semiconductor layer 106 may be a mixed film including two or more of the following: a region having an amorphous structure, a region having a microcrystalline structure, a region having a polycrystalline structure, a region of CAAC-OS described later, and a region having a single-crystal structure. The mixed film includes, for example, two or more of a region having an amorphous structure, a region having a microcrystalline structure, a region having a polycrystalline structure, a CAAC-OS region, and a region having a single-crystal structure in some cases. Further, the mixed film has a stacked-layer structure of two or more of a region having an amorphous structure, a region having a microcrystalline structure, a region having a polycrystalline structure, a CAAC-OS region, and a region having a single-crystal structure in some cases. Note that the metal oxide layer 108 in contact with the oxide semiconductor layer 106 can have an amorphous structure, a microcrystalline structure, a polycrystalline structure, or the like, for example.

In the case where an insulating layer which contains a different constituent element (e.g., silicon) from the oxide semiconductor is provided in contact with the oxide semiconductor layer 106, an interface state due to heterojunction, entry of impurities, or the like might be formed at the interface between the oxide semiconductor layer 106 and the insulating layer. In the transistor 200 of this embodiment, the metal oxide layer 108 which has the same constituent element as the oxide semiconductor is provided between the oxide semiconductor layer 106 and the oxide insulating layer 112 which may have a different constituent element (e.g., silicon) from the oxide semiconductor. Hence, if trap states are formed between the metal oxide layer 108 and the oxide insulating layer 112 owing to impurities and defects, electrons flowing in the oxide semiconductor layer 106 are less likely to be captured by the trap states because there is a distance between the trap states and the oxide semiconductor layer 106. Accordingly, the amount of on-state current of the transistor can be increased, and the field-effect mobility can be increased. When the electrons are captured by the trap states, the electrons become negative fixed charges. As a result, the threshold voltage of the transistor fluctuates. However, by the distance between the oxide semiconductor layer 106 and the trap states, capture of the electrons by the trap states can be reduced, and accordingly a fluctuation of the threshold voltage can be reduced.

The element M contained in the metal oxide layer 108 has a high bonding strength to oxygen; therefore, oxygen vacancy is less likely to formed in the metal oxide layer 108 in which the atomic ratio of the element M is high. Therefore, it is possible to reduce the amount of oxygen vacancy in the oxide semiconductor layer 106 in contact with the metal oxide layer 108.

(Oxide Insulating Layer)

The oxide insulating layer 112 is an oxide insulating film through which oxygen is passed. Note that the oxide insulating layer 112 also functions as a film which relieves damage to the metal oxide layer 108 and the oxide semiconductor layer 106 when the oxide insulating layer 114 formed later is formed.

A silicon oxide film, a silicon oxynitride film, or the like with a thickness greater than or equal to 5 nm and less than or equal to 150 nm, preferably greater than or equal to 5 nm and less than or equal to 50 nm can be used as the oxide insulating layer 112. Note that in this specification, "silicon oxynitride film" refers to a film that contains more oxygen than nitrogen, and "silicon nitride oxide film" refers to a film that contains more nitrogen than oxygen.

In addition, it is preferable that the number of defects in the oxide insulating layer 112 be small and typically, the spin density of a signal that appears at g=2.001 due to a dangling bond of silicon be lower than or equal to $3 \times 10^{17}$ spins/cm$^3$ by electron spin resonance (ESR) measurement. This is because if the density of defects in the oxide insulating layer 112 is high, oxygen is bonded to the defects and the amount of oxygen that passes through the oxide insulating layer 112 is decreased.

Moreover, it is preferable that the amount of defects at the interface between the oxide insulating layer 112 and the metal oxide layer 108 be small, typically the spin density corresponding to a signal which appears at g of greater than or equal to 1.89 and less than or equal to 1.93 due to an oxygen vacancy in the metal oxide layer 108 be lower than or equal to $1 \times 10^{17}$ spins/cm$^3$, more preferably lower than or equal to the lower limit of detection by ESR measurement.

Note that all oxygen entering the oxide insulating layer 112 from the outside does not move to the outside of the oxide insulating layer 112 and some oxygen remains in the oxide insulating layer 112. Furthermore, movement of oxygen occurs in the oxide insulating layer 112 in some cases in such a manner that oxygen enters the oxide insulating layer 112 and oxygen contained in the oxide insulating layer 112 moves to the outside of the oxide insulating layer 112. When an oxide insulating film which is permeable to oxygen is formed as the oxide insulating layer 112, oxygen released from the oxide insulating layer 114 provided over the oxide insulating layer 112 can be moved to the oxide semiconductor layer 106 through the oxide insulating layer 112.

The oxide insulating layer 114 is formed in contact with the oxide insulating layer 112. The oxide insulating layer 114 is formed using an oxide insulating film whose oxygen content is in excess of that in the stoichiometric composition. Part of oxygen is released by heating from the oxide insulating film containing more oxygen than that in the stoichiometric composition. The oxide insulating film containing more oxygen than that in the stoichiometric composition is an oxide insulating film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the substrate temperature in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used for the oxide insulating layer 114.

It is preferable that the amount of defects in the oxide insulating layer 114 be small, and typically the spin density corresponding to a signal which appears at g=2.001 due to a dangling bond of silicon, be lower than $1.5 \times 10^{18}$ spins/cm$^3$, more preferably lower than or equal to $1 \times 10^{18}$ spins/cm$^3$ by ESR measurement. Note that the oxide insulating layer 114 is provided more apart from the oxide semiconductor layer 106 than the oxide insulating layer 112 is; thus, the oxide insulating layer 114 may have higher defect density than the oxide insulating layer 112.

(Nitride Insulating Layer)

It is possible to prevent outward diffusion of oxygen from the oxide semiconductor layer 106 and entry of hydrogen, water, and the like into the oxide semiconductor layer 106 from the outside by providing the nitride insulating layer 116 having a blocking effect against oxygen, hydrogen, water, alkali metal, alkaline earth metal, and the like over the oxide insulating layer 114. The nitride insulating layer is formed using silicon nitride, silicon nitride oxide, aluminum nitride, aluminum nitride oxide, or the like. Note that instead of the nitride insulating layer having a blocking effect against oxygen, hydrogen, water, alkali metal, alkaline earth metal, and the like, an oxide insulating layer having a blocking effect against oxygen, hydrogen, water, and the like, may be provided. As the oxide insulating layer having a blocking effect against oxygen, hydrogen, water, and the like, aluminum oxide, aluminum oxynitride, gallium oxide, gallium oxynitride, yttrium oxide, yttrium oxynitride, hafnium oxide, and hafnium oxynitride can be given.

<Structure Example 2 of Transistor>

Figure 2A:
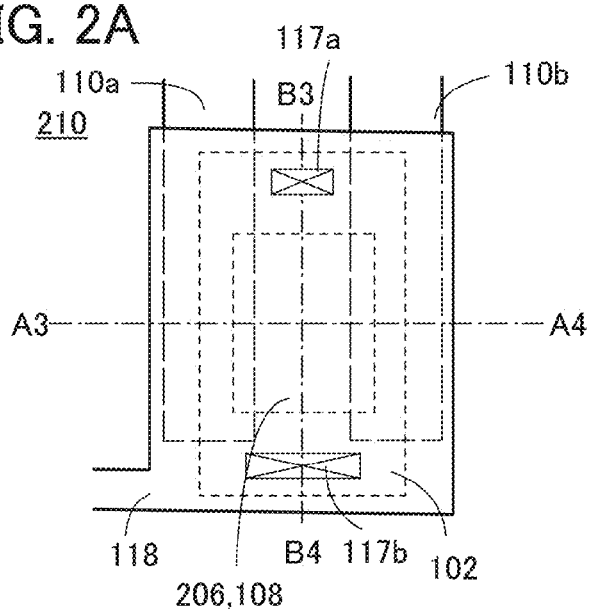
FIGS. 2A and 2B are a plan view and a cross-sectional view of a transistor of one embodiment of the present invention.
Figure 2B:
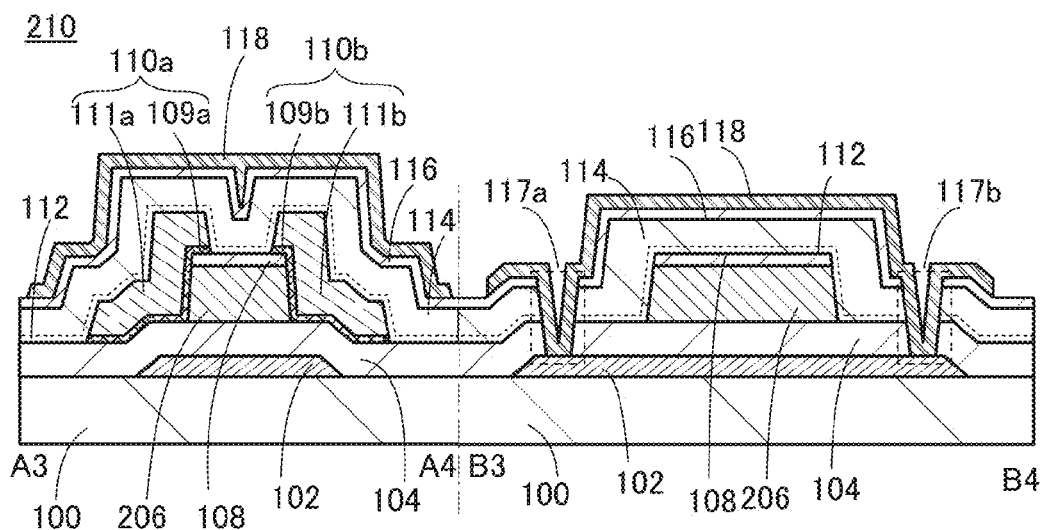

FIGS. 2A to 2B are a plan view and a cross-sectional view of a transistor 210 included in a semiconductor device of this embodiment. FIG. 2A is a plan view of the transistor 210, and FIG. 2B is a cross-sectional view taken along dashed dotted lines A3-A4 and B3-B4 in FIG. 2A. Note that the substrate 100 and some components (e.g., a gate insulating layer) of the transistor 210 are not illustrated in FIG. 2A for simplicity.

The transistor 210 illustrated in FIGS. 2A and 2B includes the gate electrode layer 102 formed over the substrate 100; the gate insulating layer 104 in contact with the gate electrode layer 102; an oxide semiconductor layer 206 facing the gate electrode layer 102 with the gate insulating layer 104 positioned therebetween; the metal oxide layer 108 over the oxide semiconductor layer 206; the pair of electrode layers 110a and 110b in contact with the metal oxide layer 108; the oxide insulating layer 112, the oxide insulating layer 114, and the nitride insulating layer 116 formed over the pair of electrode layers 110a and 110b and the metal oxide layer 108; and an electrode layer 118 formed over the nitride insulating layer 116.

The electrode layer 118 functions as a back gate electrode in the transistor 210. A stacked-layer structure that includes the oxide insulating layer 112, the oxide insulating layer 114, and the nitride insulating layer 116 and is provided between the electrode layer 118 and the oxide semiconductor layer 206 functions as a gate insulating layer for the back gate electrode. The electrode layer 118 is connected to the gate electrode layer 102 through opening portions 117a and 117b formed in the gate insulating layer 104, the oxide insulating layer 112, the oxide insulating layer 114, and the nitride insulating layer 116. Therefore, the same potential is applied to the electrode layer 118 and the gate electrode layer 102.

The transistor 210 in FIGS. 2A and 2B is different from the transistor 200 in FIGS. 1A and 1B in that the electrode layer 118 functioning as a back gate electrode is provided over the nitride insulating layer 116. The other structures are the same as those of the transistor 200 and the effect similar to that in the case of the transistor 200 can be obtained. That is, the transistor 210 includes the metal oxide layer 108 which functions as a barrier layer and which is positioned between the pair of electrode layers 110a and 110b containing a low-resistance material and the oxide semiconductor layer 206 where a channel is formed. Thus, entry and diffusion of impurities to the oxide semiconductor layer 206 can be prevented. Thus, a reduction in the electrical characteristics is inhibited in the transistor 210. For details of every component in the transistor 210, the description of the transistor 200 can be referred to.

The oxide semiconductor layer 206 included in the transistor 210 in FIGS. 2A and 2B is formed using the same material as the oxide semiconductor layer 106 included in the transistor 200, and has a thickness greater than or equal to 100 nm, for example, greater than or equal to 100 nm and less than or equal to 1000 nm, preferably greater than or equal to 200 nm and less than or equal to 1000 nm. The channel length of the transistor 210 (the distance between the pair of electrode layers 110a and 110b) is preferably greater than or equal to 0.5 μm and less than or equal to 2 μm, further preferably greater than or equal to 0.5 μm and less than or equal to 1 μm.

As illustrated in the cross-sectional view of FIG. 2B, the oxide semiconductor layer 206 faces each of the gate electrode layer 102 and the electrode layer 118 (back gate electrode) to be positioned between the two electrode layers. The lengths in the channel length direction and the channel width direction of the electrode layer 118 functioning as a back gate electrode are longer than those of the oxide semiconductor layer 206, respectively. The whole oxide semiconductor layer 206 is covered with the electrode layer 118 with the insulating layers (the oxide insulating layer 112, the oxide insulating layer 114, and the nitride insulating layer 116) positioned therebetween. Furthermore, since the electrode layer 118 and the gate electrode layer 102 are connected to each other through the opening portions 117a and 117b formed in the gate insulating layer 104, the oxide insulating layer 112, the oxide insulating layer 114, and the nitride insulating layer 116, side surfaces of the oxide semiconductor layer 206 in the channel width direction face the back gate electrode (electrode layer 118) with the insulating layers (the oxide insulating layer 112, the oxide insulating layer 114, and the nitride insulating layer 116) positioned therebetween.

Such a structure enables electric fields of the gate electrode layer 102 and the electrode layer 118 to electrically surround the oxide semiconductor layer 206 included in the transistor 210. A device structure of a transistor, like that of the transistor 210, in which electric fields of a gate electrode layer and a back gate electrode electrically surround an oxide semiconductor layer where a channel is formed can be referred to as a surrounded channel (s-channel) structure.

Since the transistor 210 has the s-channel structure, an electric field for inducing a channel can be effectively applied to the oxide semiconductor layer 206 by the gate electrode layer 102; therefore, the current drive capability of the transistor 210 can be improved and high on-state current characteristics can be obtained. Since the on-state current can be increased, it is possible to reduce the size of the transistor 210. Furthermore, since the transistor 210 has a structure in which the channel is surrounded by the gate electrode layer 102 and the electrode layer 118, the mechanical strength of the transistor 210 can be increased.

Note that in the structure of the transistor 210, any one of the opening portions 117a and 117b may be formed, and the electrode layer 118 and the gate electrode layer 102 may be connected to each other through the opening portion.

Note that the pair of electrode layers 110a and 110b included in the transistor 210 has stacked-layer structures including first conductive layers 109a and 109b and second conductive layers 111a and 111b. Any of the materials given in the description of the first layer of the electrode layers 110a and 110b can be used for the first conductive layers 109a and 109b, as appropriate. In addition, any of the materials given in the description of the second layer of the electrode layers 110a and 110b can be used for the second conductive layers 111a and 111b, as appropriate. Note that the structure of the pair of electrode layers 110a and 110b of the transistor 210 is not limited to that illustrated in FIGS. 2A and 2B as long as the pair of the electrode layers 110a and 110b contain copper, aluminum, gold, or silver, and may be a single-layer structure or a stacked-layer structure of three layers or more.

<Structure Example 3 of Transistor>

Figure 3A:
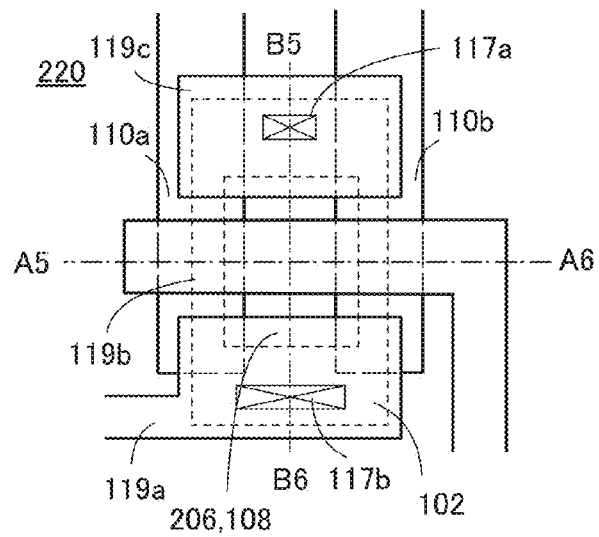
FIGS. 3A and 3B are a plan view and a cross-sectional view of a transistor of one embodiment of the present invention.
Figure 3B:
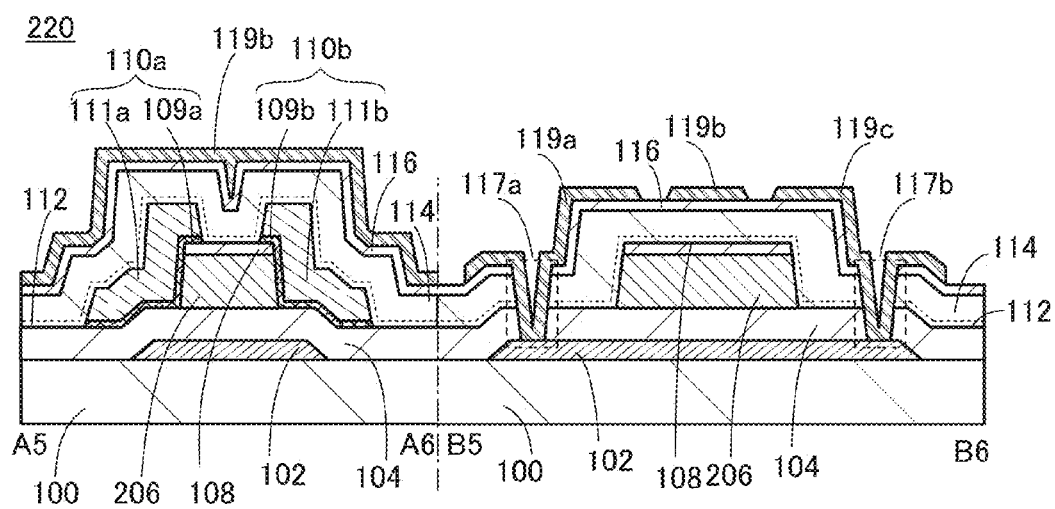

FIGS. 3A to 3B are a plan view and a cross-sectional view of a transistor 220 included in a semiconductor device of this embodiment. The transistor 220 is a modification example of the transistor 210 in FIGS. 2A and 2B. FIG. 3A is a plan view of the transistor 220, and FIG. 3B is a cross-sectional view taken along dashed dotted lines A5-A6 and B5-B6 in FIG. 3A. Note that the substrate 100 and some components (e.g., a gate insulating layer) of the transistor 220 are not illustrated in FIG. 3A for simplicity.

The transistor 220 illustrated in FIGS. 3A and 3B includes the gate electrode layer 102 formed over the substrate 100; the gate insulating layer 104 in contact with the gate electrode layer 102; the oxide semiconductor layer 206 facing the gate electrode layer 102 with the gate insulating layer 104 positioned therebetween; the metal oxide layer 108 functioning as a barrier layer and provided over the oxide semiconductor layer 206; the pair of electrode layers 110a and 110b in contact with the metal oxide layer 108; the oxide insulating layer 112, the oxide insulating layer 114, and the nitride insulating layer 116 formed over the pair of electrode layers 110a and 110b and the metal oxide layer 108; and electrode layers 119a, 119b, and 119c formed over the nitride insulating layer 116.

In the transistor 220, the electrode layer 119b, which overlaps the oxide semiconductor layer 206 with the metal oxide layer 108 and the insulating layers (the oxide insulating layer 112, the oxide insulating layer 114, and the nitride insulating layer 116) positioned therebetween, functions as a back gate electrode. The electrode layers 119a and 119c, which are formed in the same layer as the electrode layer 119b, are connected to the gate electrode layer 102, through the opening portions 117a and 117b, respectively, which are formed in the gate insulating layer 104, the oxide insulating layer 112, the oxide insulating layer 114, and the nitride insulating layer 116. That is, the electrode layers 119a and 119c function as part of the gate electrode layer 102.

The transistor 220 is different from the transistor 210 in that the electrode layer 118, which functions as a back gate electrode in the transistor 210, is separated. The other components of the transistor 220 can be similar to those of the transistor 210. The description of the transistor 210 can be referred to for details of the structure of the transistor 220.

The electrode layers 119a and 119c included in the transistor 220 have regions which overlap the oxide semiconductor layer 206 when seen from the above, and face the side surfaces of the oxide semiconductor layer 206 in the opening portions 117a and 117b. Thus, like the transistor 210, the transistor 220 also has an s-channel structure in which the oxide semiconductor layer 206 is electrically surrounded by the gate electrode layer 102 and the electrode layers 119a, 119b, and 119c; therefore, an electric field for inducing a channel can be effectively applied to the oxide semiconductor layer 206 by the gate electrode layer 102. Accordingly, the current drive capability of the transistor 220 is increased, so that high on-state current can be obtained.

Furthermore, since the electrode layer 119b functioning as a back gate electrode is not electrically connected to the gate electrode layer 102 in the transistor 220, different potentials or signals can be input to the gate electrode layer 102 and the electrode layer 119b. Therefore, by a signal or potential input to the electrode layer 119b functioning as a back gate electrode, the threshold voltage of the transistor 220 can be shifted in the positive or negative direction. In the operation period of the semiconductor device, the transistor 220 can be changed to an enhancement-type or depression-type transistor, as appropriate by appropriate control of the threshold voltage of the transistor 220.

<Structure Example 4 of Transistor>

Figure 4A:
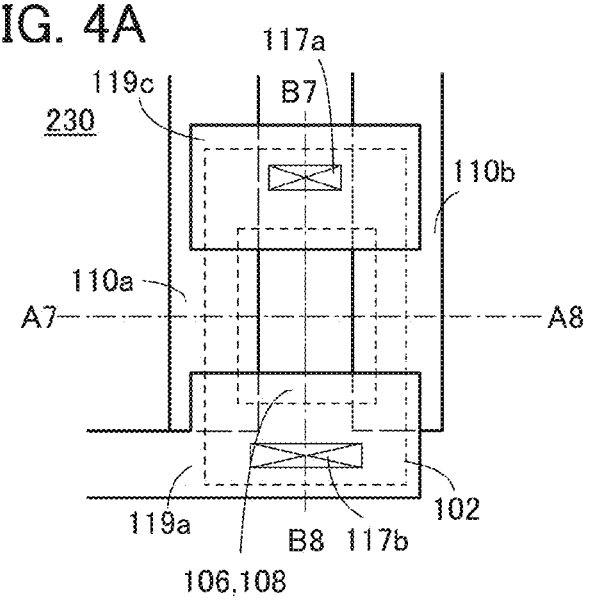
FIGS. 4A and 4B are a plan view and a cross-sectional view of a transistor of one embodiment of the present invention.
Figure 4B:
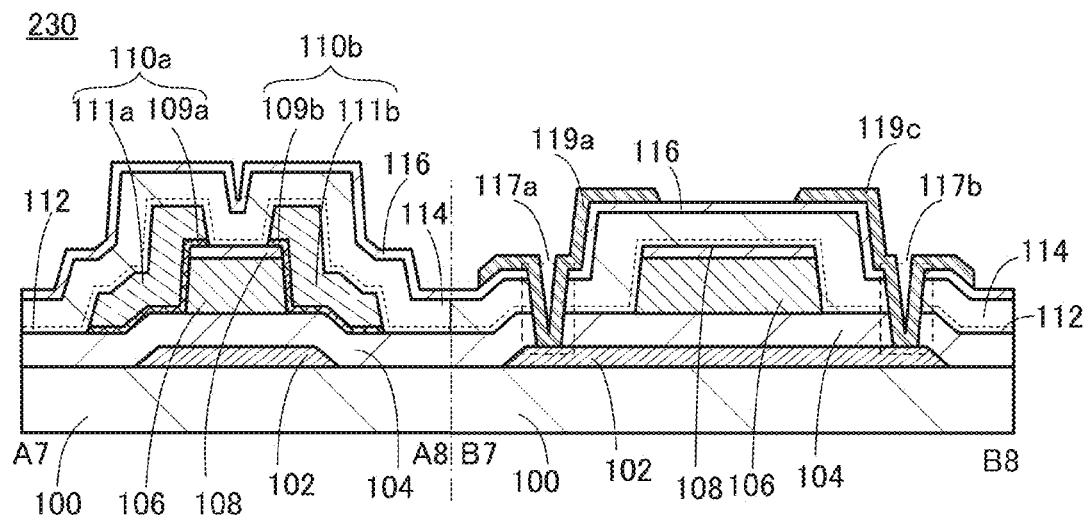

FIGS. 4A to 4B are a plan view and a cross-sectional view of a transistor 230 included in a semiconductor device of this embodiment. The transistor 230 is a modification example of the transistors 210 and 220 in FIGS. 2A and 2B and FIGS. 3A and 3B. FIG. 4A is a plan view of the transistor 230, and FIG. 4B is a cross-sectional view taken along dashed dotted lines A7-A8 and B7-B8 in FIG. 4A. Note that the substrate 100 and some components (e.g., a gate insulating layer) of the transistor 230 are not illustrated in FIG. 4A for simplicity.

The transistor 230 illustrated in FIGS. 4A and 4B includes the gate electrode layer 102 formed over the substrate 100; the gate insulating layer 104 in contact with the gate electrode layer 102; the oxide semiconductor layer 106 facing the gate electrode layer 102 with the gate insulating layer 104 positioned therebetween; the metal oxide layer 108 functioning as a barrier layer and provided over the oxide semiconductor layer 106; the pair of electrode layers 110a and 110b in contact with the metal oxide layer 108; the oxide insulating layer 112, the oxide insulating layer 114, and the nitride insulating layer 116 formed over the pair of electrode layers 110a and 110b and the metal oxide layer 108; and the electrode layers 119a and 119c formed over the nitride insulating layer 116.

The transistor 230 includes the electrode layers 119a and 119c, which have regions overlapping the oxide semiconductor layer 106 with the metal oxide layer 108 and the insulating layers (the oxide insulating layer 112, the oxide insulating layer 114, and the nitride insulating layer 116) positioned therebetween. The electrode layers 119a and 119c are connected to the gate electrode layer 102 through the opening portions 117a and 117b, respectively, which are formed in the gate insulating layer 104, the oxide insulating layer 112, the oxide insulating layer 114, and the nitride insulating layer 116, and the electrode layers 119a and 119c function as part of the gate electrode layer 102. That is, the transistor 230 has the structure of the transistor 220 in which the electrode layer 119b functioning as a back gate electrode is omitted. Note that only one of the electrode layers 119a and 119c may be provided in each of the transistor 220 and the transistor 230.

The transistor 230 also includes the gate electrode layers (the gate electrode layer 102 and the electrode layers 119a and 119c) that face the top and bottom surfaces and two facing side surfaces of the oxide semiconductor layer 206; therefore, like the transistors 210 and 220, the transistor 230 also has an s-channel structure in which the oxide semiconductor layer 206 is electrically surrounded. Therefore, the current drive capability of the transistor 230 is improved, so that the transistor 230 can have high on-state current. The descriptions of the transistors 210 and 220 can be referred to for details of every components of the transistor 230.

Note that the structures of the transistors of this embodiment can be freely combined with each other.

<Method for Manufacturing Transistor>

A method for manufacturing the transistor of this embodiment is described using FIGS. 5A to 5D and FIGS. 6A to 6C. Note that a method for manufacturing the transistor 210 is described below as a typical example.

First, a conductive film is formed over the substrate 100 and processed through a photolithography process to form the gate electrode layer 102. Next, the gate insulating layer 104 is formed over the gate electrode layer 102 (see FIG. 5A).

The conductive film to be the gate electrode layer 102 can be formed by a sputtering method, a chemical vapor deposition (CVD) method, a vacuum evaporation method, or a pulsed laser deposition (PLD) method. Alternatively, a coating method or a printing method can be used. Although typical deposition methods are a sputtering method and a plasma chemical vapor deposition (PECVD) method, a thermal CVD method such as a metal organic chemical vapor deposition (MOCVD) method or an atomic layer deposition (ALD) method may be used.

A thermal CVD method is a deposition method in which deposition may be performed in such a manner that the pressure in a chamber is set to an atmospheric pressure or a reduced pressure, and a source gas and an oxidizer are supplied to the chamber at the same time and react with each other in the vicinity of the substrate or over the substrate to be deposited over the substrate. A thermal CVD method has an advantage that no defect due to plasma damage is generated since it does not utilize plasma for deposition.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

In this embodiment, a glass substrate is used as the substrate 100, and a 100-nm-thick tungsten layer is formed as the gate electrode layer 102 by a sputtering method.

Note that for example, in the case where a tungsten layer is formed using a deposition apparatus utilizing ALD, a $WF_6$ gas and a $B_2H_6$ gas are sequentially introduced a plurality of times to form an initial tungsten layer, and then a $WF_6$ gas and an $H_2$ gas are introduced at a time, so that a tungsten layer is formed. Note that an $SiH_4$ gas may be used instead of a $B_2H_6$ gas.

The gate insulating layer 104 can be formed by a sputtering method, a PECVD method, a thermal CVD method, a vacuum evaporation method, a PLD method, or the like. Here, a stack including a 400-nm-thick silicon nitride film and a 50-nm-thick silicon oxynitride film is formed as the gate insulating layer 104 by a PECVD method.

Alternatively, a film to be the gate insulating layer 104 may be formed by a thermal CVD method. For example, in the case where a hafnium oxide film is formed, two kinds of gases, i.e., ozone ($O_3$) as an oxidizer and a source gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed, two kinds of gases, e.g., $H_2O$ as an oxidizer and a source gas which is obtained by vaporizing liquid containing a solvent and an aluminum precursor compound (e.g. trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed, hexachlorodisilane is adsorbed on a deposition surface, chlorine contained in the adsorbate is removed, and radicals of an oxidizing gas (e.g., $O_2$ or dinitrogen monoxide) are supplied to react with the adsorbate.

Figure 5A:
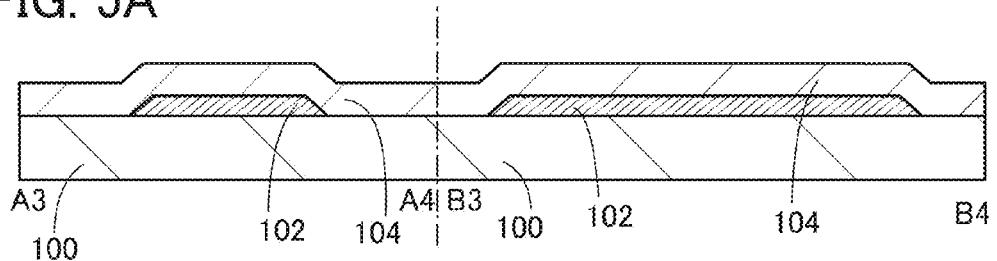
FIGS. 5A to 5D are cross-sectional views illustrating a manufacturing process of a transistor of one embodiment of the present invention.
Figure 5B:
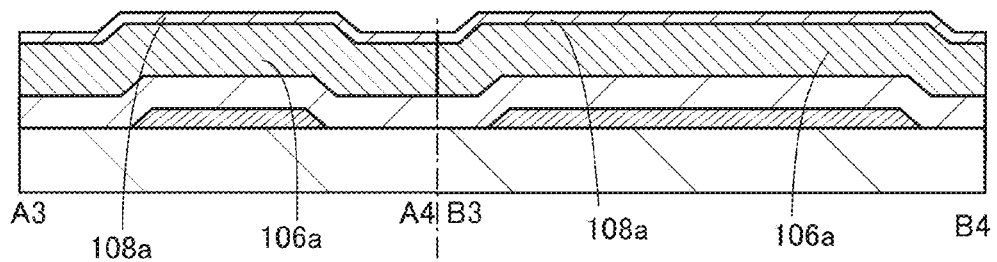

Next, a stack including an oxide semiconductor film 106a to be the oxide semiconductor layer 106 and a metal oxide film 108a to be the metal oxide layer 108 is formed over the gate insulating layer 104 (see FIG. 5B).

In this embodiment, an In—Ga—Zn oxide film is formed as the oxide semiconductor film 106a by a sputtering method using an In—Ga—Zn oxide target (In:Ga:Zn=1:1:1). Furthermore, an In—Ga oxide film is formed as the metal oxide film 108a by a sputtering method using an In—Ga oxide target (In:Ga=7:93). The metal oxide film 108a is formed as an oxide semiconductor film or an insulating film. Note that the constituent elements and compositions applicable to the oxide semiconductor film 106a and the metal oxide film 108a are not limited thereto.

In the case where the oxide semiconductor film 106a and the metal oxide film 108a are formed by a sputtering method, a power supply device for generating plasma can be an RF power supply device, an AC power supply device, a DC power supply device, or the like as appropriate. Note that it is preferable to use DC discharge applicable to a large-sized substrate in deposition because the productivity of the semiconductor device can be increased. To deposit the metal oxide film 108a by a sputtering method using DC discharge, it is preferable that y/(x+y) be less than or equal to 0.96, further preferably less than or equal to 0.95, for example, 0.93 where an atomic ratio of In:M is x:y.

As a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased.

A chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor film 106a, as much as possible. Alternatively, a turbo molecular pump and a cold trap are preferably combined so as to prevent a backflow of a gas, especially a gas containing carbon or hydrogen from an exhaust system to the inside of the chamber. It is preferable to remove impurities such as water contained in the metal oxide film 108a in contact with the oxide semiconductor film 106a, as much as possible; therefore, a chamber for depositing the metal oxide film 108a is preferably evacuated to be a high vacuum state.

In order to obtain a highly purified intrinsic or highly purified substantially intrinsic oxide semiconductor film, besides the high vacuum evacuation of the chamber, a highly purification of a sputtering gas is also needed. As an oxygen gas or an argon gas used for a sputtering gas, a gas which is highly purified to have a dew point of $-40°$ C. or lower, $-80°$ C. or lower, $-100°$ C. or lower, or $-120°$ C. or lower is used, whereby entry of moisture or the like into the oxide semiconductor film 106a and the metal oxide film 108a can be minimized.

Note that the oxide semiconductor film 106a and/or the metal oxide film 108a can be formed with a deposition apparatus utilizing ALD instead of sputtering. For example, in the case where an In—Ga—Zn oxide film is formed, an $In(CH_3)_3$ gas and an $O_3$ gas are sequentially introduced plural times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Further, instead of an $In(GH_3)_3$ gas, an $In(C_2H_5)_3$ gas may be used. Instead of an $In(CH_3)_3$ gas, an $In(C_2H_5)_3$ may be used. Instead of a $Ga(CH_3)_3$ gas, a $Ga(C_2H_5)_3$ gas may be used. Furthermore, a $Zn(CH_3)_2$ gas may be used.

Figure 5C:
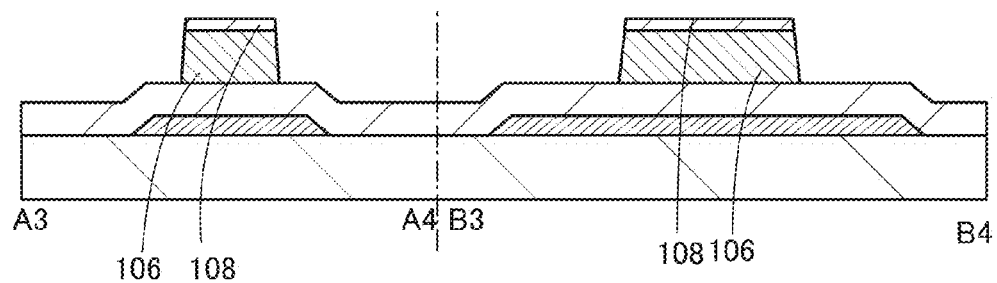

Next, a resist mask is formed over the metal oxide film 108a through a photolithography process using a photoresist mask, and then the metal oxide film 108a and the oxide semiconductor film 106a are etched using the resist mask to be isolated for each element, so that the oxide semiconductor layer 106 and the metal oxide layer 108 are formed (see FIG. 5C). A wet etching method is preferably used for the etching. Note that a dry etching method may be used, or a combination of both methods may be used.

After the oxide semiconductor layer 106 is formed, heat treatment may be performed at a temperature higher than or equal to 150° C. and lower than the strain point of the substrate, preferably higher than or equal to 200° C. and lower than or equal to 450° C., further preferably higher than or equal to 300° C. and lower than or equal to 450° C. The heat treatment performed here serves as one kind of treatment for increasing the purity of the oxide semiconductor layer and can reduce hydrogen, water, and the like contained in the oxide semiconductor layer 106. Note that the heat treatment for the purpose of reducing hydrogen, water, and the like may be performed before the oxide semiconductor layer 106 is processed into an island shape. For example, the heat treatment may be performed in a period from deposition of the oxide semiconductor film 106a to deposition of the metal oxide film 108a. In this case, the deposition temperature of the metal oxide film 108a may be room temperature.

An electric furnace, an RTA apparatus, or the like can be used for the heat treatment performed on the oxide semiconductor layer 106. With the use of an RTA apparatus, the heat treatment can be performed at a temperature higher than or equal to the strain point of the substrate if the heating time is short. Therefore, the heat treatment time can be shortened.

Note that the heat treatment performed on the oxide semiconductor layer 106 may be performed under an atmosphere of nitrogen, oxygen, ultra-dry air (air with a water content of 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like. Further, after heat treatment performed in a nitrogen atmosphere or a rare gas atmosphere, heat treatment may be additionally performed in an oxygen atmosphere or an ultra-dry air atmosphere. As a result, hydrogen, water, and the like can be released from the oxide semiconductor layer and oxygen can be supplied to the oxide semiconductor layer at the same time. Consequently, the amount of oxygen vacancies in the oxide semiconductor layer can be reduced.

Figure 5D:
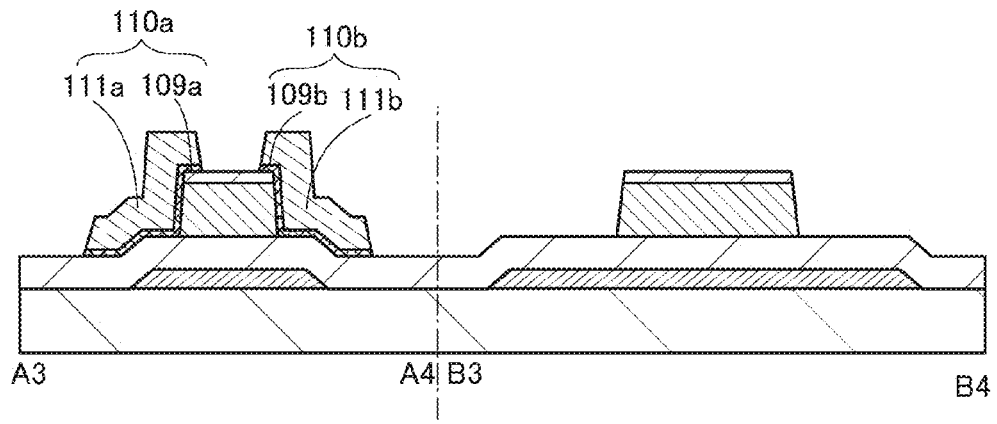

Next, the pair of electrode layers 110a and 110b in contact with the side surfaces of the oxide semiconductor layer 106 and the side and top surfaces of the metal oxide layer 108 is formed (see FIG. 5D).

Here, a 50-nm-thick tungsten film to be the first conductive layers 109a and 109b and a 300-nm-thick copper film to be the second conductive layers 111a and 111b are formed by a sputtering method. Then, a resist mask is formed over the copper film through a photolithography process using a photoresist mask, and the tungsten film and the copper film are processed using the resist mask to be the pair of electrode layers 110a and 110b. Note that as described above, the conductive films such as the tungsten film and the copper film may be formed by an ALD method or a thermal CVD method. Any of these methods makes it possible to form the conductive films without plasma damage to the oxide semiconductor layer 106 and the metal oxide layer 108.

For example, when a wet etching method is used for etching the copper film and a dry etching method using $SF_6$ is used for etching the tungsten film, a fluoride is formed on the surface of the copper film, and copper of the copper film can be prevented from diffusing into the oxide semiconductor layer 106 owing to the fluoride. In addition, the metal oxide layer 108 can function as an etching protective film for the oxide semiconductor layer 106.

Then, the oxide insulating layer 112 is formed over the pair of electrode layers 110a and 110b. After that, the oxide insulating layer 114 is formed over the oxide insulating layer 112 (see FIG. 6A).

It is preferable to form the oxide insulating layer 114 without exposure to the atmosphere, directly after the oxide insulating layer 112 is formed. After the oxide insulating layer 112 is formed, the oxide insulating layer 114 is formed by adjusting at least one of the flow rate of a source gas, pressure, a high-frequency power, and a substrate temperature without exposure to the air, whereby the concentration of impurities attributed to the atmospheric component at the interface between the oxide insulating layer 112 and the oxide insulating layer 114 can be reduced and oxygen in the oxide insulating layer 114 can be moved to the oxide semiconductor layer 106; accordingly, the amount of oxygen vacancy in the oxide semiconductor layer 106 can be reduced.

For example, a silicon oxide film or a silicon oxynitride film can be formed as the oxide insulating layer 112 under the following conditions: the substrate placed in an evacuated treatment chamber of the plasma CVD apparatus is held at a temperature ranging from 180° C. to 400° C., preferably from 200° C. to 370° C.; the pressure of the chamber into which the source gas is introduced is set in the range from 20 Pa to 250 Pa, preferably from 100 Pa to 250 Pa; and high-frequency power is supplied to the electrode provided in the treatment chamber.

With the use of the above deposition conditions, an oxide insulating layer which is permeable to oxygen can be formed as the oxide insulating layer 112. Further, by providing the metal oxide layer 108 and the oxide insulating layer 112, damage to the oxide semiconductor layer 106 can be reduced in a step of forming the oxide insulating layer 114 which is formed later.

Under these deposition conditions, the bonding strength of silicon and oxygen becomes strong when the substrate temperature is higher than or equal to 300° C. and lower than or equal to 400° C., preferably higher than or equal to 320° C. and lower than or equal to 370° C. Thus, as the oxide insulating layer 112, a dense and hard oxide insulating layer that is permeable to oxygen, typically, a silicon oxide film or a silicon oxynitride film of which etching using hydrofluoric acid of 0.5 wt % at 25° C. is performed at a rate of lower than or equal to 10 nm/min, preferably lower than or equal to 8 nm/min can be formed.

It is effective for release of hydrogen, water, and the like contained in the oxide semiconductor layer 106 and the metal oxide layer 108 in contact therewith to form the oxide insulating layer 112 while heating is performed in the step of depositing the oxide insulating layer 112. Hydrogen contained in the oxide semiconductor layer 106 is bonded to an oxygen radical formed in plasma to form water. Since the substrate is heated in the step for depositing the oxide insulating layer 112, water formed by bonding of oxygen and hydrogen is released from the oxide semiconductor layer 106. That is, formation of the oxide insulating layer 112 by a plasma CVD method can reduce the amount of water, hydrogen, and the like contained in the oxide semiconductor layer 106.

Furthermore, by setting the pressure in the treatment chamber to be higher than or equal to 100 Pa and lower than or equal to 250 Pa, the amount of water contained in the oxide insulating layer 112 is reduced; thus, variation in electrical characteristics of the transistor 210 can be reduced and change in threshold voltage can be inhibited.

Note that it is preferable to reduce damage to the oxide semiconductor layer 106 as much as possible at the time of depositing the oxide insulating layer 112. This is because in the case where the oxide insulating layer 114 that is formed later for the purpose of improving the reliability of the transistor is formed under the conditions that can reduce the defects in the film, the amount of oxygen released from the oxide insulating layer 114 tends to be reduced, and thus it is difficult to adequately reduce defects of the oxide semiconductor layer 106. Thus, it is preferable that the pressure in a treatment chamber be higher than or equal to 100 Pa and lower than or equal to 250 Pa at the time of depositing the oxide insulating layer 112. Deposition under such conditions can reduce damage to the oxide semiconductor layer 106.

Note that when the ratio of the amount of the oxidizing gas to the amount of the deposition gas containing silicon is 100 or higher, the hydrogen content in the oxide insulating layer 112 can be reduced. Consequently, the amount of hydrogen entering the oxide semiconductor layer 106 can be reduced, thereby inhibiting the negative shift in the threshold voltage of the transistor.

As the oxide insulating layer 114, a silicon oxide film or a silicon oxynitride film is formed under the following conditions: the substrate placed in a treatment chamber of the plasma CVD apparatus that is vacuum-evacuated is held at a temperature higher than or equal to 180° C. and lower than or equal to 280° C., preferably higher than or equal to 200° C. and lower than or equal to 240° C. the pressure is greater than or equal to 100 Pa and less than or equal to 250 Pa, preferably greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to the electrode provided in the treatment chamber.

As the deposition conditions of the oxide insulating layer 114, the high-frequency power having the above power density is supplied to the reaction chamber having the above pressure, whereby the degradation efficiency of the source gas in plasma is increased, oxygen radicals are increased, and oxidation of the source gas is promoted; therefore, the oxygen content of the oxide insulating layer 114 becomes higher than that in the stoichiometric composition. On the other hand, in the film formed at a substrate temperature within the above temperature range, a bond between silicon and oxygen is weak, and accordingly, part of oxygen in the film is released by heat treatment in a later step. Thus, it is possible to form an oxide insulating layer which contains oxygen in a proportion higher than that of oxygen in the stoichiometric composition and from which part of oxygen is released by heating.

Note that the oxide insulating layer 112 serves as a protective film of the metal oxide layer 108 in the step of forming the oxide insulating layer 114. Furthermore, the metal oxide layer 108 serves as a protective film of the oxide semiconductor layer 106. Consequently, the oxide insulating layer 114 can be formed using the high-frequency power having a high power density while damage to the oxide semiconductor layer 106 is reduced.

Note that in the deposition conditions of the oxide insulating layer 114, when the flow rate of the deposition gas containing silicon with respect to the oxidizing gas is increased, the amount of defects in the oxide insulating layer 114 can be reduced. Typically, it is possible to form an oxide insulating layer in which the amount of defects is small, i.e., the spin density of a signal which appears at g=2.001 originating from a dangling bond of silicon is lower than $6 \times 10^{17}$ spins/cm$^3$, preferably lower than or equal to $3 \times 10^{17}$ spins/cm$^3$, further preferably lower than or equal to $1.5 \times 10^{17}$ spins/cm$^3$ by ESR measurement. As a result, the reliability of the transistor can be improved.

After the oxide insulating layers 112 and 114 are formed, heat treatment is performed. By the heat treatment, part of oxygen contained in the oxide insulating layer 114 can be moved to the oxide semiconductor layer 106, so that the amount of oxygen vacancy contained in the oxide semiconductor layer 106 can be further reduced. After the heat treatment, the nitride insulating layer 116 is formed.

In the case where water, hydrogen, or the like is contained in the oxide insulating layers 112 and 114, when the nitride insulating layer 116 having a function of blocking water, hydrogen, and the like is formed and then heat treatment is performed, water, hydrogen, or the like contained in the oxide insulating layers 112 and 114 are moved to the oxide semiconductor layer 106, so that defects are generated in the oxide semiconductor layer 106. Thus, when heat treatment is performed before formation of the nitride insulating layer 116, water or hydrogen contained in the oxide insulating layers 112 and 114 can be effectively reduced.

Note that when the oxide insulating layer 114 is formed over the oxide insulating layer 112 while being heated, oxygen can be moved to the oxide semiconductor layer 106 to reduce oxygen vacancy included in the oxide semiconductor layer 106; therefore, the heat treatment is not necessarily performed in some cases.

The temperature of the heat treatment performed on the oxide insulating layers 112 and 114 is typically higher than or equal to 150° C. and lower than or equal to 400° C. preferably higher than or equal to 300° C. and lower than or equal to 400° C. further preferably higher than or equal to 320° C. and lower than or equal to 370° C. The heat treatment may be performed in an atmosphere of nitrogen, oxygen, ultra-dry air (air in which a water content is 20 ppm or less, preferably 1 ppm or less, further preferably 10 ppb or less), or a rare gas (argon, helium, or the like). Note that an electric furnace, an RTA apparatus, or the like can be used for the heat treatment, in which it is preferable that hydrogen, water, and the like not be contained in the nitrogen, oxygen, ultra-dry air, or rare gas.

Here, the heat treatment is performed at 350° C. in a mixed atmosphere of nitrogen and oxygen for one hour. After that, the nitride insulating layer 116 is formed (see FIG. 6A).

In the case where the nitride insulating layer 116 is formed by a plasma CVD method, the substrate temperature is preferably higher than or equal to 300° C. and lower than or equal to 400° C., further preferably higher than or equal to 320° C. and lower than or equal to 370° C. because a dense film can be formed.

For example, in the case where a silicon nitride film is formed as the nitride insulating layer 116 by the plasma CVD method, a deposition gas containing silicon, nitrogen, and ammonia are preferably used as a source gas. A small amount of ammonia compared to the amount of nitrogen is used, whereby ammonia is dissociated in plasma and activated species are generated. The activated species cleave a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia with respect to nitrogen is large, decomposition of a deposition gas containing silicon and decomposition of nitrogen are not promoted, so that a sparse silicon nitride film in which bonds between silicon and hydrogen remain and defects are increased is formed. Therefore, in the source gas, a flow rate ratio of the nitrogen to the ammonia is set to be greater than or equal to 5 and less than or equal to 50, preferably greater than or equal to 10 and less than or equal to 50.

Here, a 50-nm-thick silicon nitride film is formed as the nitride insulating layer 116 using source gases of silane, nitrogen, and ammonia with a plasma CVD apparatus. The flow rates of silane, nitrogen, and ammonia are 50 sccm, 5000 sccm, and 100 sccm, respectively. The pressure in a treatment chamber is set to 100 Pa, the substrate temperature is set to 350° C., and a high frequency power of 1000 W is supplied to parallel plate electrodes using a high frequency power source of 27.12 MHz. Note that a PECVD apparatus is a parallel-plate plasma CVD apparatus in which the electrode area is 6000 cm$^2$, and the power per unit area (power density) into which the supplied power is converted is $1.7 \times 10^{-1}$ W/cm$^2$.

After formation of the nitride insulating layer 116, heat treatment may be performed. The heat treatment is performed typically at a temperature higher than or equal to 150° C. and lower than or equal to 400° C., preferably higher than or equal to 300° C. and lower than or equal to 400° C., further preferably higher than or equal to 320° C. and lower than or equal to 370° C. When the heat treatment is performed, the amount of hydrogen and water of the oxide insulating layers 112 and 114 is reduced; therefore, generation of defects in the oxide semiconductor layer 106 described above is inhibited.

Next, a resist mask is formed over the nitride insulating layer 116 through a photolithography process using a photoresist mask. The nitride insulating layer 116, the oxide insulating layers 112 and 114, and the gate insulating layer 104 are etched using the resist mask to form the opening portions 117a and 117b (see FIG. 6B).

Figure 6A:
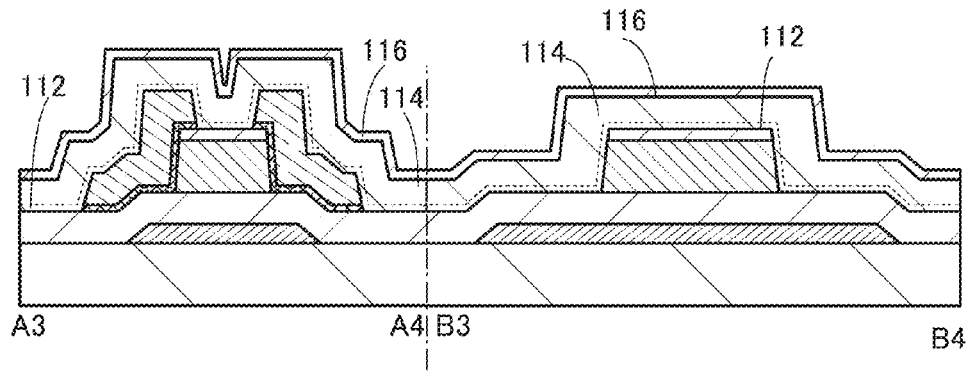
FIGS. 6A to 6C are cross-sectional views illustrating a manufacturing process of a transistor of one embodiment of the present invention.
Figure 6B:
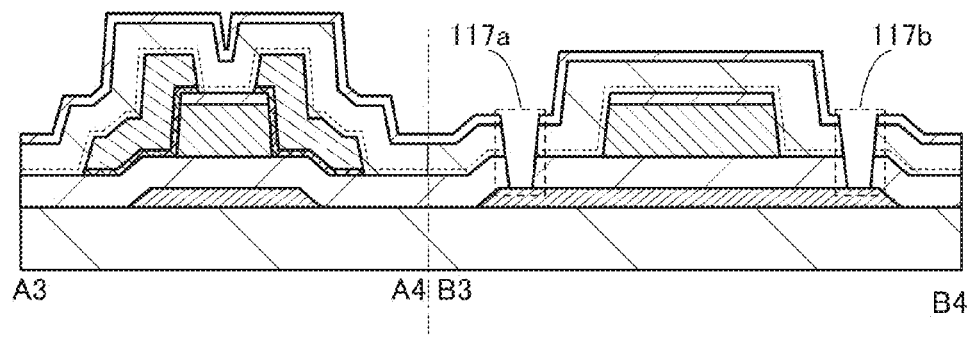
Figure 6C:
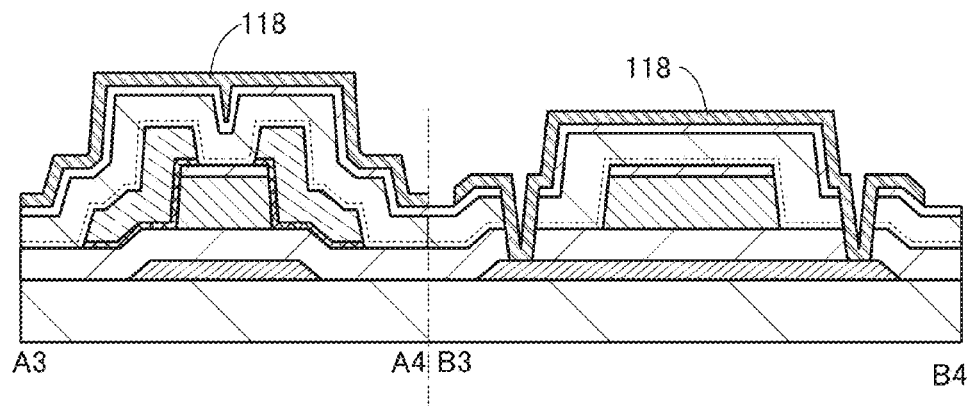

After the resist mask is removed, a conductive film is formed over the nitride insulating layer 116 and processed to form the electrode layer 118 functioning as a back gate electrode (see FIG. 6C).

Through the above-described process, the transistor 210 of this embodiment can be formed. Note that the other transistors of this embodiment can be formed in a manner similar to that of the transistor 210.

As described above, since electrode layers containing a low-resistance material such as copper, aluminum, gold, or silver are used as the pair of electrode layers functioning as the source and drain electrode layers in the transistor described in this embodiment, a semiconductor device in which wiring delay is suppressed can be manufactured. Furthermore, when a metal oxide layer functioning as a barrier layer is provided in contact with the pair of electrode layers, a reduction in the electrical characteristics can be inhibited, so that the semiconductor device can have favorable electrical characteristics.

According to the manufacturing process of this embodiment, it is possible to manufacture a highly reliable transistor in which the oxygen vacancy in the oxide semiconductor layer including the channel formation region is reduced and the impurity concentration is reduced.

Furthermore, since the transistor of this embodiment is a channel-etched transistor that is formed in such a manner that the metal oxide layer 108 functioning as a barrier layer for preventing entry of impurities is formed using the same mask as the oxide semiconductor layer 106, the number of masks can be reduced as compared to the case of a channel protective transistor. Therefore, the manufacturing cost of the semiconductor device can be reduced.

The structure and method described in this embodiment can be implemented by being combined as appropriate with any of the other structures and methods described in the other embodiments.

(Embodiment 2)

The structure of an oxide semiconductor layer included in a transistor of one embodiment of the present invention is described in this embodiment.

A structure which can be included in an oxide semiconductor layer is described below.

An oxide semiconductor layer is classified into, for example, a non-single-crystal oxide semiconductor layer and a single crystal oxide semiconductor layer. Alternatively, an oxide semiconductor layer is classified into, for example, a crystalline oxide semiconductor layer and an amorphous oxide semiconductor layer.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS layer is described.

A CAAC-OS layer is one of oxide semiconductor layers having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 8A:
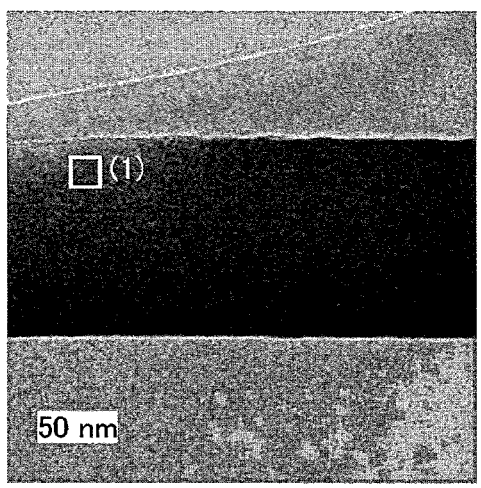
FIGS. 8A to 8D are Cs-corrected high-resolution TEM images of a cross section of a CAAC-OS and a cross-sectional schematic view of the CAAC-OS.

FIG. 8A shows an example of a high-resolution TEM image of a cross section of the CAAC-OS which is obtained from a direction substantially parallel to the sample surface. Here, the TEM image is obtained with a spherical aberration corrector function. The high-resolution TEM image obtained with a spherical aberration corrector function is particularly referred to as a Cs-corrected high-resolution TEM image in the following description. Note that the Cs-corrected high-resolution TEM image can be obtained with, for example, an atomic resolution analytical electron microscope JEM-ARM200F manufactured by JEOL Ltd.

Figure 8B:
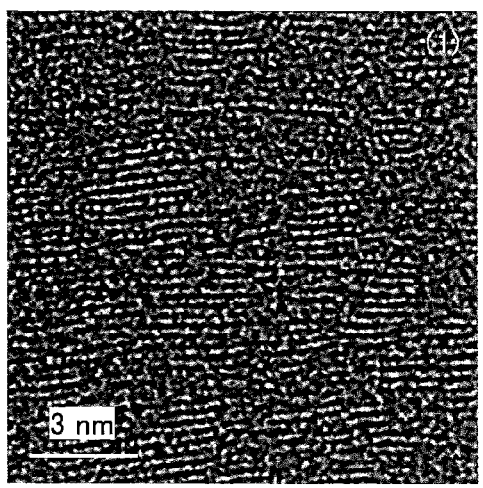

FIG. 8B is an enlarged Cs-corrected high-resolution TEM image of a region (1) in FIG. 8A. FIG. 8B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 8C:
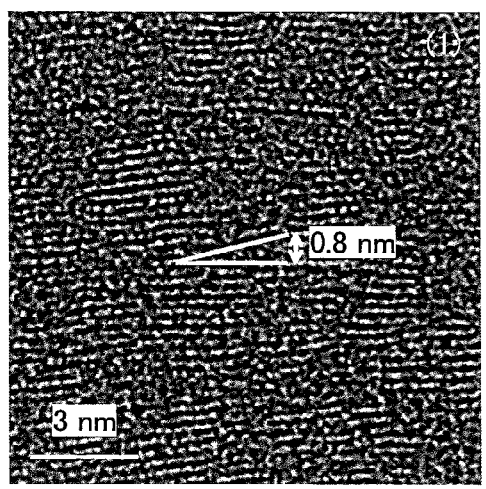

As shown in FIG. 8B, the CAAC-OS has a characteristic atomic arrangement. The characteristic atomic arrangement is denoted by an auxiliary line in FIG. 8C. FIGS. 8B and 8C prove that the size of a pellet is approximately 1 nm to 3 nm, and the size of a space caused by tilt of the pellets is approximately 0.8 nm. Therefore, the pellet can also be referred to as a nanocrystal (nc).

Figure 8D:
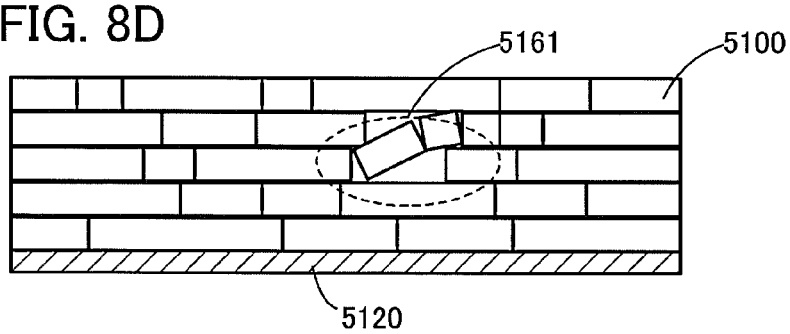

Here, according to the Cs-corrected high-resolution TEM images, the schematic arrangement of pellets 5100 of a CAAC-OS over a substrate 5120 is illustrated by such a structure in which bricks or blocks are stacked (see FIG. 8D). The part in which the pellets are tilted as observed in FIG. 8C corresponds to a region 5161 shown in FIG. 8D.

For example, as shown in FIG. 23A, a Cs-corrected high-resolution TEM image of a plane of the CAAC-OS obtained from a direction substantially perpendicular to the sample surface is observed. FIGS. 23B, 23C, and 23D are enlarged Cs-corrected high-resolution TEM images of regions (1), (2), and (3) in FIG. 23A, respectively. FIGS. 23B, 23C, and 23D indicate that metal atoms are arranged in a triangular, quadrangular, or hexagonal configuration in a pellet. However, there is no regularity of arrangement of metal atoms between different pellets.

Figure 24A:
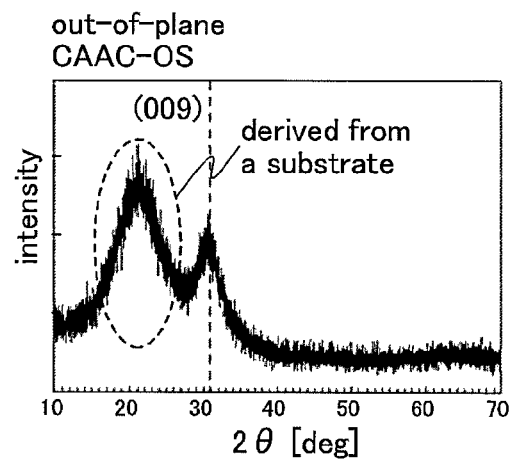
FIGS. 24A to 24C show structural analysis of a CAAC-OS and a single crystal oxide semiconductor by XRD.

For example, when the structure of a CAAC-OS including an $InGaZnO_4$ crystal is analyzed by an out-of-plane method using an X-ray diffraction (XRD) apparatus, a peak appears at a diffraction angle (2θ) of around 31° as shown in FIG. 24A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS including an $InGaZnO_4$ crystal by an out-of-plane method, another peak may appear when 2θ around 360, in addition to the peak at 2θ of around 31°. The peak at 2θ of around 36° indicates that a crystal having no c-axis alignment is included in part of the CAAC-OS. It is preferable that in the CAAC-OS, a peak appear when 2θ is around 31° and that a peak not appear when 2θ is around 36°.

Figure 24B:
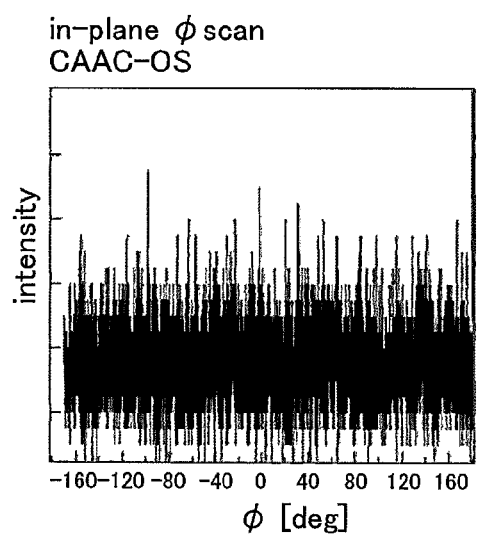
Figure 24C:
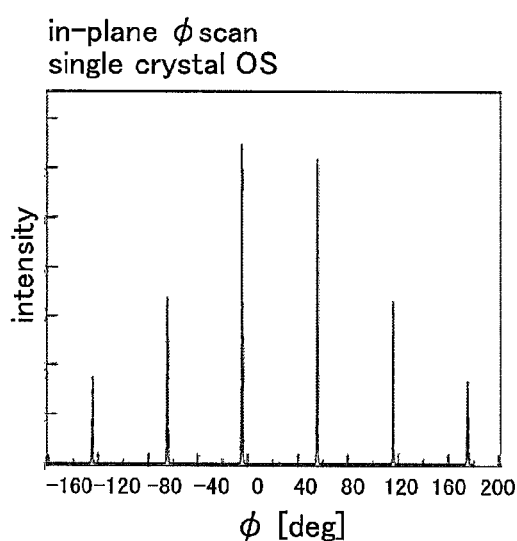

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 24B, a peak is not clearly observed. In contrast, in the case of a single crystal oxide semiconductor of InGaZnO$_4$, when φ scan is performed with 2θ fixed at around 56°, as shown in FIG. 24C, six peaks which are derived from crystal planes equivalent to the (110) plane are observed. Accordingly, the structural analysis using XRD shows that the directions of a-axes and b-axes are different in the CAAC-OS.

Figure 25A:
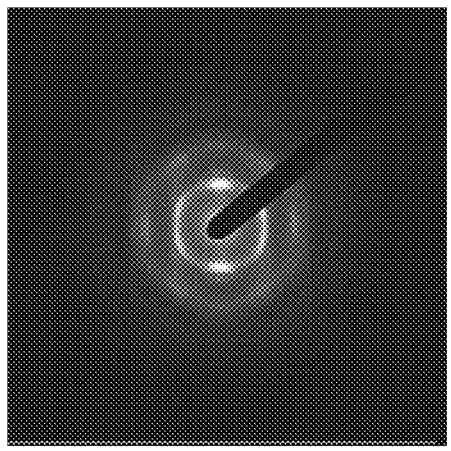
FIGS. 25A and 25B show electron diffraction patterns of a CAAC-OS.
Figure 25B:
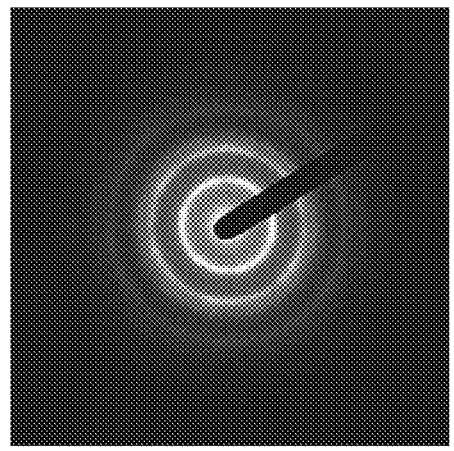

Next, FIG. 25A shows a diffraction pattern (also referred to as a selected-area transmission electron diffraction pattern) obtained in such a manner that an electron beam with a probe diameter of 300 nm is incident on an In—Ga—Zn oxide that is a CAAC-OS in a direction parallel to the sample surface. As shown in FIG. 25A, for example, spots derived from the (009) plane of an InGaZnO$_4$ crystal are observed. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 25B shows a diffraction pattern obtained in such a manner that an electron beam with a probe diameter of 300 nm is incident on the same sample in a direction perpendicular to the sample surface. As shown in FIG. 25B, a ring-like diffraction pattern is observed. Thus, the electron diffraction also indicates that the a-axes and b-axes of the pellets included in the CAAC-OS do not have regular alignment. The first ring in FIG. 25B is considered to be derived from the (010) plane, the (100) plane, and the like of the InGaZnO$_4$ crystal. The second ring in FIG. 25B is considered to be derived from the (110) plane and the like.

Since the c-axes of the pellets (nanocrystals) are aligned in a direction substantially perpendicular to the formation surface or the top surface in the above manner, the CAAC-OS can also be referred to as an oxide semiconductor including c-axis aligned nanocrystals (CANC).

The CAAC-OS is an oxide semiconductor with a low impurity concentration. The impurity means an element other than the main components of the oxide semiconductor, such as hydrogen, carbon, silicon, or a transition metal element. An element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity. Additionally, the impurity contained in the oxide semiconductor might serve as a carrier trap or a carrier generation source.

Moreover, the CAAC-OS is an oxide semiconductor having a low density of defect states. For example, oxygen vacancies in the oxide semiconductor serve as carrier traps or serve as carrier generation sources when hydrogen is captured therein.

In a transistor using the CAAC-OS, change in electrical characteristics due to irradiation with visible light or ultraviolet light is small.

Next, a microcrystalline oxide semiconductor layer is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and a halo pattern appears when the amorphous oxide semiconductor is subjected to nano-beam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

Note that an oxide semiconductor may have a structure having physical properties intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

A difference in effect of electron irradiation between structures of an oxide semiconductor is described below.

An a-like OS (Sample A), an nc-OS (Sample B), and a CAAC-OS (Sample C) are prepared. Each of the samples is an In—Ga—Zn oxide.

First, a high-resolution cross-sectional TEM image of each sample is obtained. The high-resolution cross-sectional TEM images show that all the samples have crystal parts.

Figure 26:
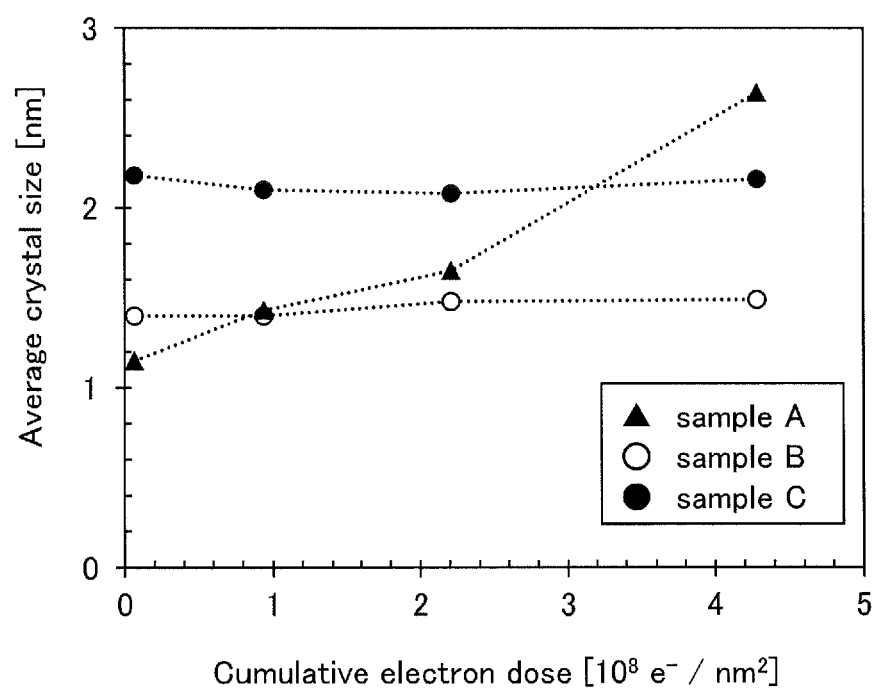
FIG. 26 shows a change of crystal parts of an In—Ga—Zn oxide owing to electron irradiation.

Then, the size of the crystal part of each sample is measured. FIG. 26 shows the change in the average size of crystal parts (at 22 points to 45 points) in each sample. FIG. 26 indicates that the crystal part size in the a-like OS increases with an increase in the cumulative electron dose. Specifically, as shown by sample A, a crystal part of approximately 1.2 nm at the start of TEM observation (the crystal part is also referred to as an initial nucleus) grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$ regardless of the cumulative electron dose. Specifically, as shown by sample B, the average crystal size is approximately 1.4 nm regardless of the observation time by TEM. Furthermore, as shown by sample C, the average crystal size is approximately 2.1 nm regardless of the observation time by TEM.

In this manner, growth of the crystal part occurs due to the crystallization of the a-like OS, which is induced by a slight amount of electron beam employed in the TEM observation. In contrast, in the nc-OS and the CAAC-OS that have good quality, crystallization hardly occurs by a slight amount of electron beam used for TEM observation.

Note that the crystal part size in the a-like OS and the nc-OS can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

Furthermore, the density of an oxide semiconductor varies depending on the structure in some cases. For example, when the composition of an oxide semiconductor is determined, the structure of the oxide semiconductor can be expected by comparing the density of the oxide semiconductor with the density of a single crystal oxide semiconductor having the same composition as the oxide semiconductor. For example, the density of the a-like OS is higher than or equal to 78.6% and lower than 92.3% of the density of the single crystal oxide semiconductor having the same composition. For example, the density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

Specific examples of the above description are given. For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

Note that an oxide semiconductor may be a stacked film including two or more films of an amorphous oxide semiconductor, an a-like OS, a microcrystalline oxide semiconductor, and a CAAC-OS, for example.

An oxide semiconductor having a low impurity concentration and a low density of defect states (a small number of oxygen vacancies) can have low carrier density. Therefore, such an oxide semiconductor is referred to as a highly purified intrinsic or highly purified substantially intrinsic oxide semiconductor. A CAAC-OS and an nc-OS have a low impurity concentration and a low density of defect states as compared to an a-like OS and an amorphous oxide semiconductor. That is, a CAAC-OS and an nc-OS are likely to be highly purified intrinsic or highly purified substantially intrinsic oxide semiconductors. Thus, a transistor including a CAAC-OS or an nc-OS rarely has negative threshold voltage (is rarely normally on). The highly purified intrinsic or highly purified substantially intrinsic oxide semiconductor has few carrier traps. Therefore, a transistor including a CAAC-OS or an nc-OS has small variation in electrical characteristics and high reliability. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics.

<Deposition Model>

Examples of deposition models of a CAAC-OS and an nc-OS are described below.

Figure 27A:
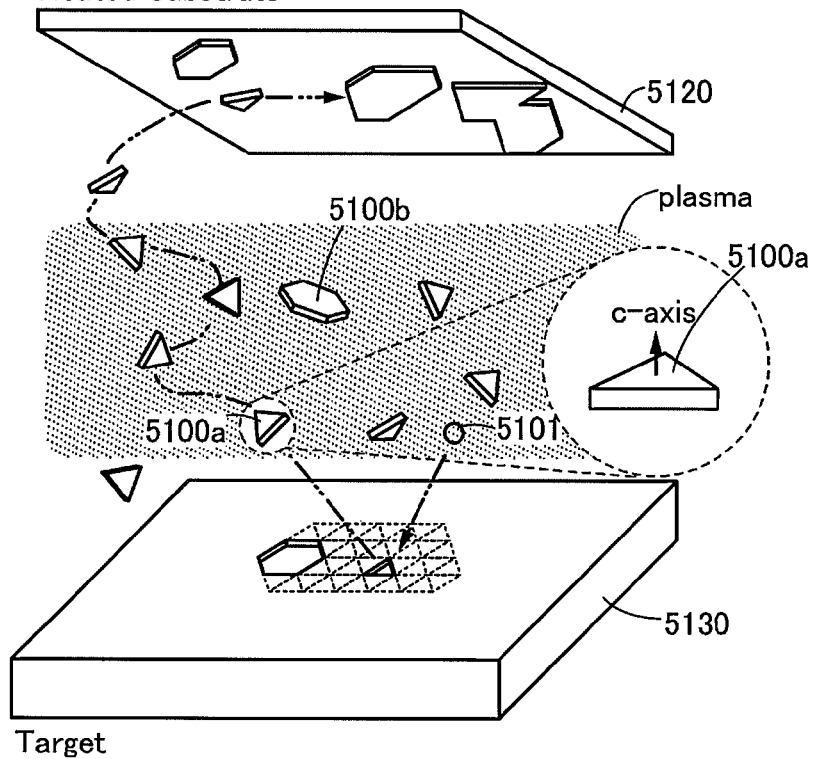
FIGS. 27A and 27B are schematic diagrams illustrating deposition models of a CAAC-OS and an nc-OS.

FIG. 27A is a schematic view of the inside of a deposition chamber where a CAAC-OS is deposited by a sputtering method.

A target 5130 is attached to a backing plate. A plurality of magnets is provided to face the target 5130 with the backing plate positioned therebetween. The plurality of magnets generates a magnetic field. A sputtering method in which the disposition rate is increased by utilizing a magnetic field of magnets is referred to as a magnetron sputtering method.

The target 5130 has a polycrystalline structure in which a cleavage plane exists in at least one crystal grain.

Figure 28A:
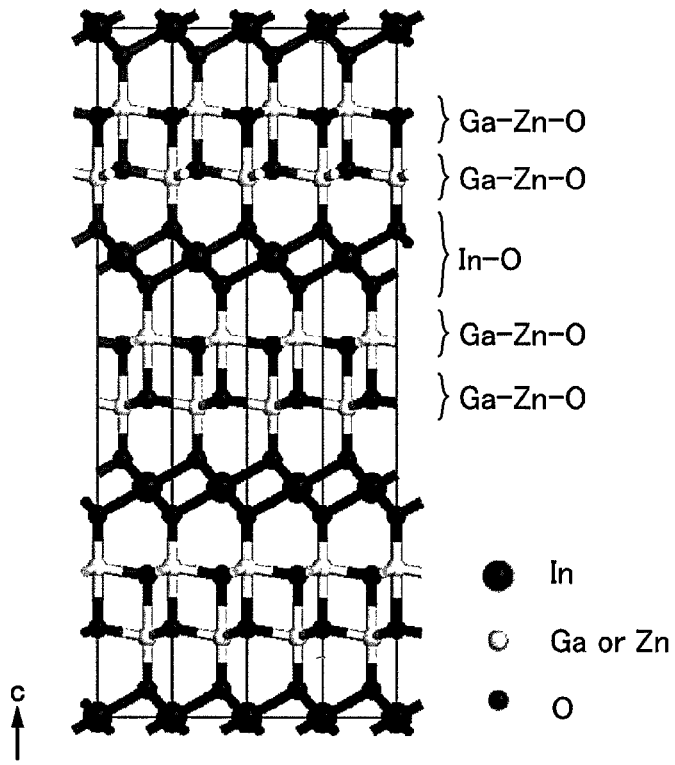
FIGS. 28A to 28C illustrate an $InGaZnO_4$ crystal and a pellet.

A cleavage plane of the target 5130 including an In—Ga—Zn oxide is described as an example. FIG. 28A shows a structure of an InGaZnO$_4$ crystal included in the target 5130. Note that FIG. 28A shows a structure of the case where the InGaZnO$_4$ crystal is observed from a direction parallel to the b-axis when the c-axis is in an upward direction.

FIG. 28A indicates that oxygen atoms in a Ga—Zn—O layer are positioned close to those in an adjacent Ga—Zn—O layer. The oxygen atoms have negative charge, whereby the two Ga—Zn—O layers repel each other. As a result, the InGaZnO$_4$ crystal has a cleavage plane between the two adjacent Ga—Zn—O layers.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation (O$^+$) and an argon cation (Ar$^+$).

The ion 5101 is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 28B:
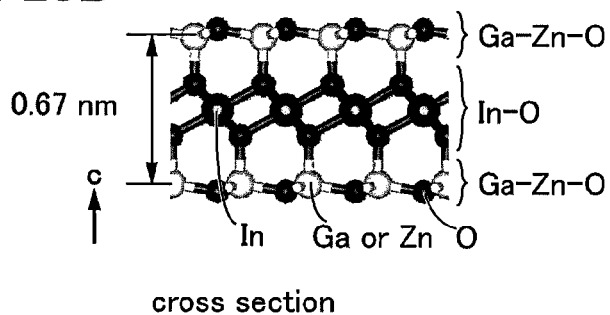
Figure 28C:
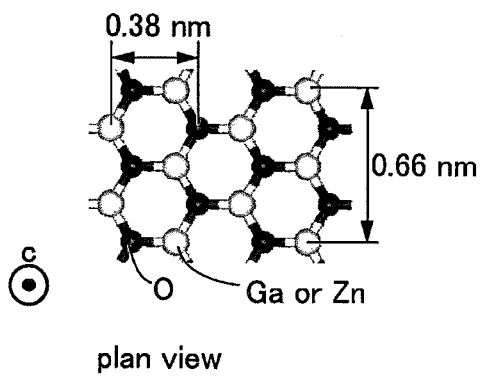

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 26. For example, in the case where the ion 5101 collides with the target 5130 including an In—Ga—Zn oxide, the pellet 5100 that includes three layers of a Ga—Zn—O layer, an In—O layer, and a Ga—Zn—O layer as shown in FIG. 28B is ejected. Note that FIG. 28C shows the structure of the pellet 5100 observed from a direction parallel to the c-axis. Therefore, the pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. The pellet 5100 includes an oxygen atom on its side surface, and the oxygen atom may be negatively charged. In this manner, when the side surfaces are charged with the same polarity, charges repel each other, and accordingly, the pellet 5100 can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 26 corresponds to the amount of growth in plasma. Here, in the case where the temperature of the substrate 5120 is at around room temperature, the pellet 5100 does not grow anymore, thus, an nc-OS is formed (see FIG. 27B). An nc-OS can be deposited when the substrate 5120 has a large size because a temperature at which the deposition of an nc-OS is carried out is approximately room temperature. Note that in order that the pellet 5100 grows in plasma, it is effective to increase deposition power in sputtering. High deposition power can stabilize the structure of the pellet 5100.

Figure 27B:
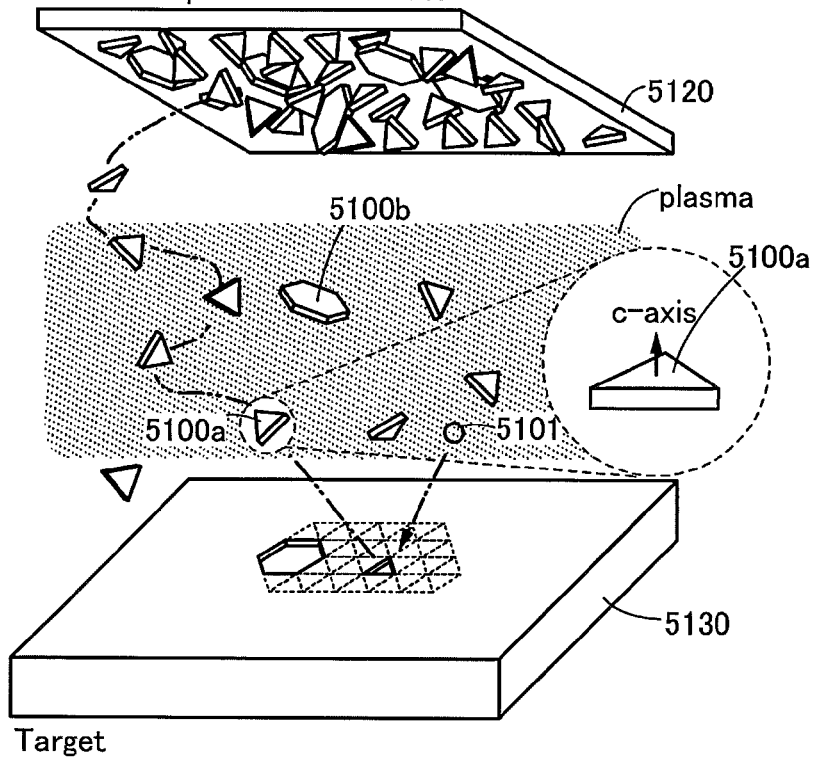

As shown in FIGS. 27A and 27B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to increase a force applied to the pellet 5100, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 27A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist therebetween. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target is sputtered with an ion, in addition to the pellets, zinc oxide or the like may be ejected. The zinc oxide is lighter than the pellet and thus reaches the top surface of the substrate 5120 before the pellet. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 29A to 29D are cross-sectional schematic views.

Figure 29A:
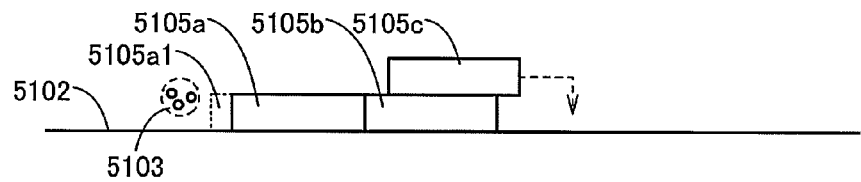
FIGS. 29A to 29D are schematic diagrams illustrating a deposition model of a CAAC-OS.

As illustrated in FIG. 29A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 ejected from the target together with the zinc oxide is crystallized by heating of the substrate 5120 to form a region 5105a1 on another side surface of the pellet 5105a. Note that the plurality of particles 5103 may contain oxygen, zinc, indium, gallium, or the like.

Figure 29B:
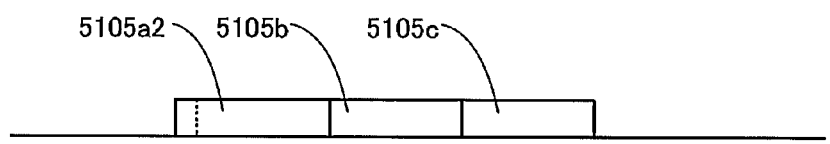

Then, as illustrated in FIG. 29B, the region 5105a1 grows to part of the pellet 5105a to form a pellet 5105a2. In addition, a side surface of the pellet 5105c is in contact with another side surface of the pellet 5105b.

Figure 29C:
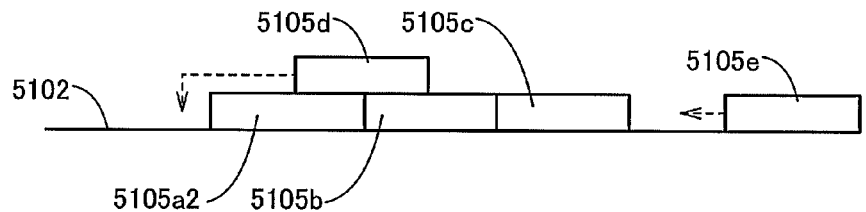

Next, as illustrated in FIG. 29C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 29D:
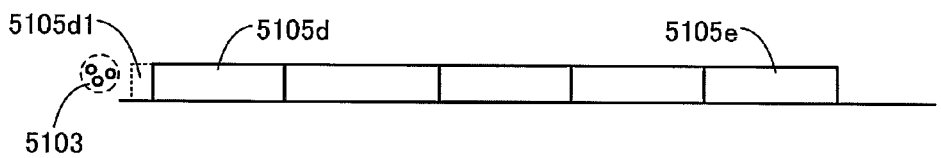

Then, as illustrated in FIG. 29D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 ejected from the target together with the zinc oxide is crystallized by heating of the substrate 5120 to form a region 5105d on another side surface of the pellet 5105d.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 26 corresponds to the amount of growth after deposition.

When spaces between pellets 5100 are extremely small, the pellets may form a large pellet. The large pellet has a single crystal structure. For example, the size of the large pellet may be greater than or equal to 10 nm and less than or equal to 200 nm, greater than or equal to 15 nm and less than or equal to 100 nm, or greater than or equal to 20 nm and less than or equal to 50 nm, when seen from the above. Therefore, when a channel formation region of a transistor is smaller than the large pellet, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure, which is different from film deposition by epitaxial growth. For example, even when the top surface (formation surface) of the substrate 5120 has an amorphous structure (e.g. the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between the pellets 5100 in the CAAC-OS in some cases. Note that owing to intermolecular force, the pellets 5100 are arranged so that a gap between the pellets is as small as possible even on the unevenness surface. Therefore, even when the formation surface has unevenness, a CAAC-OS with high crystallinity can be obtained.

As a result, laser crystallization is not needed for formation of a CAAC-OS, and a uniform film can be formed even over a large-sized glass substrate or the like.

Since a CAAC-OS is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a formation surface with an amorphous structure.

Figure 9A:
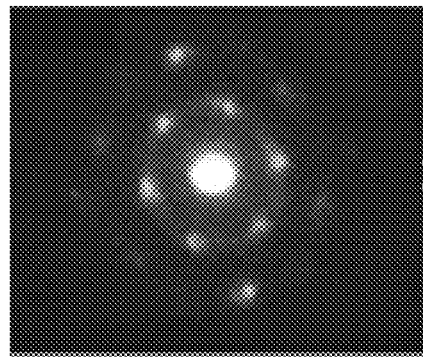
FIGS. 9A and 9B show nanobeam electron diffraction patterns of oxide semiconductor films and FIGS. 9C and 9D illustrate an example of a transmission electron diffraction measurement apparatus.
Figure 9B:
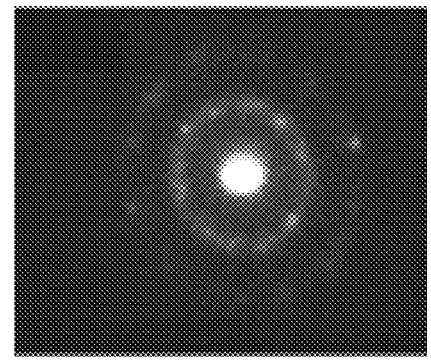
Figure 9C:
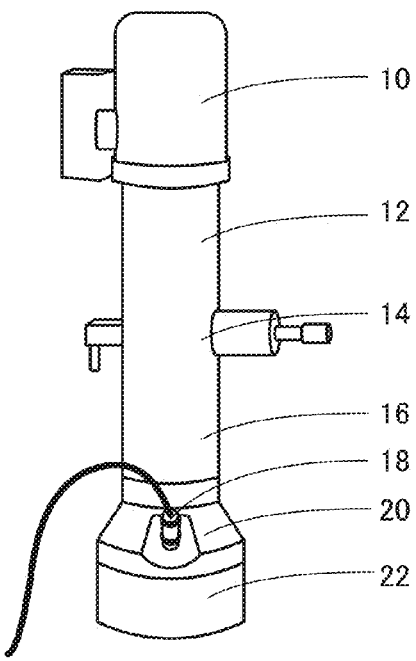

FIG. 9C illustrates a transmission electron diffraction measurement apparatus which includes an electron gun chamber 10, an optical system 12 below the electron gun chamber 10, a sample chamber 14 below the optical system 12, an optical system 16 below the sample chamber 14, an observation chamber 20 below the optical system 16, a camera 18 installed in the observation chamber 20, and a film chamber 22 below the observation chamber 20. The camera 18 is provided to face toward the inside of the observation chamber 20. Note that the film chamber 22 is not necessarily provided.

Figure 9D:
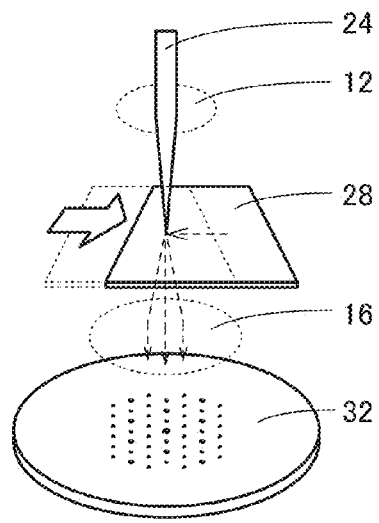

FIG. 9D illustrates an internal structure of the transmission electron diffraction measurement apparatus illustrated in FIG. 9C. In the transmission electron diffraction measurement apparatus, a substance 28 which is positioned in the sample chamber 14 is irradiated with electrons emitted from an electron gun installed in the electron gun chamber 10 through the optical system 12. Electrons passing through the substance 28 enter a fluorescent plate 32 provided in the observation chamber 20 through the optical system 16. On the fluorescent plate 32, a pattern corresponding to the intensity of entered electron appears, which allows measurement of a transmission electron diffraction pattern.

The camera 18 is installed so as to face the fluorescent plate 32 and can take a picture of a pattern appearing in the fluorescent plate 32. An angle which is formed by a line passing through the center of a lens of the camera 18 and the top surface of the fluorescent plate 32, and a line which passes through the center of the lens of the camera 18 and is perpendicular to a floor is, for example, greater than or equal to 15° and less than or equal to 80°, greater than or equal to 30° and less than or equal to 75°, or greater than or equal to 45° and less than or equal to 70°. As the angle is reduced, distortion of the transmission electron diffraction pattern taken by the camera 18 becomes larger. Note that if the angle is obtained in advance, the distortion of an obtained transmission electron diffraction pattern can be corrected. Note that the film chamber 22 may be provided with the camera 18. For example, the camera 18 may be set in the film chamber 22 so as to be opposite to the incident direction of electrons 24 enter. In this case, a transmission electron diffraction pattern with less distortion can be taken from the rear surface of the fluorescent plate 32.

A holder for fixing the substance 28 that is a sample is provided in the sample chamber 14. The holder transmits electrons passing through the substance 28. The holder may have, for example, a function of moving the substance 28 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 28.

Then, a method for measuring a transmission electron diffraction pattern of a substance by the transmission electron diffraction measurement apparatus described above is described.

For example, changes in the structure of a substance can be observed by changing (scanning) the irradiation position of the electrons 24 that are a nanobeam in the substance, as illustrated in FIG. 9D. At this time, when the substance 28 is a CAAC-OS film, a diffraction pattern shown in FIG. 9A can be observed. When the substance 28 is an nc-OS film, a diffraction pattern shown in FIG. 9B can be observed.

Even when the substance 28 is a CAAC-OS film, a diffraction pattern similar to that of an nc-OS film or the like is partly observed in some cases. Therefore, whether or not the CAAC-OS film is favorable can be determined by the proportion of a region where a diffraction pattern of the CAAC-OS film is observed in a predetermined area (also referred to as proportion of CAAC). For example, in the case of a favorable CAAC-OS film, the proportion of CAAC is 60% or higher, preferably 80% or higher, further preferably 90% or higher, still preferably 95% or higher. Note that a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nano-electron beam with a probe diameter of 1 nm was used. The above measurement was performed on six samples. The proportion of CAAC was calculated using the average value of the six samples.

Figure 10A:
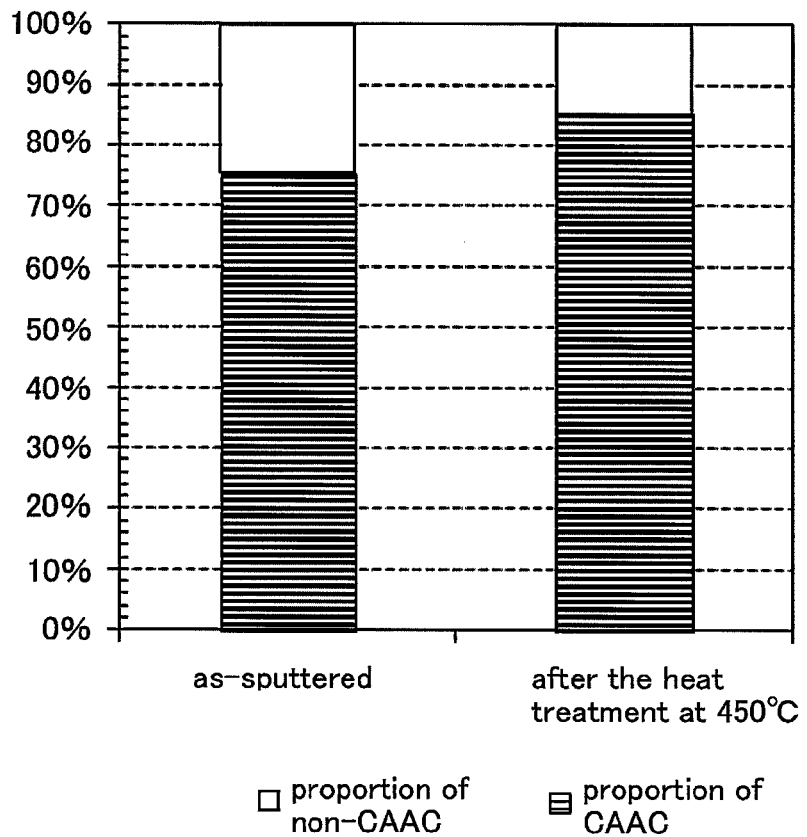
FIG. 10A shows an example of structural analysis by transmission electron diffraction measurement and FIGS. 10B and 10C show plan-view TEM images.

FIG. 10A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 10B:
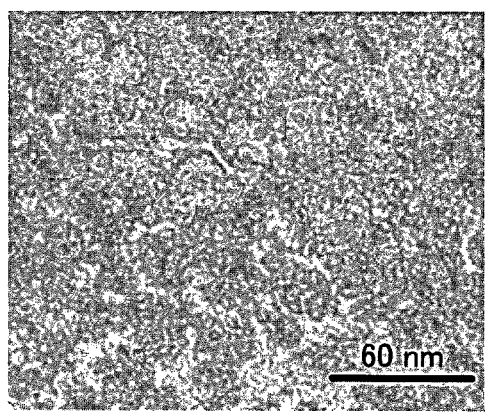
Figure 10C:
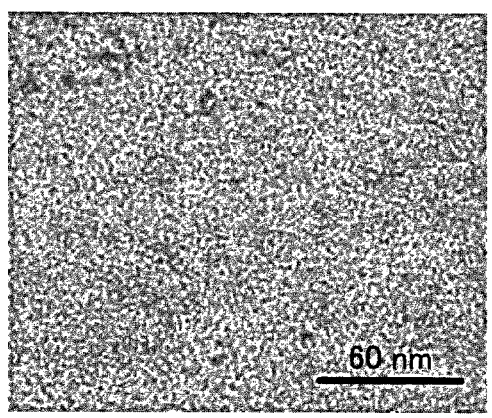

FIGS. 10B and 10C are planar TEM images of the CAAC-OS film obtained just after the deposition and the CAAC-OS film subjected to the heat treatment at 450° C., respectively. Comparison between FIGS. 10B and 10C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor layer having a plurality of structures can be analyzed in some cases.

The transistor of one embodiment of the present invention can be formed using an oxide semiconductor layer having any of the above structures.

The structure and method described in this embodiment can be implemented by being combined as appropriate with any of the other structures and methods described in the other embodiments.

(Embodiment 3)

In this embodiment, a semiconductor device which includes a transistor having a different structure from that of Embodiment 1 is described with reference to FIGS. 7A to 7C. The transistor described in this embodiment is different from those in Embodiment 1 in that a multilayer film including a plurality of oxide semiconductor layers is provided. Here, details of the transistor are described using the semiconductor device illustrated in FIGS. 2A and 2B in Embodiment 1.

Figure 7A:
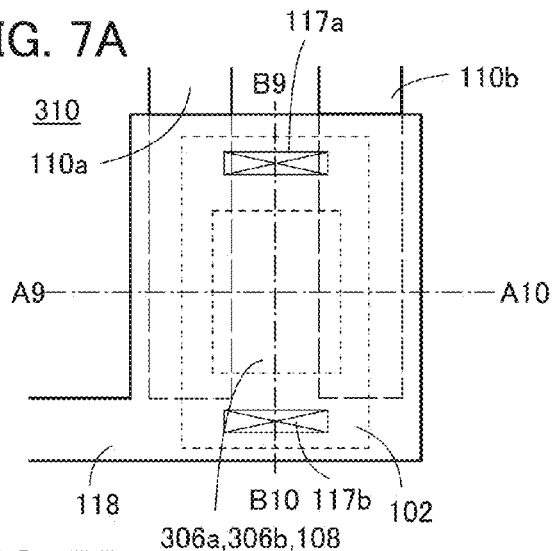
FIGS. 7A to 7C are a plan view, a cross-sectional view, and a band diagram of a transistor of one embodiment of the present invention.
Figure 7B:
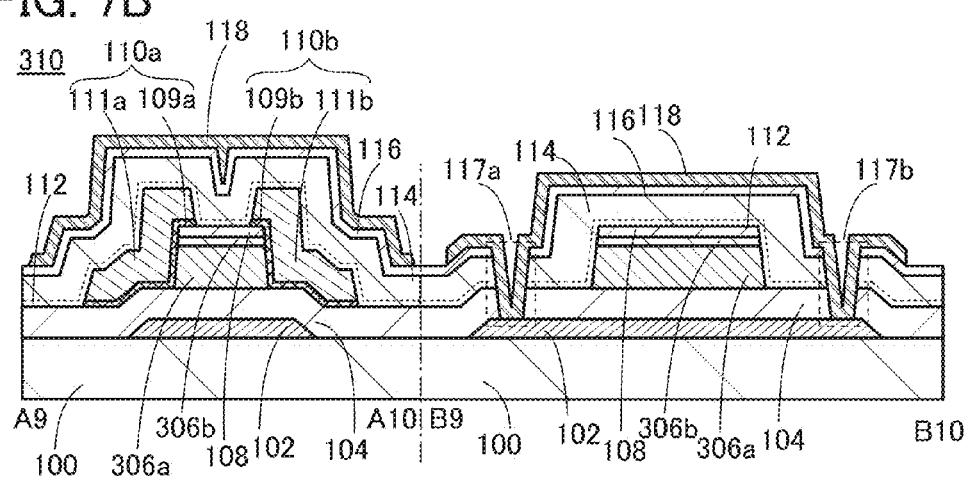

FIGS. 7A and 7B are a plan view and a cross-sectional view of a transistor 310 included in the semiconductor device of this embodiment. FIG. 7A is a plan view of the transistor 310, and FIG. 7B is cross-sectional views taken along dashed dotted lines A9-A10 and B9-B10 in FIG. 7A. Note that the substrate 100 and some components (e.g., a gate insulating layer) of the transistor 310 are not illustrated in FIG. 7A for clarity. FIG. 7C shows a band diagram of a stacked-layer structure included in the transistor 310.

Figure 7C:
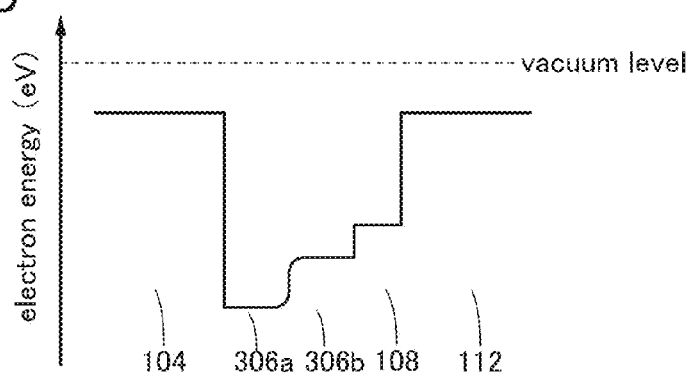

The transistor 310 included in the semiconductor device illustrated in FIGS. 7A to 7C is different from the transistor 210 in FIGS. 2A and 2B in that the oxide semiconductor layer provided between the gate insulating layer 104 and the metal oxide layer 108 has a stacked-layer structure including an oxide semiconductor layer 306a and an oxide semiconductor layer 306b. The other components are similar to those in FIGS. 2A and 2B; thus, the above description can be referred to.

The oxide semiconductor layer 306a and the oxide semiconductor layer 306b in the transistor 310 are each formed using a metal oxide containing at least In or Zn; as a typical example, an In—Ga oxide, an In—Zn oxide, or an In-M-Zn oxide (M is Ti, Ga, Y, Zr, La, Ce, Nd, or Hf) can be used. The energy of the bottom of the conduction band of the oxide semiconductor layer 306b is closer to the vacuum level than that of the oxide semiconductor layer 306a; typically, an energy difference between the bottom of the conduction band of the oxide semiconductor layer 306b and the bottom of the conduction band of the oxide semiconductor layer 306a is greater than or equal to 0.05 eV, greater than or equal to 0.07 eV, greater than or equal to 0.1 eV, greater than or equal to 0.15 eV, or greater than or equal to 0.5 eV, and less than or equal to 2 eV or less than or equal to 1 eV. That is, the difference between the electron affinity of the oxide semiconductor layer 306b and the electron affinity of the oxide semiconductor layer 306a is greater than or equal to 0.05 eV, greater than or equal to 0.07 eV, greater than or equal to 0.1 eV, greater than or equal to 0.15 eV, or greater than or equal to 0.5 eV and also less than or equal to 2 eV, or less than or equal to 1 eV.

In such a structure, the oxide semiconductor layer 306a serves as a main path of current and functions as a channel region when voltage is applied to the transistor 310. In addition, since the oxide semiconductor layer 306b contains one or more kinds of metal elements that are contained in the oxide semiconductor layer 306a where the channel is formed, interface scattering is less likely to occur at the interface between the oxide semiconductor layer 306a and the oxide semiconductor layer 306b. Thus, the transistor can have high field-effect mobility because the movement of carriers is not hindered at the interface.

When the oxide semiconductor layer 306b is formed of an In-M-Zn oxide in which the atomic ratio of the element M (M is Ti, Ga, Y, Zr, La, Ce, Nd, or Hf) is higher than that of In, the energy gap of the oxide semiconductor layer 306b can be large and the electron affinity can be small. Therefore, a difference in electron affinity between the oxide semiconductor layer 306a and the oxide semiconductor layer 306b may be controlled by the proportion of the element M. Furthermore, oxygen vacancy is less likely to be generated in the oxide semiconductor layer in which the atomic ratio of Ti, Ga, Y, Zr, La, Ce, Nd, or Hf is higher than that of In because Ti, Ga, Y, Zr, La, Ce, Nd, and Hf each are a metal element that is strongly bonded to oxygen.

In the case where the oxide semiconductor layer 306b is formed of an In-M-Zn oxide, when Zn and O are eliminated from consideration, the atomic percentage of In and the atomic percentage of M are preferably less than 50 atomic % and greater than or equal to 50 atomic %, respectively, more preferably less than 25 atomic % and greater than or equal to 75 atomic %, respectively.

Furthermore, in the case where each of the oxide semiconductor layer 306a and the oxide semiconductor layer 306b is formed of In-M-Zn oxide (M is Ti, Ga, Y, Zr, La, Ce, Nd, or Hf), the atomic percent of M (M is Ti, Ga, Y, Zr, La, Ce, Nd, or Hf) in the oxide semiconductor layer 306b is higher than that in the oxide semiconductor layer 306a. Typically, the atomic percentage of M in the oxide semiconductor layer 306b is 1.5 or more times, twice or more, or three or more times as high as that in the oxide semiconductor layer 306a.

Furthermore, in the case where each of the oxide semiconductor layer 306a and the oxide semiconductor layer 306b is formed of an In-M-Zn oxide (M is Ti, Ga, Y, Zr, La, Ce, Nd, or Hf), when the oxide semiconductor layer 306a has an atomic ratio of In:M:Zn=$x_1$:$y_1$:$z_1$ and the oxide semiconductor layer 306b has an atomic ratio of In:M:Zn=$x_2$:$y_2$:$z_2$, $y_2/x_2$ is higher than $y_1/x_1$. It is preferable that $y_2/x_2$ be 1.5 or more times as high as $y_1/x_1$. It is further preferable that $y_2/x_2$ be twice or more as high as $y_1/x_1$. It is still further preferable that $y_2/x_2$ be three or more times as high as $y_1/x_1$. In this case, it is preferable that in the oxide semiconductor layer, $y_1$ be higher than or equal to $x_1$ because a transistor including the oxide semiconductor layer can have stable electric characteristics. However, when $y_1$ is higher than or equal to three times $x_1$, the field-effect mobility of the transistor including the oxide semiconductor layer is reduced. Thus, it is preferable that $y_1$ be lower than three times $x_1$. The composition of the oxide semiconductor layer can be measured by ICP-MS. For example, a metal oxide film that is obtained under conditions where a target with $In_2O_3:Ga_2O_3:ZnO=1:1:1$ (In:Ga:Zn=1:1:0.5) is used and the flow ratio of an argon gas in a sputtering method is 40 sccm is $InGa_{0.95}Zn o_{0.41}O_{3.33}$. Furthermore, the composition can be quantified using a Rutherford backscattering spectrometry (RBS) instead of ICP-MS.

In the case where the oxide semiconductor layer 306a is formed of an In-M-Zn oxide (M is Ti, Ga, Y, Zr, La, Ce, Nd, or Hf) and a target having the atomic ratio of metal elements of In:M:Zn=$x_1:y_1:z_1$ is used for depositing the oxide semiconductor layer 306a, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, CAAC-OS film is easily formed as the oxide semiconductor layer 306a. Typical examples of the atomic ratio of the metal elements of the target include In:M:Zn=1:1:1 and In:M:Zn=3:1:2.

Note that in the case where a target with In:M:Zn=1:1:$z_{10}$ is used for depositing the oxide semiconductor layer 306a, $z_{10}$ is preferably greater than or equal to 1 and less than or equal to 1.4, further preferably greater than or equal to 1 and less than or equal to 1.3. This is because, for example, when In:M:Zn is 1:1:1.5, the target becomes opaque, and sputtering deposition with a DC power source or an AC power source might become difficult. Such a target is applicable to deposition using an RF power source; however, in consideration of productivity of the semiconductor device, it is preferable to use a target which is applicable to a sputtering deposition using a DC power source or an AC power source.

In the case where the oxide semiconductor layer 306b is formed of an In-M-Zn oxide (M is Ti, Ga, Y, Zr, La, Ce, Nd, or Hf) and a target having an atomic ratio of metal elements of In:M:Zn=$x_2:y_2:z_2$ is used for depositing the oxide semiconductor layer 306b, $x_2/y_2$ is preferably less than $x_1/y_1$, and $z_2/y_2$ is preferably greater than or equal to ⅓ and less than or equal to 6, further preferably greater than or equal to 1 and less than or equal to 6. When the atomic ratio of M with respect to indium is high, the energy gap of the oxide semiconductor layer 306b can be large and the electron affinity thereof can be small; therefore, $y_2/x_2$ is preferably higher than or equal to 3 or higher than or equal to 4. Typical examples of the atomic ratio of the metal elements of the target include In:M:Zn=1:3:2, In:M:Zn=1:3:4, In:M:Zn=1:3:5, In:M:Zn=1:3:6. In:M:Zn=1:4:2, In:M:Zn=1:4:4, and In:M:Zn=1:4:5.

For example, in the case where a target with In:M:Zn=1:3:$z_{20}$ is used as the target for depositing the oxide semiconductor layer 306b, $z_{20}$ is preferably greater than or equal to 2 and less than or equal to 5. Alternatively, in the case where a target having an atomic ratio of In:M:Zn=1:4:$z_{30}$ is used for depositing the oxide semiconductor layer 306b, $z_{30}$ is preferably greater than or equal to 2 and less than or equal to 5.

Note that in each of the oxide semiconductor layer 306a and the oxide semiconductor layer 306b, the proportions of atoms in the atomic ratio varies within a range of ±40% as an error.

It is preferable that the oxide semiconductor layer 306a and the oxide semiconductor layer 306b have crystal parts, further preferably, have the same crystal structures. This is because when the oxide semiconductor layer 306a and the oxide semiconductor layer 306b have different crystal structures, the interface between the layers becomes a hetero crystalline structure part and a defect might be generated therein. The hetero crystalline structure part can be regarded as, for example, a grain boundary.

As the oxide semiconductor layer 306a, a CAAC-OS film that is an oxide semiconductor layer having a low impurity concentration and low density of defect states (a small amount of oxygen vacancy) is preferably used. The state in which impurity concentration is low and density of defect states is low is referred to as highly purified intrinsic or highly purified substantially intrinsic. A highly purified intrinsic or highly purified substantially intrinsic oxide semiconductor layer has few carrier generation sources, and thus has a low carrier density. Thus, a transistor using the oxide semiconductor layer as a channel rarely has electrical characteristics in which a threshold voltage is negative (also referred to as normally-on). A highly purified intrinsic or highly purified substantially intrinsic oxide semiconductor layer has few carrier traps. Thus, the transistor including the oxide semiconductor layer in the channel has a small variation in electrical characteristics and high reliability. With the use of the CAAC-OS film in a transistor, variation in the electrical characteristics of the transistor due to irradiation with visible light or ultraviolet light is small.

Note that it is preferable that a target with In:M:Zn=1:1:1.2 be used for depositing the oxide semiconductor layer 306a because a spinel structure is less likely to be formed in the deposited oxide semiconductor layer 306a, so that the proportion of CAAC can be increased.

Furthermore, in the case where the oxide semiconductor layer 306a is a CAAC-OS film and the oxide semiconductor layer 306b in contact with the oxide semiconductor layer 306a has a different crystal structure, a grain boundary is formed at the interface between the two layers and a defect might be formed in the film; therefore, it is preferable to use a CAAC-OS film also for the oxide semiconductor layer 306b.

Meanwhile, in the case where, for example, an In—Ga oxide layer is formed as the metal oxide layer 108, which functions as a barrier layer for preventing mixing of impurities to the oxide semiconductor layers 306a and 306b, the In—Ga oxide layer can have an amorphous structure, a crystalline structure similar to that of an nc-OS film, or a monoclinic structure; however, it is difficult for the In—Ga oxide layer to have a crystalline structure similar to that of a CAAC-OS film. Therefore, when the oxide semiconductor layer 306a where the channel is formed is in contact with the metal oxide layer 108, a hetero structure might be formed at the interface between the two layers. In the transistor 310 described in this embodiment, since the oxide semiconductor layer 306b is provided between the metal oxide layer 108 and the oxide semiconductor layer 306a where the channel is formed, the region in contact with the hetero structure can be apart from the oxide semiconductor layer 306a where carriers flow. However, the oxide semiconductor layer 306b may have a spinel structure therein. This is because the metal oxide layer 108 can prevent the constituent elements of the pair of electrode layers 110a and 110b from diffusing into the oxide semiconductor layer 306b; therefore, even when the oxide semiconductor layer 306b has a spinel structure, diffusion of a metal element such as copper which is derived from the spinel structure, to the channel can be prevented.

FIG. 7C is an example of a band structure in the thickness direction of the stacked-layer structure including the gate insulating layer 104, the oxide semiconductor layer 306a, the oxide semiconductor layer 306b, the metal oxide layer 108, and the oxide insulating layer 112. For easy understanding, the energy (Ec) of the bottom of the conduction band of each of the gate insulating layer 104, the oxide semiconductor layer 306a, the oxide semiconductor layer 306b, the metal oxide layer 108, and the oxide insulating layer 112 is shown in the band structure.

As shown in FIG. 7C, there is no energy barrier between the oxide semiconductor layers 306a and 306b, and the energy of the bottom of the conduction band is changed smoothly (such a state is also referred to as a continuous junction). In other words, the energy of the bottom of the conduction band is continuously changed. To obtain such a band structure, it is preferable that an impurity which forms a defect level such as a trap center or a recombination center does not exist at the interface between the oxide semiconductor layer 306a and the oxide semiconductor layer 306b. This is because if an impurity exists between the stacked oxide semiconductor layers, a continuity of the energy band is damaged, and the carrier is captured or recombined at the interface and then disappears.

To form a continuous junction between the oxide semiconductor layers 306a and 306b, it is necessary to form films continuously without being exposed to air, with use of a multi-chamber deposition apparatus (sputtering apparatus) including a load lock chamber.

With the structure of FIG. 7C, the oxide semiconductor layer 306a serves as a well, and a channel region is formed in the oxide semiconductor layer 306a in the transistor with the stacked layer structure.

Although trap levels due to impurities or defects might be formed in the vicinity of the interface between the metal oxide layer 108 and the oxide insulating layer 112 as shown in FIG. 8A, the oxide semiconductor layers 306a and 306b can be distanced from the trap levels owing to the existence of the metal oxide layer 108. Furthermore, even when defects due to the hetero crystalline structure exist between the metal oxide layer 108 and the oxide semiconductor layer 306b, the oxide semiconductor layer 306b can reduce the influence of the defects upon the oxide semiconductor layer 306a. Here, in the case where an energy difference between the bottom of the conduction band of the oxide semiconductor layer 306a and that of the oxide semiconductor layer 306b is small, electrons in the oxide semiconductor layer 306a might reach the trap level by passing through the energy difference. Since the electron is trapped at the trap level, a negative fixed charge is generated, causing the threshold voltage of the transistor to be shifted in the positive direction. Thus, it is preferable that the energy difference between the bottom of the conduction band of the oxide semiconductor layer 306a and that of the oxide semiconductor layer 306b be 0.1 eV or more, preferably 0.15 eV or more because a change in the threshold voltage of the transistor is reduced and stable electrical characteristics are obtained.

It is preferable that the difference in energy of the bottom of the conduction band between the oxide semiconductor layer 306a and the oxide semiconductor layer 306b be greater than or equal to 0.1 eV, further preferably greater than or equal to 0.15 eV because the trap level existing in the vicinity of the interface between the metal oxide layer 108 and the oxide insulating layer 112 can be prevented from affecting the oxide semiconductor layer 306b and the oxide semiconductor layer 306a in contact with the oxide semiconductor layer 306b.

Note that the structure of the transistor having the stacked-layer structure that is described in this embodiment is not limited to that of FIGS. 7A to 7C. For example, like in a transistor 300 illustrated in FIG. 21A, the oxide semiconductor layer provided between the gate insulating layer 104 and the metal oxide layer 108 may have a stacked-layer structure including an oxide semiconductor layer 316a and an oxide semiconductor layer 316b in the structure of the transistor 200 described in Embodiment 1. Note that FIG. 21A illustrates a cross section of the transistor 300 in the channel length direction and a cross section of a connection portion between an electrode layer 202b which is formed in the same layer as a gate electrode layer 202a and an electrode layer 110c which is formed in the same layer as the pair of electrode layers 110a and 110b.

Figure 21A:
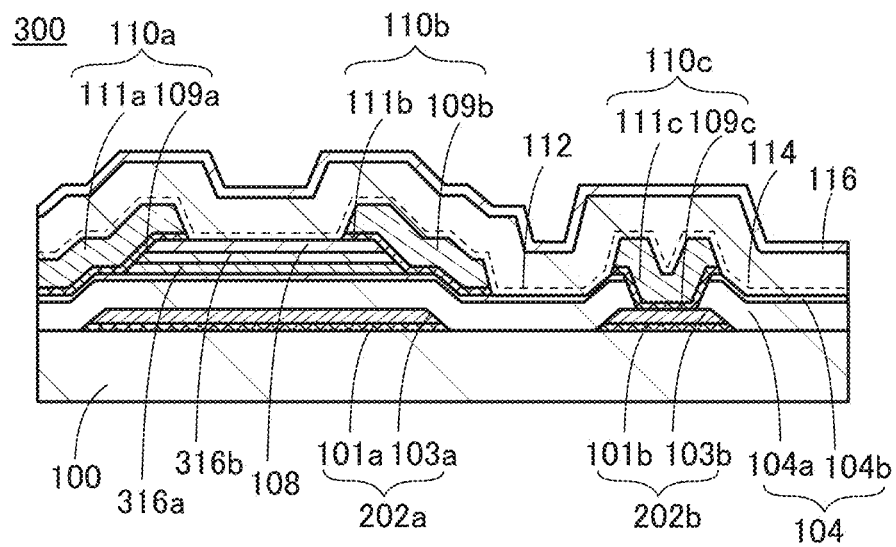
FIGS. 21A and 21B are a cross-sectional view and a band diagram of a transistor of one embodiment of the present invention.

In the transistor 300 in FIG. 21A, the gate electrode layer 202a and the electrode layer 202b that is formed in the same layer as the gate electrode layer 202a have a stacked-layer structure including first conductive layers 101a and 101b and a stacked-layer structure including second conductive layers 103a and 103b, respectively. A material similar to that of the first conductive layer 109a and 109b of the pair of electrode layers 110a and 110b can be used for the first conductive layers 101a and 101b. A material similar to that of the second conductive layers 111a and 111b of the pair of electrode layers 110a and 110b can be used for the second conductive layers 103a and 103b.

When the gate electrode layer 202a and the electrode layer 202b are formed to contain a low-resistance material such as copper, aluminum, gold, or silver, it is possible to manufacture a semiconductor device with reduced wiring delay even in the case of using a large-sized substrate as the substrate 100. Note that in the case where electrode layers containing any of the above low-resistance materials are formed as the gate electrode layer 202a and the electrode layer 202b, it is preferable that the gate insulating layer 104 have a stacked-layer structure including a nitride insulating layer 104a and an oxide insulating layer 104b and that the oxide insulating layer 104b be in contact with the oxide semiconductor layer 316a. The nitride insulating layer 104a included in the gate insulating layer 104 can be used as a barrier layer for preventing diffusion of the low-resistance material. The oxide insulating layer 104b prevents diffusion of nitrogen from the nitride insulating layer 104a to the oxide semiconductor layers 316a and 316b and functions as a supply source of oxygen for the oxide semiconductor layers 316a and 316b.

Figure 21B:
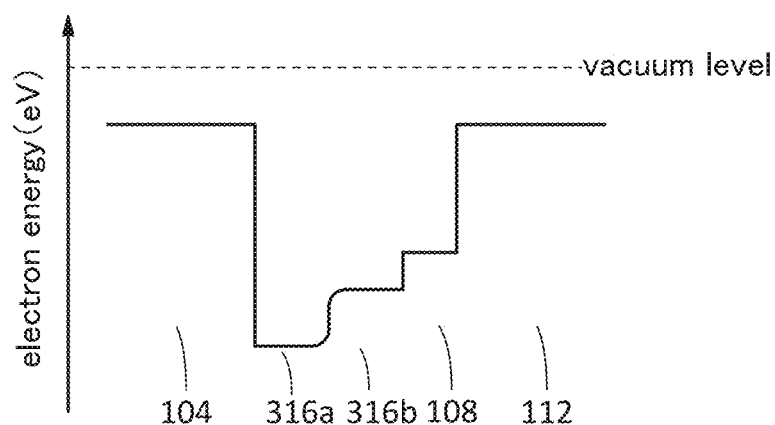

The structure of the oxide semiconductor layer 316a included in the transistor 300 can be the same as that of the oxide semiconductor layer 306a of the transistor 310; therefore, the above description can be referred to. The structure of the oxide semiconductor layer 316b can be the same as that of the oxide semiconductor layer 306b of the transistor 310; therefore, the above description can be referred to. Therefore, in the band structure in the thickness direction of the stacked-layer structure in the transistor 300, which includes the gate insulating layer 104, the oxide semiconductor layer 316a, the oxide semiconductor layer 316b, the metal oxide layer 108, and the oxide insulating layer 112, as shown in FIG. 21B, the oxide semiconductor layer 316a serves as a well; thus, the channel region is formed in the oxide semiconductor layer 316a in the transistor including the stacked-layer structure.

Note that the connection between the electrode layer 202b and the electrode layer 110c in the transistor 300 is formed in such a manner that a metal oxide film and an oxide semiconductor film are processed into an island shape, and an opening portion is formed in the gate insulating layer 104 to expose the electrode layer 202b. After that, a conductive film to be the pair of electrode layers 110a and 110b and the electrode layer 110c is formed and processed, whereby the electrode layer 202b and the electrode layer 110c can be connected to each other.

The structure described in this embodiment makes it possible to obtain a highly reliable transistor in which the impurity concentration of an oxide semiconductor layer including the channel formation region is reduced. Furthermore, the channel is less likely to be influenced by the interface state in the structure, so that a reduction in on-state current due to the interface state is less likely to occur. Accordingly, the transistor can have high on-state current and small S-value. In addition, a change in electrical characteristics due to the interface state is less likely to occur in the transistor, whereby the transistor has high reliability.

Note that the structure and method described in this embodiment can be implemented by being combined as appropriate with any of the other structures methods described in the other embodiments.

(Embodiment 4)

In this embodiment, a structural example of a display panel as a semiconductor device of one embodiment of the present invention is described.

<Display Panel>

A display panel including a semiconductor device such as any of the above-described transistors is described below.

Figure 18A:
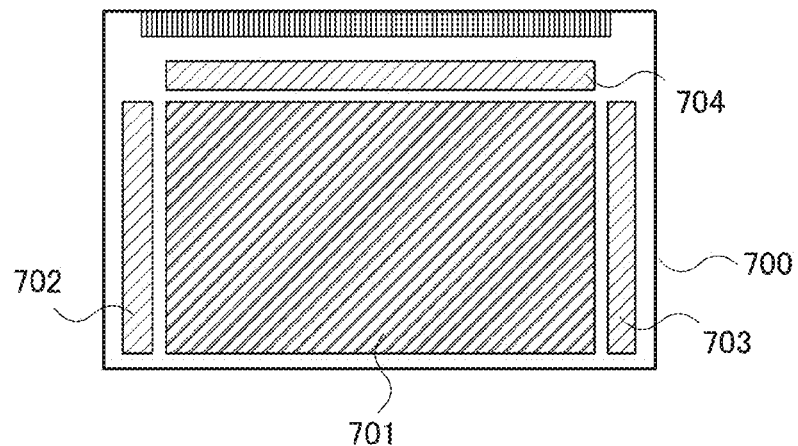
FIGS. 18A to 18C are a block diagram and circuit diagrams illustrating a configuration of a display device of one embodiment of the present invention.
Figure 18B:
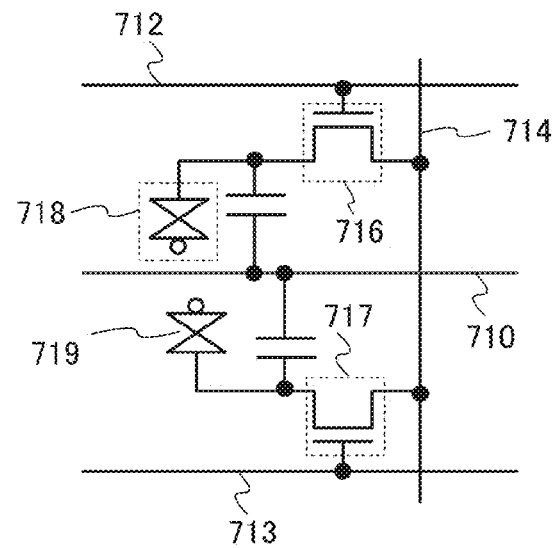
Figure 18C:
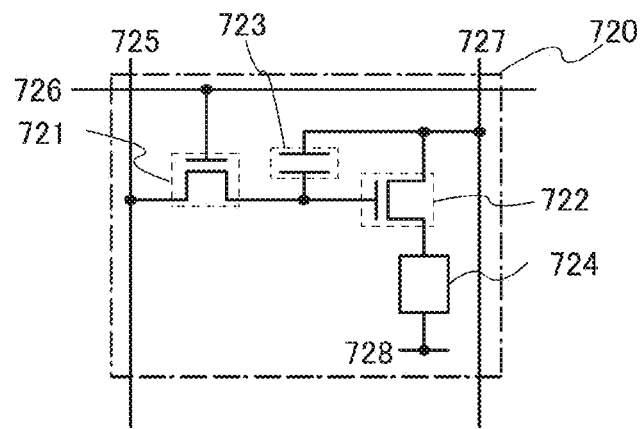

FIG. 18A is a top view of the display panel of one embodiment of the present invention. FIG. 18B is a circuit diagram illustrating a pixel circuit that can be used in the case where a liquid crystal element is used in a pixel in the display panel of one embodiment of the present invention. FIG. 18C is a circuit diagram illustrating a pixel circuit that can be used in the case where an organic EL element is used in a pixel in the display panel of one embodiment of the present invention.

As the transistor to be disposed in the pixel portion, the transistor described in Embodiment 1 or 3 can be used. Further, the transistor can easily be an n-channel transistor, and thus, part of a driver circuit that can be formed using an n-channel transistor in the driver circuit is formed over the same substrate as the transistor of the pixel portion. With the use of the transistor described in Embodiment 1 or 3 for the pixel portion or the driver circuit in this manner, a highly reliable display device can be provided.

FIG. 18A is an example of a block diagram of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 is arranged and a plurality of scan lines extended from the first scan line driver circuit 702 and the second scan line driver circuit 703 is arranged. Note that pixels each including a display element are provided in matrix in respective regions in each of which the scan line and the signal line intersect with each other. The substrate 700 of the display device is connected to a timing control circuit (also referred to as a controller or a controller IC) through a connection portion such as a flexible printed circuit (FPC).

In FIG. 18A, the first scan line driver circuit 702, the second scan line driver circuit 703, and the signal line driver circuit 704 are formed over the same substrate 700 as the pixel portion 701. Accordingly, the number of components that are provided outside, such as a driver circuit, can be reduced, so that a reduction in cost can be achieved. Furthermore, if the driver circuit is provided outside the substrate 700, wirings would need to be extended and the number of connections of wirings would be increased, but by providing the driver circuit over the substrate 700, the number of connections of the wirings can be reduced. Consequently, an improvement in reliability or yield can be achieved.

[Liquid Crystal Panel]

FIG. 18B illustrates an example of a circuit configuration of a pixel in a liquid crystal panel as one mode of the display panel. Here, a pixel circuit which is applicable to a pixel of a VA liquid crystal display panel is illustrated.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a source or drain electrode layer 714 that functions as a data line is shared by the transistors 716 and 717. The transistor described in Embodiment 3 can be used as appropriate as each of the transistors 716 and 717. In the above manner, a highly reliable liquid crystal display panel can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer has a V shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

In addition, a storage capacitor may be formed using a capacitor wiring 710, a gate insulating layer functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of one embodiment of the present invention is not limited to that shown in FIG. 18B. For example, a switch, a resistor, a capacitor, a transistor, a sensor, or a logic circuit may be added to the pixel illustrated in FIG. 18B.

[Organic EL Panel]

As another mode of the display panel, an example of a circuit configuration of a pixel of an organic EL panel is shown in FIG. 18C.

In an organic EL element, by application of voltage to a light-emitting element, electrons are injected from one of a pair of electrodes and holes are injected from the other of the pair of electrodes, into a layer containing a light-emitting organic compound; thus, current flows. Then, recombination of the electrons and holes makes the light-emitting organic compound to form an excited state and to emit light when it returns from the excited state to a ground state. Based on such a mechanism, such a light-emitting element is referred to as a current-excitation type light-emitting element.

FIG. 18C illustrates an applicable example of a pixel circuit. In this example, one pixel includes two n-channel transistors. Note that the metal oxide film of one embodiment of the present invention can be used for channel formation regions of the n-channel transistors. Furthermore, digital time grayscale driving can be employed for the pixel circuit.

The configuration of the applicable pixel circuit and operation of a pixel employing digital time grayscale driving will be described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line provided over the same substrate.

As the switching transistor 721 and the driver transistor 722, the transistor described in Embodiment 3 can be used as appropriate. In this manner, a highly reliable organic EL display panel can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order that the driver transistor 722 is operated in a linear region, voltage higher than the voltage of the power supply line 727 is applied to the gate electrode layer of the driver transistor 722. Note that voltage higher than or equal to voltage which is the sum of power supply line voltage and the threshold voltage $V_{th}$ of the driver transistor 722 is applied to the signal line 725.

In the case of performing analog grayscale driving, a voltage greater than or equal to a voltage which is the sum of the forward voltage of the light-emitting element 724 and the threshold voltage Vth of the driver transistor 722 is applied to the gate electrode layer of the driver transistor 722. A video signal by which the driver transistor 722 is operated in a saturation region is input, so that current is supplied to the light-emitting element 724. In order that the driver transistor 722 is operated in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit is not limited to that shown in FIG. 18C. For example, a switch, a resistor, a capacitor, a sensor, a transistor, a logic circuit, or the like may be added to the pixel circuit illustrated in FIG. 18C.

In the case where the transistor described in Embodiment 1 or 3 is used for the circuit shown in FIGS. 18A to 18C, the source electrode layer is electrically connected to the low potential side and the drain electrode layer is electrically connected to the high potential side.

For example, in this specification and the like, a display element, a display device, which is a device including a display element, a light-emitting element, and a light-emitting device, which is a device including a light-emitting element, can employ various modes or can include various elements. Examples of a display element, a display device, a light-emitting element, or a light-emitting device include a display medium whose contrast, luminance, reflectance, transmittance, or the like is changed by electromagnetic action, such as an electroluminescence (EL) element (e.g. an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), interferometric modulator display (IMOD) element, an electrowetting element, a piezoelectric ceramic display, or a carbon nanotube. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper.

This embodiment can be combined with any of the other embodiments disclosed in this specification as appropriate.

(Embodiment 5)

In this embodiment, a display module and electronic appliances that can be formed using a semiconductor device of one embodiment of the present invention are described.

Figure 19:
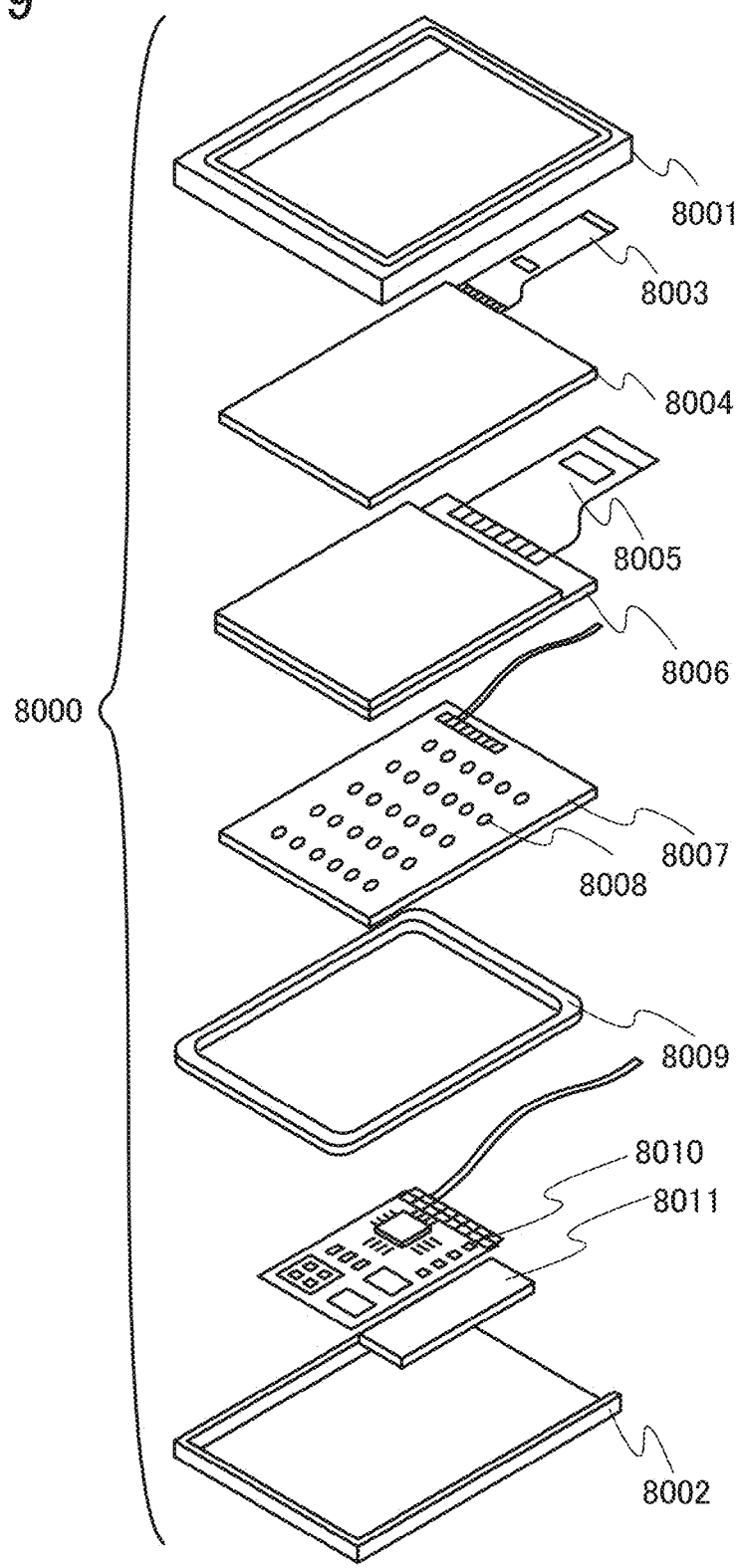
FIG. 19 illustrates a display module of one embodiment of the present invention.

In a display module 8000 illustrated in FIG. 19, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be used overlapping with the display panel 8006. A counter substrate (sealing substrate) of the display panel 8006 can have a touch panel function. A photosensor may be provided in each pixel of the display panel 8006 to form an optical touch panel. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and functions as an electromagnetic shield for blocking electromagnetic waves generated by the operation of the printed board 8010. The frame 8009 can function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 20A to 20D are external views of electronic appliances each including the semiconductor device of one embodiment of the present invention.

Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

Figure 20A:
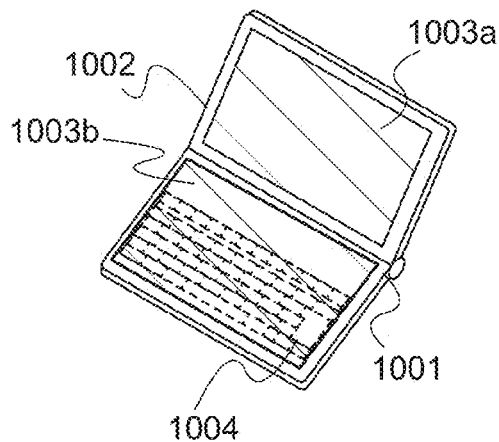
FIGS. 20A to 20D are views illustrating electronic appliances according to embodiments of the present invention.

FIG. 20A illustrates a portable information terminal including a main body 1001, a housing 1002, display portions 1003a and 1003b, and the like. The display portion 1003b is a touch panel. By touching a keyboard button 1004 displayed on the display portion 1003b, a screen can be operated, and text can be input. It is needless to say that the display portion 1003a may be a touch panel. A liquid crystal panel or an organic light-emitting panel is fabricated using any of the transistors described in the above embodiments as a switching element and used in the display portion 1003a or 1003b, whereby a highly reliable portable information terminal can be provided.

The portable information terminal illustrated in FIG. 20A can have a function of displaying various kinds of information (e.g., a still image, a moving image, and a text image); a function of displaying a calendar, the date, the time, and the like on the display portion; a function of operating or editing the information displayed on the display portion; a function of controlling processing by various kinds of software (programs); and the like. Furthermore, an external connection terminal (an earphone terminal, a USB terminal, or the like), a recording medium insertion portion, and the like may be provided on the back surface or the side surface of the housing.

The portable information terminal illustrated in FIG. 20A may transmit and receive data wirelessly. Through wireless communication, desired book data or the like can be purchased and downloaded from an e-book server.

Figure 20B:
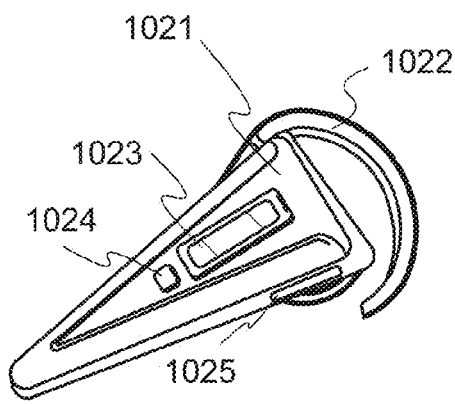

FIG. 20B illustrates a portable music player including, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is fabricated using any of the transistors described in the above embodiments as a switching element and used in the display portion 1023, whereby a highly reliable portable music player can be provided.

Furthermore, when the portable music player illustrated in FIG. 20B has an antenna, a microphone function, or a wireless communication function and is used with a mobile phone, a user can talk on the phone wirelessly in a hands-free way while driving a car or the like.

Figure 20C:
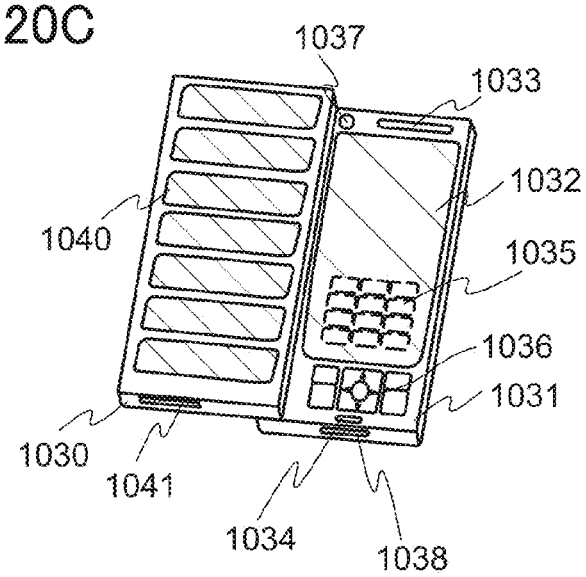

FIG. 20C illustrates a mobile phone including two housings, a housing 1030 and a housing 1031. The housing 1031 includes a display panel 1032, a speaker 1033, a microphone 1034, a pointing device 1036, a camera 1037, an external connection terminal 1038, and the like. The housing 1030 is provided with a solar cell 1040 for charging the mobile phone, an external memory slot 1041, and the like. In addition, an antenna is incorporated in the housing 1031. Any of the transistors described in the above embodiments is used in the display panel 1032, whereby a highly reliable mobile phone can be provided.

Furthermore, the display panel 1032 includes a touch panel. A plurality of operation keys 1035 which are displayed as images are indicated by dotted lines in FIG. 20C. Note that a boosting circuit by which a voltage output from the solar cell 1040 is increased to be sufficiently high for each circuit is also included.

In the display panel 1032, the direction of display is changed as appropriate depending on the application mode. Furthermore, the mobile phone is provided with the camera 1037 on the same surface as the display panel 1032, and thus it can be used as a video phone. The speaker 1033 and the microphone 1034 can be used for videophone calls, recording, and playing sound, etc. as well as voice calls. Moreover, the housings 1030 and 1031 in a state where they are developed as illustrated in FIG. 20C can shift, by sliding, to a state where one overlaps with the other. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. In addition, by inserting a recording medium into the external memory slot 1041, a larger amount of data can be stored and moved.

In addition to the above functions, an infrared communication function, a television reception function, or the like may be provided.

Figure 20D:
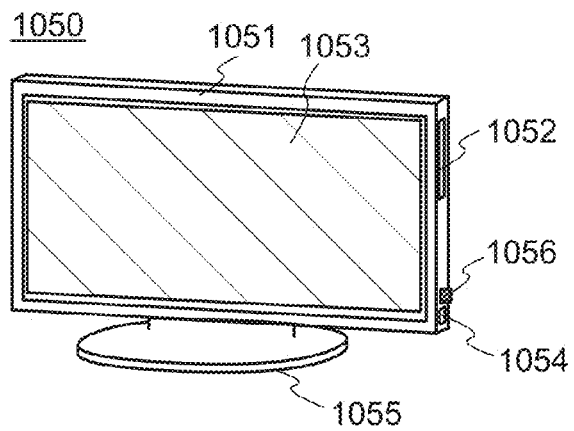

FIG. 20D illustrates an example of a television set. In a television set 1050, a display portion 1053 is incorporated in a housing 1051. Images can be displayed on the display portion 1053. Moreover, a CPU is incorporated in a stand 1055 for supporting the housing 1051. Any of the transistors described in the above embodiments is used in the display portion 1053 and the CPU, whereby the television set 1050 can be highly reliable.

The television set 1050 can be operated with an operation switch of the housing 1051 or a separate remote controller. Further, the remote controller may be provided with a display portion for displaying data output from the remote controller.

Note that the television set 1050 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Furthermore, the television set 1050 is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium is inserted into the storage medium recording and reproducing portion 1052, and reading data stored in the storage medium and writing data to the storage medium can be performed. In addition, an image, a video, or the like stored as data in an external memory 1056 inserted into the external memory slot can be displayed on the display portion 1053.

Further, in the case where the off-state leakage current of the transistor described in the above embodiments is extremely small, when the transistor is used in the external memory 1056 or the CPU, the television set 1050 can have high reliability and sufficiently reduced power consumption.

This embodiment can be combined with any of the other embodiments disclosed in this specification as appropriate.

Example 1

In this example, transistors of one embodiment of the present invention were formed and their initial characteristics were measured. Furthermore, a band diagram of an oxide semiconductor layer and a metal oxide layer included in each transistor was measured. In addition, diffusion of copper in the metal oxide layer included in each transistor was evaluated. Results thereof are described.

First, a method for forming the transistors used in this example is described below. In this example, transistors having a structure similar to that of the transistor 200 illustrated in FIGS. 1A and 1B were formed.

(Sample A1)

A method for forming Sample A1 is described.

A glass substrate was used as the substrate 100, and a 150-nm-thick tungsten film was deposited as a conductive film over the substrate 100 by a sputtering method. Next, the conductive film was selectively processed using a mask formed by a photolithography method to form the gate electrode layer 102.

Then, the gate insulating layer 104 was formed over the substrate 100 and the gate electrode layer 102. Here, as the gate insulating layer 104, a 400-nm-thick silicon nitride film and a 50-nm-thick silicon oxynitride film were deposited by a CVD method.

Next, as an oxide semiconductor film, a 35-nm-thick In—Ga—Zn oxide film (hereinafter also referred to as IGZO (1:1:1)) was deposited over the gate insulating layer 104 by a sputtering method using an oxide target having an atomic ratio of In:Ga:Zn=1:1:1. Deposition conditions were as follows: an atmosphere of argon and oxygen (argon:oxygen=20 sccm:10 sccm), a pressure of 0.4 Pa, a power (DC) of 200 kW, and a substrate temperature of 300° C.

After the oxide semiconductor film was formed, a metal oxide film was successively formed without exposure to the air. As the metal oxide film, a 20-nm-thick In—Ga oxide film (hereinafter also referred to as IGO (1:1)) was deposited by a sputtering method using an oxide target having an atomic ratio of In:Ga=7:93. Deposition conditions were as follows: an atmosphere of argon and oxygen (argon:oxygen=20 sccm: 10 sccm), a pressure of 0.4 Pa, a power (DC) of 200 kW, and a substrate temperature of 300° C.

After the heat treatment, the oxide semiconductor film and the metal oxide film were processed into an island shape using a mask formed by a photolithography method to form the oxide semiconductor layer 106 and the metal oxide layer 108.

Next, heat treatment was performed at 450° C. for one hour in a nitrogen atmosphere, and then heat treatment was performed at 450° C. for one hour in a mixed atmosphere containing oxygen and nitrogen in the same treatment chamber.

A 30-nm-thick tungsten film and a 200-nm-thick copper film were deposited as a conductive film over the oxide semiconductor layer 106 and metal oxide layer 108 which had island shapes.

Then, the tungsten film and the copper film were selectively etched using a mask formed by a photolithography method to form the pair of electrode layers 110a and 110b.

Next, a 50-nm-thick silicon oxynitride film was deposited as the oxide insulating layer 112 over the gate insulating layer 104, the metal oxide layer 108, and the pair of electrode layers 110a and 110b by a CVD method. Subsequently, a 400-nm-thick silicon oxynitride film was successively deposited as the oxide insulating layer 114 by a CVD method without exposure to the air.

After that, heat treatment was performed at 350° C. for one hour in a mixed atmosphere containing oxygen and nitrogen.

Next, a 100-nm-thick silicon nitride film was deposited as the nitride insulating layer 116 over the oxide insulating layer 114 by a CVD method.

Then, although not illustrated, part of each of the oxide insulating layer 112, the oxide insulating layer 114, and the nitride insulating layer 116 was etched using a mask formed by a photolithography method to form an opening portion where one of the pair of electrode layers 110a and 110b was exposed.

Subsequently, a 100-nm-thick indium oxide-tin oxide compound (ITO-SiO$_2$) film containing silicon oxide was formed as a conductive film over the nitride insulating layer 116 by a sputtering method. Then, part of the conductive film was etched using a mask formed by a photolithography method to form a conductive layer in contact with one of the pair of electrode layers 110a and 110b. After that, heat treatment was performed at 250° C. for one hour in a nitrogen atmosphere.

Next, a 1.6-μm-thick polyimide layer was formed as a planarization layer (not illustrated) over the nitride insulating layer 116 and the conductive layer. Here, after a composition was applied to the nitride insulating layer 116, light exposure and development were performed, and heat treatment was performed at 300° C. for one hour in an atmosphere containing nitrogen, whereby to form the planarization layer having an opening portion where part of the pair of electrode layers 110a and 110b was exposed.

Through the above process, Sample A1 was formed.

(Sample A2)

Sample A2, which is a comparative example, was formed under the same formation conditions as those of Sample A1 to have the same structure as Sample A1 except that the metal oxide layer 108 is not provided.

(Sample A3)

Sample A3, which is a comparative example, was formed under the same formation conditions as Sample A1 to have the same structure as Sample A1 except that an oxide semiconductor layer is provided instead of the metal oxide layer 108. Specifically, a sample in which an oxide semiconductor film to be the oxide semiconductor layer was deposited under the following conditions was formed as Sample A3.

As the oxide semiconductor film, a 20-nm-thick In—Ga—Zn oxide film (hereinafter also referred to as IGZO(1:3:6)) was formed by a sputtering method using an oxide target with an atomic ratio of In:Ga:Zn=1:3:6. Deposition conditions were as follows: an atmosphere of argon and oxygen (argon:

oxygen=20 sccm:10 sccm), a pressure of 0.4 Pa, a power (DC) of 200 kW, and a substrate temperature of 200° C.
(Sample A4)

Sample A4, which is a comparative example, was formed under the same formation conditions as Sample A1 to have the same structure as Sample A1 except that an oxide semiconductor layer is provided instead of the metal oxide layer 108. Specifically, a sample in which an oxide semiconductor film to be the oxide semiconductor layer was deposited under the following conditions was formed as Sample A4.

As the oxide semiconductor film, a 20-nm-thick In—Ga—Zn oxide film (also referred to as IGZO(1:6:4)) was formed by a sputtering method using an oxide target with an atomic ratio of In:Ga:Zn=1:6:4. Deposition conditions were as follows: an atmosphere of argon and oxygen (argon:oxygen=20 sccm:10 sccm), a pressure of 0.4 Pa, a power (DC) of 200 kW, and a substrate temperature of 200° C.
(Sample A5)

Sample A5, which is a comparative example, was formed under the same formation conditions as those of Sample A1 to have the same structure as Sample A1 except that a metal oxide layer in which the atomic ratio of indium to gallium is different from that in the metal oxide layer 108 is provided instead of the metal oxide layer 108. Specifically, a sample in which a metal oxide film to be the metal oxide layer was deposited under the following conditions was formed as Sample A5.

As the metal oxide layer, a 20-nm-thick In—Ga oxide film was deposited by a sputtering method using an oxide target having an atomic ratio of In:Ga=2:1 (such a metal oxide layer is also referred to as IGO(2:1)). Deposition conditions were as follows: an atmosphere of argon and oxygen (argon:oxygen=20 sccm:10 sccm), a pressure of 0.4 Pa, a power (DC) of 200 kW, and a substrate temperature of 300° C.
(Vg-Id Characteristics)

Next, Vg-Id characteristics of the transistors included in Sample A1 to Sample A5 were measured. Here, changes in characteristics of current flowing between a source electrode layer and a drain electrode layer (hereinafter referred to as drain current: Id), that is. Vg-Id characteristics were measured under the following conditions: the substrate temperature was 25° C., the potential difference between the source electrode layer and the drain electrode layer (hereinafter referred to as drain voltage: Vd) was 1 V or 10 V, and the potential difference between the source electrode layer and the gate electrode layer (hereinafter referred to as gate voltage: Vg) was changed from −20 V to 20 V. In each sample, the channel length L of the transistor was 6 μm and the channel width W thereof was 50 μm. Furthermore, each sample includes four transistors.

Figure 11A:
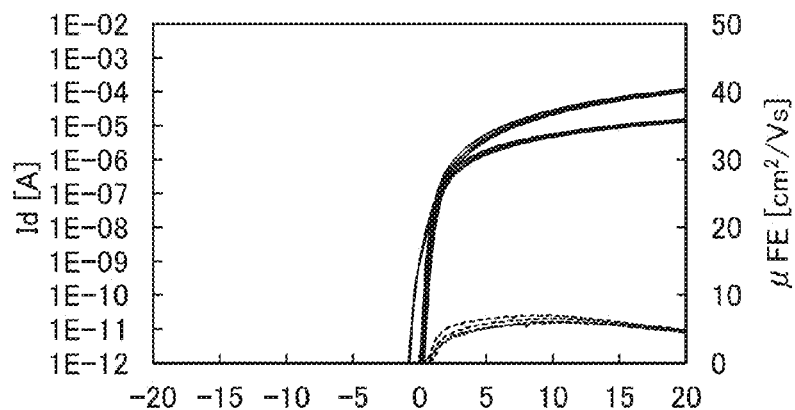
FIGS. 11A to 11C show Id-Vg characteristics, a band diagram, and SIMS analysis results of a transistor.
Figure 12A:
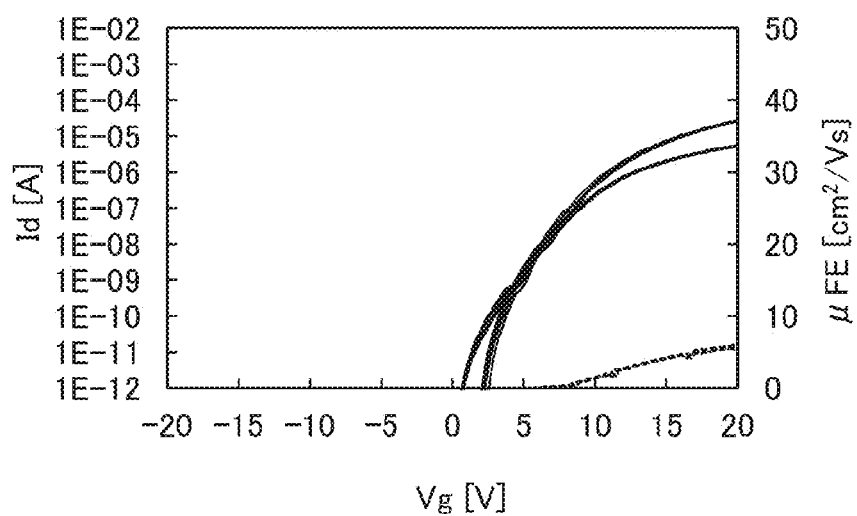
FIGS. 12A and 12B show Id-Vg characteristics and a band diagram of a transistor.
Figure 13A:
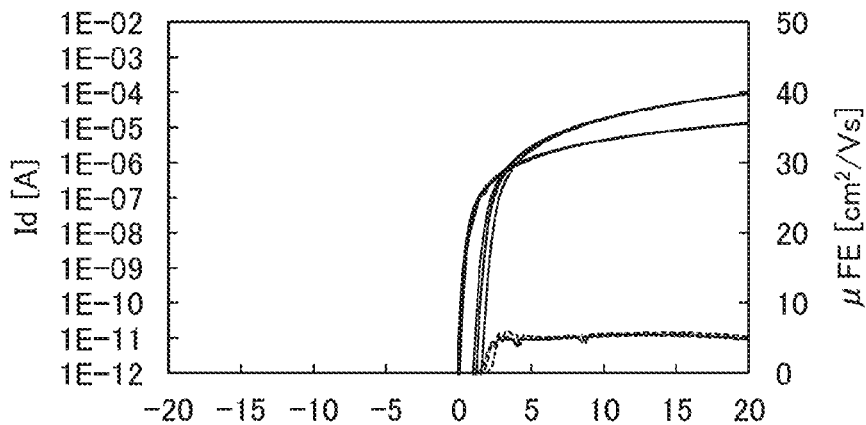
FIGS. 13A to 13C show Id-Vg characteristics, a band diagram, and SIMS analysis results of a transistor.
Figure 14A:
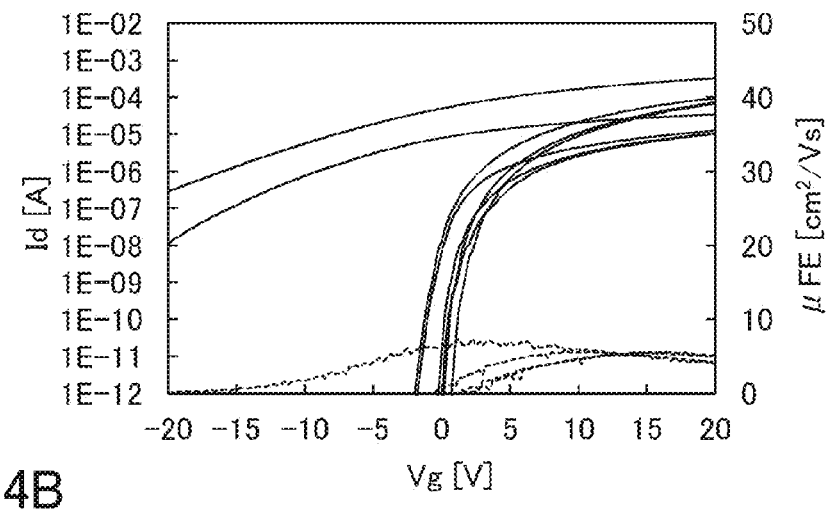
FIGS. 14A to 14C show Id-Vg characteristics, a band diagram, and SIMS analysis results of a transistor.
Figure 15A:
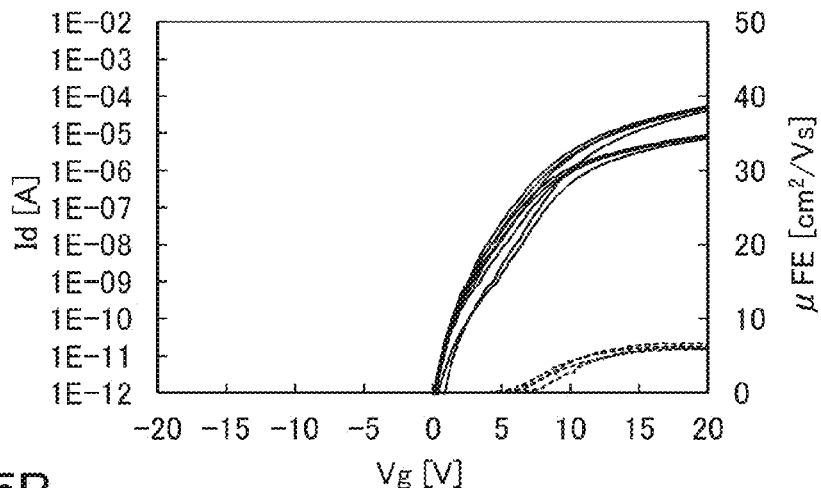
FIGS. 15A to 15C show Id-Vg characteristics, a band diagram, and SIMS analysis results of a transistor.

FIG. 11A shows Vg-Id characteristics of the transistors included in Sample A1. FIG. 12A shows Vg-Id characteristics of the transistors included in Sample A2. FIG. 13A shows Vg-Id characteristics of the transistors included in Sample A3. FIG. 14A shows Vg-Id characteristics of the transistors included in Sample A4. FIG. 15A shows Vg-Id characteristics of the transistors included in Sample A5. In each of FIG. 11A, FIG. 12A, FIG. 13A. FIG. 14A, and FIG. 15A, the horizontal axis represents gate voltage Vg, the first vertical axis represents drain current Id, and the second vertical axis represent field-effect mobility. Here, to show field-effect mobility in a saturation region, field-effect mobility calculated when Vd=10 V is shown.

FIG. 11A shows that the transistors of Sample A1 have high on-state current and excellent Vg-Id characteristics.

Meanwhile the Vg-Id characteristics in FIG. 12A reveal that on-state current is reduced in the transistors of Sample A2. A possible cause of the reduction in on-state current is trapping of a conduction electron due to a shallow trap level in an oxide semiconductor layer. The shallow trap level is formed owing to Cu which has been included in the pair of electrode layers 110a and 110b and then moved to the surface of the oxide semiconductor layer 106 or into the oxide semiconductor layer 106.

The Vg-Id characteristics in FIG. 13A show that the threshold voltages of the transistors included in Sample A3 at a drain voltage of 1 V is different from those at a drain voltage of 10 V.

The Vg-Id characteristics in FIG. 14A show that the threshold voltages of the transistors included in Sample A4 at a drain voltage of 1 V is different from those at a drain voltage of 10 V. Furthermore, it is found from FIG. 14A that some of the transistors do not have switching characteristics.

The Vg-Id characteristics in FIG. 15A show that on-state current is reduced in the transistors included in Sample A5.
(Band Diagram)

Next, measurement was performed using a spectroscopic ellipsometer to obtain a difference between the energy Ec of the bottom of the conduction band and the energy Ev of the top of the valence band, that is, the energy gap Eg of each of the following layers: the oxide semiconductor layers and the metal oxide layers of Samples A1 and A5, the oxide semiconductor layer of Sample A2, and the stacked oxide semiconductor layers of Samples A3 and A4. Furthermore, an energy difference between the vacuum level Evac and the valence band top Ev, i.e., the ionization potential Ip, was measured by ultraviolet photoelectron spectroscopy (UPS). Then, an energy difference between the vacuum level Evac and the bottom of the conduction band Ec, i.e., the electron affinity $\chi$, was calculated by calculating a difference between the ionization potential Ip and the energy gap Eg, and a band diagram of each sample was obtained.

Figure 11B:
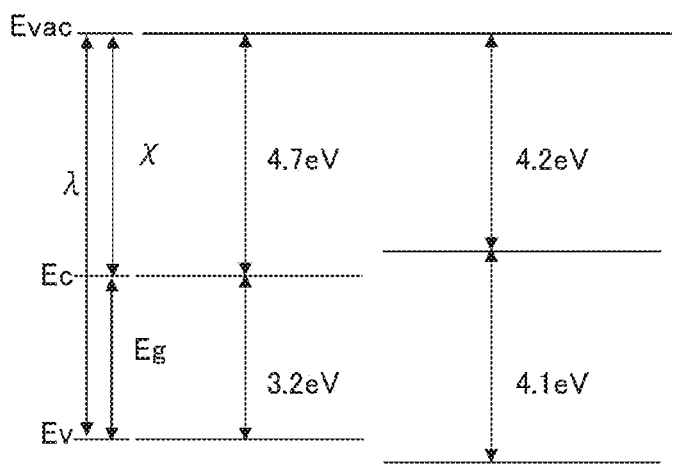
Figure 12B:
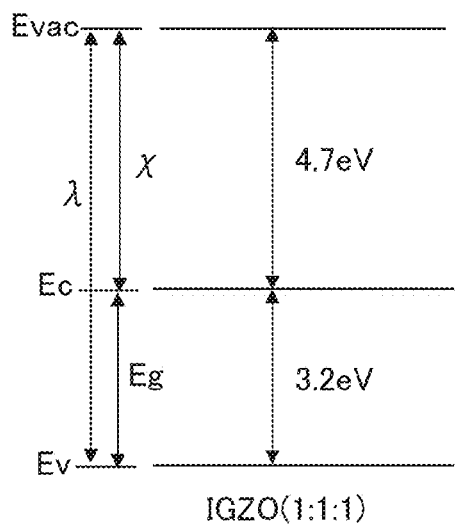
Figure 13B:
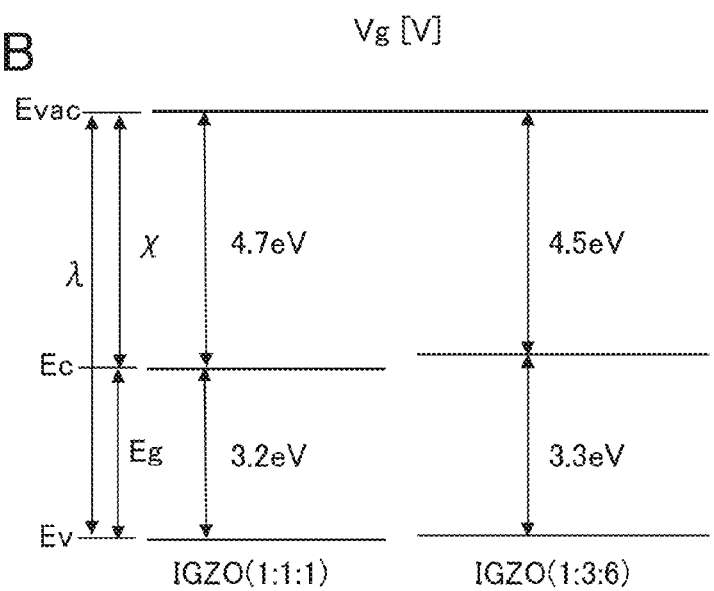
Figure 14B:
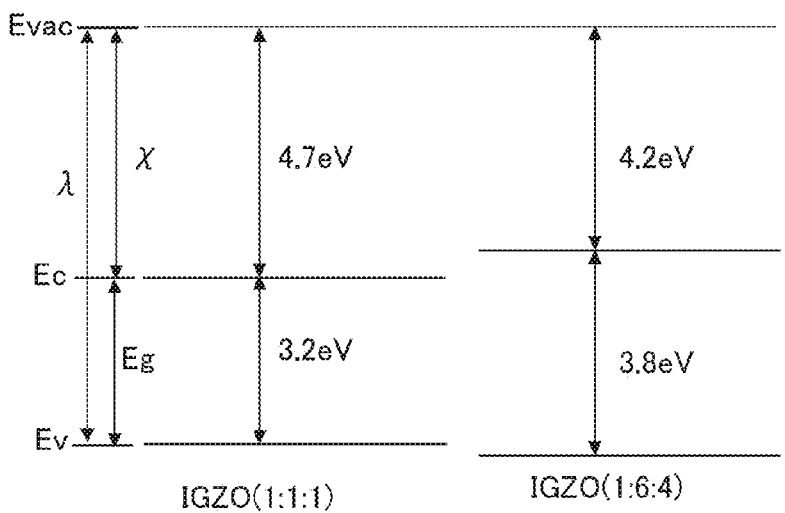
Figure 15B:
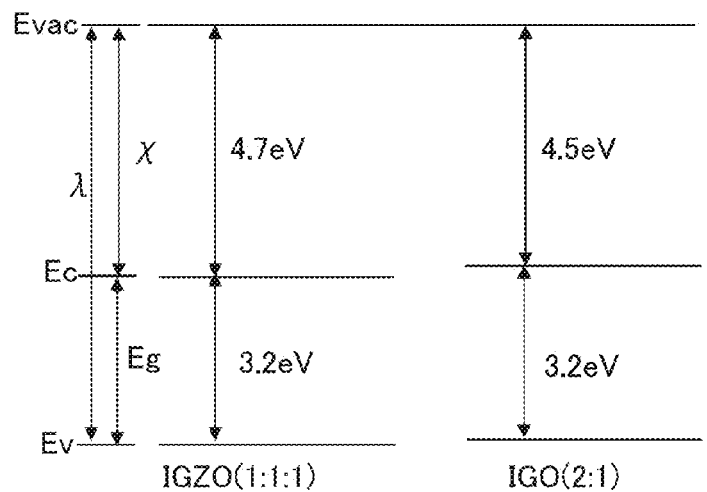

FIG. 11B shows a band diagram of Sample A1. FIG. 12B shows a band diagram of Sample A2. FIG. 13B shows a band diagram of Sample A3. FIG. 14B shows a band diagram of Sample A4. FIG. 15B shows a band diagram of Sample A5.

As shown in FIG. 11B, a difference in electron affinity $\chi$ between the oxide semiconductor layer (IGZO(1:1:1)) and the metal oxide layer (IGO(7:92)) is as large as 0.5 eV. Furthermore, as shown in FIG. 14B, a difference in electron affinity $\chi$ between the stacked oxide semiconductor layers (IGZO(1:1:1) and IGZO(1:6:4)) is as large as 0.5 eV.

Meanwhile, as shown in FIG. 13B, a difference in electron affinity $\chi$ between the stacked oxide semiconductor layers (IGZO(1:1:1) and IGZO(1:3:6)) is as small as 0.2 eV in Sample A3. Furthermore, as shown in FIG. 15B, difference in electron affinity $\chi$ between the oxide semiconductor layer (IGZO(1:1:1)) and the metal oxide layer (IGO(2:1)) is as small as 0.2 eV in Sample A5.

These results indicate that, as shown in the case of Sample A1, when such a metal oxide layer as shown in Embodiment 1 is used as the metal oxide layer provided between the oxide semiconductor layer and the pair of electrode layers, a band offset of the bottom of the conduction band Ec can be formed between the oxide semiconductor layer and the metal oxide layer.

Meanwhile, as shown in the case of Sample A3, when an energy difference in the bottom of the conduction band Ec between the stacked oxide semiconductor layers is small, a band offset of the bottom of the conduction band Ec is less likely to be formed between the oxide semiconductor layer (IGZO(1:1:1)) and the oxide semiconductor layer (IGZO(1:6:4)), and thus carriers also flow in the oxide semiconductor layer (IGZO(1:6:4)).

(Analysis on Cu Concentration by SIMS)

Then, diffusion of Cu in the metal oxide layer or the oxide semiconductor layer in contact with the pair of electrode layers 110a and 110b in each of Sample A1 and Samples A3 to A5 was analyzed by measurement of Cu concentration.

Here, a stack including a metal oxide film and a copper film was formed on a substrate to form a sample. First of all, a process for manufacturing each samples is described.

(Sample A6)

Sample A6 was formed as follows. A 100-nm-thick In—Ga oxide film (IGO(7:93)) was deposited as a metal oxide film on a glass substrate.

Next, a 60-nm-thick copper film was deposited on the metal oxide film. After that, a 100-nm-thick silicon nitride film was deposited on the copper film, and then heat treatment was performed at 350° C. for one hour in a mixed atmosphere containing nitrogen and oxygen.

Note that the metal oxide film (IGO(7:93)) was formed under the same conditions as the metal oxide film (IGO(7:93)) of Sample A1.

Through the above process, Sample A6 was formed.

(Sample A7)

Sample A7 was formed under the same formation conditions as Sample A6 to have the same structure as Sample A6 except that an oxide semiconductor film (IGZO(1:3:6)) was provided instead of the metal oxide film. Note that the oxide semiconductor film (IGZO(1:3:6)) was formed under the same conditions as the oxide semiconductor film (IGZO(1:3:6)) in Sample A3.

(Sample A8)

Sample A8 was formed under the same formation conditions as Sample A6 to have the same structure as Sample A6 except that an oxide semiconductor film (IGZO(1:6:4)) was provided instead of the metal oxide film. Note that the oxide semiconductor film (IGZO(1:6:4)) was formed under the same conditions as the oxide semiconductor film (IGZO(1:6:4)) in Sample A4.

(Sample A9)

Sample A9 was formed under the same formation conditions as Sample A6 to have the same structure as Sample A6 except that a metal oxide film (IGO(2:1)) in which the atomic ratio of indium to gallium is different from that in the metal oxide layer included in Sample A6 is provided instead of the metal oxide film. Note that the metal oxide film (IGO(2:1)) was deposited under the same conditions as the metal oxide film (IGO(2:1)) of Sample A5.

Next, the Cu concentration of each of Samples A6 to A9 was measured. The Cu concentration was measured using secondary ion mass spectrometry (SIMS). Note that the measurement of the Cu concentration was performed from the substrate side.

Figure 11C:
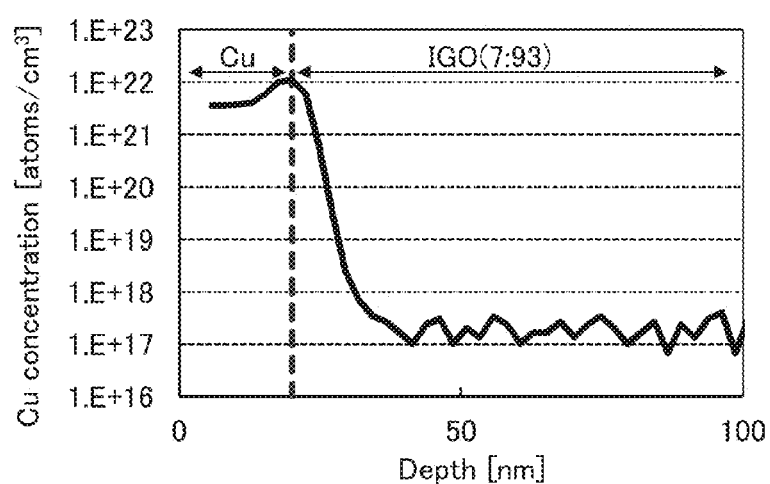
Figure 13C:
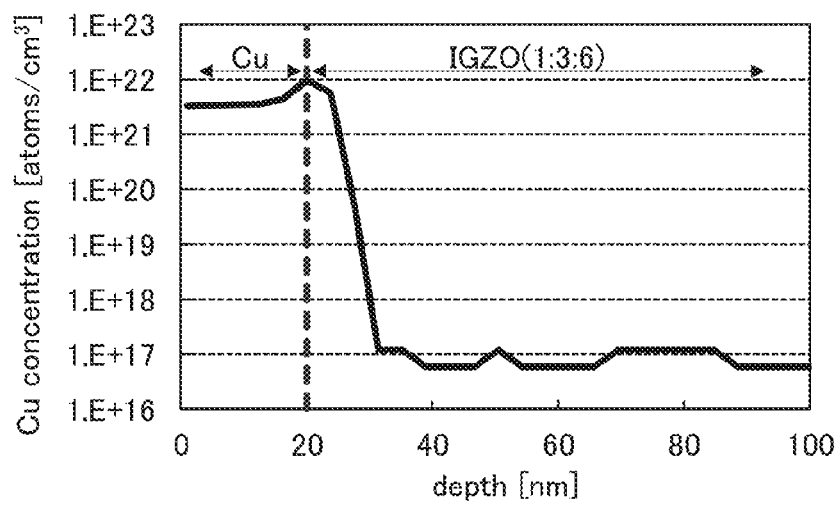
Figure 14C:
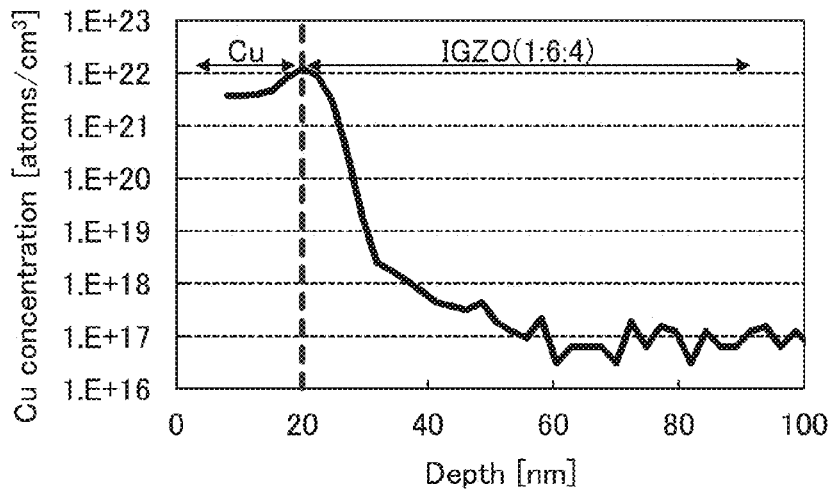
Figure 15C:
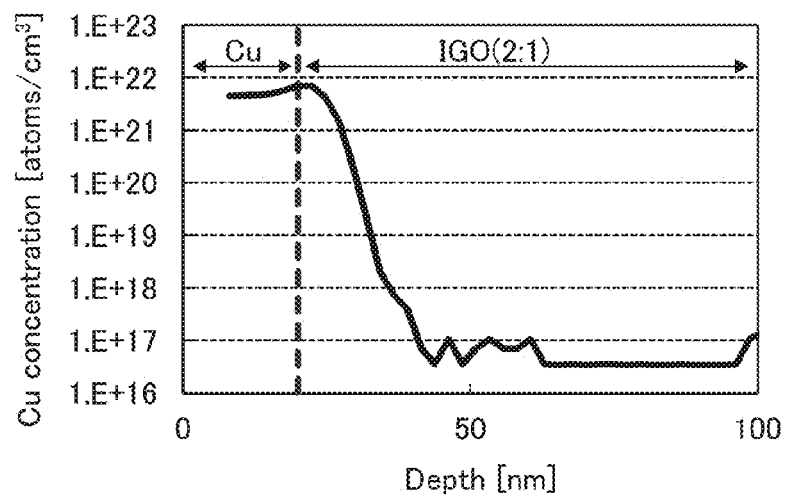

FIG. 11C shows analysis results of the Cu concentration of Sample A6. FIG. 13C shows analysis results of the Cu concentration of Sample A7. FIG. 14C shows analysis results of the Cu concentration of Sample A8. FIG. 15C shows analysis results of the Cu concentration of Sample A9.

Here, in a channel region of the transistor, the Cu concentration which affects the electrical characteristics is higher than or equal to $1\times10^{18}$ atoms/cm$^3$.

As shown in FIG. 11C, a region having a Cu concentration of $1\times10^{18}$ atoms/cm$^3$ in Sample A6 is a region which is closer to the substrate than the interface between the copper film and the metal oxide film (IGO(7:93)) by approximately 10 nm.

As shown in FIG. 13C, a region having a Cu concentration of $1\times10^{18}$ atoms/cm$^3$ in Sample A7 is a region which is closer to the substrate than the interface between the copper film and the oxide semiconductor film (IGZO(1:3:6)) by approximately 10 nm.

Meanwhile, as shown in FIG. 14C, a region having a Cu concentration of $1\times10^{18}$ atoms/cm$^3$ in Sample A8 is closer to the substrate than the interface between the copper film and the oxide semiconductor film (IGZO(1:6:4)) by approximately 16 nm.

Furthermore, as shown in FIG. 15C, a region having a Cu concentration of $1\times10^{18}$ atoms/cm$^3$ in Sample A9 is closer to the substrate than the interface between the copper film and the metal oxide film (IGO(2:1)) by approximately 15 nm.

Comparison between Sample A6 and Sample A9 reveals that the diffusion length of copper (Cu) can be small in the metal oxide film in which the atomic ratio of Ga to In is high.

Comparison between Sample A7 and Sample A8 reveals that the diffusion length of copper (Cu) can be small in the oxide semiconductor film in which the atomic ratio of Zn to Ga is hig. This is because when the atomic ratio of Zn to Ga is high, the proportion of a spinel crystal structure can be reduced.

According to the above results, the metal oxide layer which tends to form a band offset when it is in contact with the oxide semiconductor layer, and is capable of reducing the diffusion length of copper (Cu) is provided between the oxide semiconductor layer and the pair of electrode layers, whereby a transistor with high on-state current and excellent Vg-Id characteristics can be obtained.

Example 2

In this example, the crystal structure of a metal oxide film, the number of particles during deposition of the metal oxide film, and the band diagram of the metal oxide film were measured. The results are described.

(Method for Forming Samples)

In this example, samples were each formed in such a manner that a 100-nm-thick In—Ga oxide film was deposited as a metal oxide film on a quartz substrate.

Note that the samples were each formed using an oxide target having an atomic ratio of In:Ga=22:78, an oxide target having an atomic ratio of In:Ga=7:93, or an oxide target having an atomic ratio of In:Ga=2:98. Note that in the cases of using the oxide target having an atomic ratio of In:Ga=22:78 and the oxide target having an atomic ratio of In:Ga=7:93, a power (DC) of 200 kW was used. In the case of using the oxide target having an atomic ratio of In:Ga=2:98, a power (RF) of 400 kW was used.

Furthermore, a deposition atmosphere condition where the flow rate ratio of argon to oxygen was 20 sccm:10 sccm, or a deposition atmosphere condition where the flow rate of oxygen was 30 sccm was used.

In addition, a substrate temperature was 200° C. or 300° C.

Note that in each condition of the samples, the pressure in a chamber was 0.4 Pa.

(XRD Measurement)

Here, each sample was formed in such a manner that the substrate temperature was set to 300° C. and the metal oxide film was deposited using the oxide target. Then, the crystal structure of the metal oxide film of each sample was measured by XRD. The XRD measurement results are shown in FIG. 16.

Figure 16:
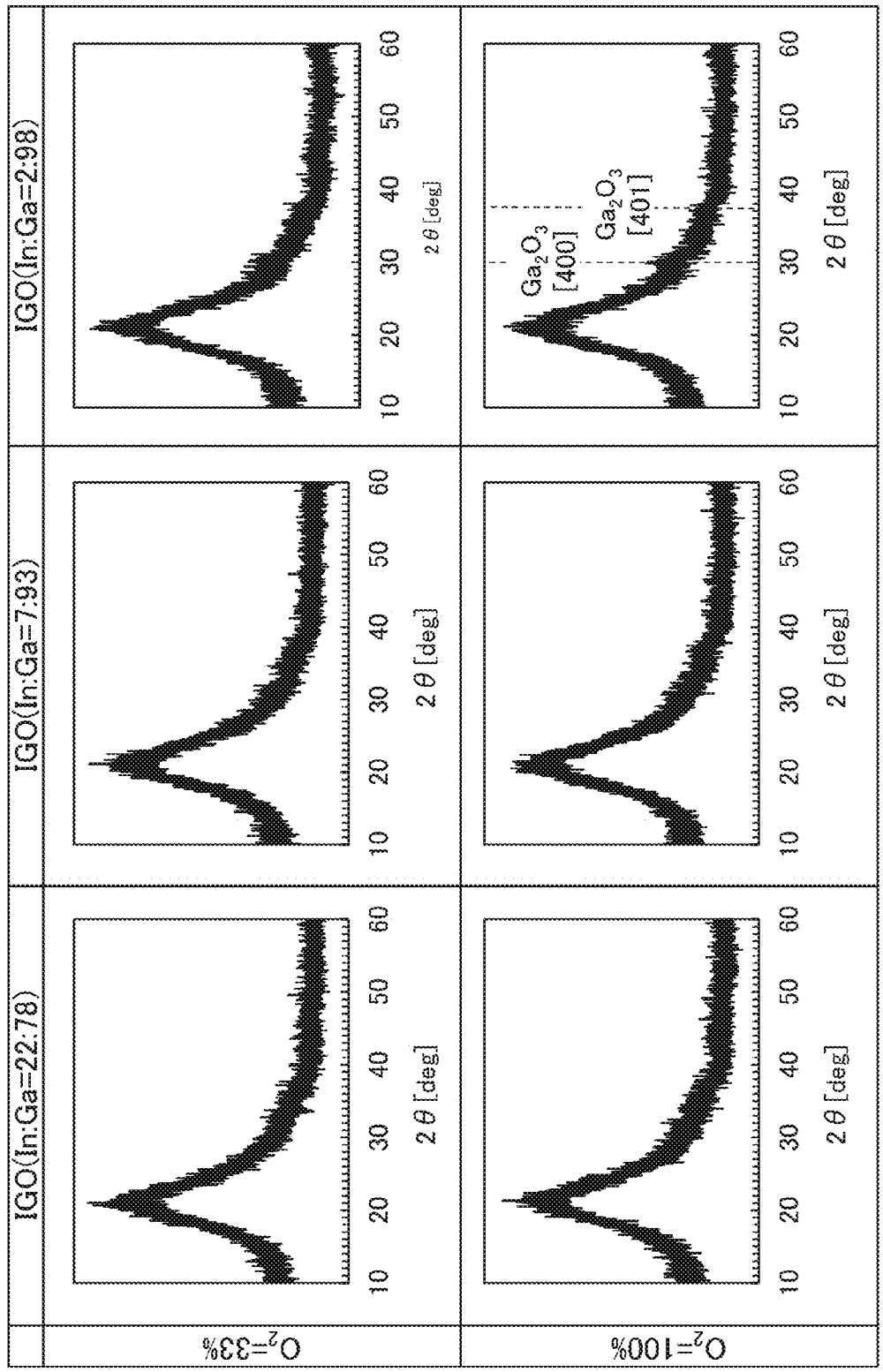
FIG. 16 is a graph showing results of XRD measurement.

According to FIG. 16, the metal oxide films formed using the oxide target having an atomic ratio of In:Ga=22:78 and the oxide target having an atomic ratio of In:Ga=7:93 have low crystallinity.

Meanwhile, a peak indicating a $Ga_2O_3$ crystal was observed in the metal oxide film which was formed using the oxide target having an atomic ratio of In:Ga=2:98 under the deposition atmosphere condition where the flow rate of oxygen was 30 sccm. Thus, these results show that a $Ga_2O_3$ crystal is included in the metal oxide film which is deposited in an oxygen atmosphere and in which the atomic ratio of Ga to In is high.

(Number of Particles in Deposition)

Next, analysis results of the relationship between the atomic ratio of metals contained in an oxide target and the number of generated particles are described.

A glass substrate was used instead of the quartz substrate in each sample used for the measurement. Furthermore, the metal oxide film was deposited using the oxide target under the deposition atmosphere conditions where the flow rate ratio of argon to oxygen was 20 sccm:10 sccm and the substrate temperature was 300° C.

Next, the number of particles on the glass substrate was measured before and after deposition of the metal oxide film with a test device using a laser. The results are shown in Table 1.

TABLE 1

| Particle diameter (μm) | IGO(In:Ga = 22:78) before deposition | IGO(In:Ga = 22:78) after deposition | IGO (In:Ga = 7:93) before deposition | IGO (In:Ga = 7:93) after deposition | IGO (In:Ga = 2:98) before deposition | IGO (In:Ga = 2:98) after deposition |
|---|---|---|---|---|---|---|
| 1.0-2.9 | 3 | 384 | 4 | 10 | 2 | 7 |
| 3.0-4.9 | 0 | 6 | 1 | 1 | 0 | 1 |
| 5.0- | 0 | 0 | 1 | 2 | 0 | 0 |

Table 1 shows that the number of particles can be small after deposition by depositing the metal oxide film using the oxide target in which y/(x+y) was greater than or equal to 0.9 where the atomic ratio of In to Ga was represented as In:Ga=x:y. According to the results, a transistor can be manufactured with high yield by depositing a metal oxide film using a target in which y/(x+y) is greater than or equal to 0.9 where the atomic ratio of In to Ga is In:Ga=x:y.

(Band Diagram)

Next, in a manner similar to that of Example 1, energy gap Eg, ionization potential Ip, and electron affinity $\chi$ were obtained using a spectroscopic ellipsometer and an ultraviolet photoelectron spectroscopy, and a band diagram of each metal oxide film was obtained.

Note that the metal oxide film in each sample used for the measurement was deposited using the oxide target under the deposition atmosphere condition where the flow rate ratio of argon to oxygen was 20 sccm:10 sccm at a substrate temperature of 300° C.

Figure 17:
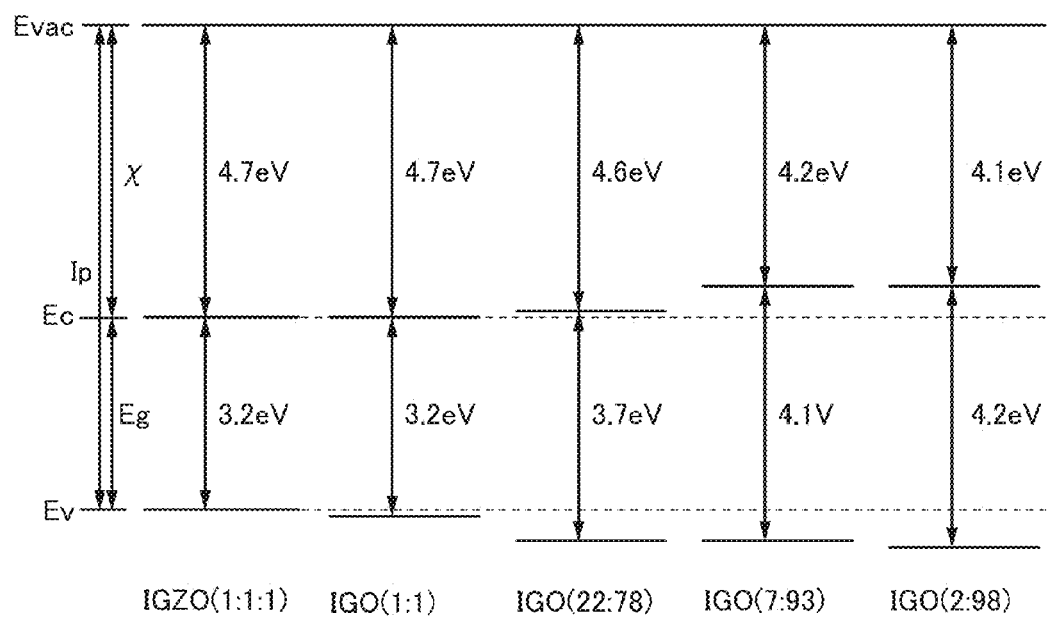
FIG. 17 is a band diagram.

FIG. 17 shows each band diagram of a metal oxide film (IGO(1:1)) deposited using an oxide target having an atomic ratio of In:Ga=1:1, a metal oxide film (IGO(22:78)) deposited using an oxide target having an atomic ratio of In:Ga=22:78, a metal oxide film (IGO(7:93)) deposited using an oxide target having an atomic ratio of In:Ga=7:93, and a metal oxide film (IGO(2:98)) deposited using an oxide target having an atomic ratio of In:Ga=2:98. Furthermore, as a reference example, a band diagram of an oxide semiconductor film (IGZO(1:1:1)) deposited using an oxide target having an atomic ratio of In:Ga:Zn=1:1:1 is shown.

As shown in FIG. 17, as the atomic ratio of Ga with respect to In in the oxide target becomes larger, a difference in the electron affinity $\chi$ between the oxide semiconductor film and the metal oxide film is increased.

According to these results, the metal oxide layer as described in Embodiment 1, typically, a metal oxide layer in which y/(x+y) is greater than or equal to 0.75 and less than 1, preferably greater than or equal to 0.78 and less than 1, further preferably greater than or equal to 0.80 and less than 1 where the atomic ratio of In to Ga is In:Ga=x:y is used as the metal oxide layer provided between the oxide semiconductor layer and the pair of electrode layers, whereby a band offset of the bottom of the conduction band Ec can be formed between the oxide semiconductor layer and the metal oxide layer.

This application is based on Japanese Patent Application serial no. 2013-196333 filed with Japan Patent Office on Sep. 23, 2013, the entire contents of which are hereby incorporated by reference.

What is claimed is:

1. A semiconductor device comprising:
   an oxide semiconductor layer;
   a metal oxide layer comprising an In-M oxide in contact with the oxide semiconductor layer; and
   a conductive layer in contact with the metal oxide layer,
   wherein the conductive layer comprises one of Cu, Al, Au, and Ag,
   wherein the In-M oxide does not comprise Zn,
   wherein M is one of Ti, Ga, Y, Zr, La, Ce, Nd, and Hf, and
   wherein y/(x+y) is greater than or equal to 0.75 and less than 1 where an atomic ratio of In to M included in the metal oxide layer is In:M=x:y.

2. The semiconductor device according to claim 1,
   wherein the oxide semiconductor layer comprises a channel formation region, and
   wherein the conductive layer serves as a source electrode or a drain electrode.

3. The semiconductor device according to claim 1,
   wherein M is Ga, and
   wherein an element other than In, Ga and O is contained in the metal oxide layer at a concentration of less than or equal to 0.1%.

4. The semiconductor device according to claim 1,
   wherein the conductive layer includes a first layer in contact with the metal oxide layer and a second layer in contact with the first layer,
   wherein the first layer comprises one of Ti, Ta, Mo, and W, and
   wherein the second layer comprises the one of Cu, Al, Au, and Ag.

5. The semiconductor device according to claim 1,
   wherein the oxide semiconductor layer includes a first oxide semiconductor layer and a second oxide semiconductor layer between the first oxide semiconductor layer and the metal oxide layer, and
   wherein a thickness of the first oxide semiconductor layer is larger than a thickness of the second oxide semiconductor layer.

6. The semiconductor device according to claim 5,
   wherein electron affinity of the second oxide semiconductor layer is smaller than electron affinity of the first oxide semiconductor layer and larger than electron affinity of the metal oxide layer.

7. An electronic device comprising the semiconductor device according to claim 1.

8. A semiconductor device comprising:
   a gate electrode layer;
   a gate insulating layer over the gate electrode layer;
   an oxide semiconductor layer over the gate electrode layer with the gate insulating layer therebetween;

a metal oxide layer comprising an In-M oxide over and in contact with the oxide semiconductor layer; and
a pair of electrode layers in contact with the metal oxide layer,
wherein the pair of electrode layers comprises one of Cu, Al, Au, and Ag,
wherein the In-M oxide does not comprise Zn,
wherein M is one of Ti, Ga, Y, Zr, La, Ce, Nd, and Hf, and
wherein $y/(x+y)$ is greater than or equal to 0.75 and less than 1 where an atomic ratio of In to M included in the metal oxide layer is In:M=x:y.

9. The semiconductor device according to claim 8,
wherein M is Ga, and
wherein an element other than In, Ga and O is contained in the metal oxide layer at a concentration of less than or equal to 0.1%.

10. The semiconductor device according to claim 8,
wherein the pair of electrode layers includes a first layer in contact with the metal oxide layer and a second layer in contact with the first layer,
wherein the first layer comprises one of Ti, Ta, Mo, and W, and
wherein the second layer comprises the one of Cu, Al, Au, and Ag.

11. The semiconductor device according to claim 8,
wherein the oxide semiconductor layer includes a first oxide semiconductor layer and a second oxide semiconductor layer between the first oxide semiconductor layer and the metal oxide layer, and
wherein a thickness of the first oxide semiconductor layer is larger than a thickness of the second oxide semiconductor layer.

12. The semiconductor device according to claim 11,
wherein electron affinity of the second oxide semiconductor layer is smaller than electron affinity of the first oxide semiconductor layer and larger than electron affinity of the metal oxide layer.

13. An electronic device comprising the semiconductor device according to claim 8.

14. A semiconductor device comprising:
a first gate electrode layer;
a first gate insulating layer over the first gate electrode layer;
an oxide semiconductor layer over the first gate electrode layer with the first gate insulating layer therebetween;
a metal oxide layer comprising an In-M oxide over and in contact with the oxide semiconductor layer;
a pair of electrode layers in contact with the metal oxide layer;
a second gate insulating layer over and in contact with the pair of electrode layers; and
a second gate electrode layer over the oxide semiconductor layer with the second gate insulating layer therebetween,
wherein the pair of electrode layers comprises one of Cu, Al, Au, and Ag,
wherein the In-M oxide does not comprise Zn,
wherein M is one of Ti, Ga, Y, Zr, La, Ce, Nd, and Hf, and
wherein $y/(x+y)$ is greater than or equal to 0.75 and less than 1 where an atomic ratio of In to M included in the metal oxide layer is In:M=x:y, and
wherein the first gate electrode layer and the second gate electrode layer are electrically connected to each other through an opening in the first gate insulating layer and the second gate insulating layer.

15. The semiconductor device according to claim 14,
wherein M is Ga, and
wherein an element other than In, Ga and O is contained in the metal oxide layer at a concentration of less than or equal to 0.1%.

16. The semiconductor device according to claim 14,
wherein the pair of electrode layers includes a first layer in contact with the metal oxide layer and a second layer in contact with the first layer,
wherein the first layer comprises one of Ti, Ta, Mo, and W, and
wherein the second layer comprises the one of Cu, Al, Au, and Ag.

17. The semiconductor device according to claim 14,
wherein the oxide semiconductor layer includes a first oxide semiconductor layer and a second oxide semiconductor layer between the first oxide semiconductor layer and the metal oxide layer, and
wherein a thickness of the first oxide semiconductor layer is larger than a thickness of the second oxide semiconductor layer.

18. The semiconductor device according to claim 17,
wherein electron affinity of the second oxide semiconductor layer is smaller than electron affinity of the first oxide semiconductor layer and larger than electron affinity of the metal oxide layer.

19. The semiconductor device according to claim 14, wherein side surfaces of the oxide semiconductor layer face the second gate electrode layer with the second gate insulating layer therebetween.

20. An electronic device comprising the semiconductor device according to claim 14.

* * * * *